(12) United States Patent
Wang et al.

(10) Patent No.: US 11,997,892 B2
(45) Date of Patent: May 28, 2024

(54) DISPLAY PANEL AND MANUFACTURING METHOD THEREOF, AND DISPLAY DEVICE

(71) Applicant: BOE TECHNOLOGY GROUP CO., LTD., Beijing (CN)

(72) Inventors: Li Wang, Beijing (CN); Bo Wang, Beijing (CN); Jingquan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 570 days.

(21) Appl. No.: 17/279,689

(22) PCT Filed: Jun. 18, 2020

(86) PCT No.: PCT/CN2020/096874
§ 371 (c)(1),
(2) Date: Mar. 25, 2021

(87) PCT Pub. No.: WO2021/253343
PCT Pub. Date: Dec. 23, 2021

(65) Prior Publication Data
US 2022/0199737 A1 Jun. 23, 2022

(51) Int. Cl.
*H10K 59/131* (2023.01)
*G09G 3/00* (2006.01)
(Continued)

(52) U.S. Cl.
CPC ............. *H10K 59/131* (2023.02); *G09G 3/00* (2013.01); *G09G 3/3225* (2013.01);
(Continued)

(58) Field of Classification Search
CPC .............. H10K 59/131; H10K 59/353; H10K 59/1213; H10K 59/1216; H10K 59/121;
(Continued)

(56) References Cited

U.S. PATENT DOCUMENTS

| 2016/0019856 A1 | 1/2016 | Tanaka et al. |
| 2016/0190166 A1 | 6/2016 | Kim et al. |

(Continued)

FOREIGN PATENT DOCUMENTS

| CN | 106875893 A | 6/2017 |
| CN | 107946344 A | 4/2018 |

(Continued)

*Primary Examiner* — Stephen G Sherman
(74) *Attorney, Agent, or Firm* — The Webb Law Firm

(57) ABSTRACT

Provided are a display panel and a manufacturing method thereof, and a display device. The display panel includes: a base substrate including a display area and a peripheral area; a plurality of sub-pixels, each sub-pixel including a light-emitting element and a pixel driving circuit; a plurality of gate lines and light-emitting control lines; a gate driving circuit located at the display area and including cascaded multistage gate driving units, one or more stages include gate driving sub-circuits including a first and a second gate driving sub-circuit spaced apart by pixel driving circuits of a first group of sub-pixels; and a light-emitting control driving circuit located at the display area and including cascaded multistage light-emitting control driving units, one or more stages include light-emitting control driving sub-circuits including a first and a second light-emitting control driving sub-circuit spaced apart by pixel driving circuits of a second group of sub-pixels.

20 Claims, 45 Drawing Sheets

(51) Int. Cl.
  *G09G 3/3225* (2016.01)
  *H10K 59/121* (2023.01)
  *H10K 59/35* (2023.01)

(52) U.S. Cl.
  CPC ..... *H10K 59/1213* (2023.02); *H10K 59/1216* (2023.02); *H10K 59/353* (2023.02); *G09G 2300/00* (2013.01)

(58) Field of Classification Search
  CPC ........ H10K 59/35; G09G 3/00; G09G 3/3225; G09G 2300/00; G09G 3/3266; G09G 3/3233; G09G 2300/0852; G09G 2300/0861; G09G 2300/0426; G09G 2310/0251; G09G 2310/0262; G09G 2310/0297
  See application file for complete search history.

(56) References Cited

U.S. PATENT DOCUMENTS

| | | |
|---|---|---|
| 2017/0047034 A1 | 2/2017 | Nishiyama et al. |
| 2017/0221419 A1 | 8/2017 | Xiang et al. |
| 2017/0255049 A1 | 9/2017 | Nishiyama et al. |
| 2017/0345373 A1 | 11/2017 | Kang et al. |
| 2018/0011504 A1 | 1/2018 | Tanaka et al. |
| 2018/0138256 A1* | 5/2018 | Han .................. G09G 3/3225 |
| 2018/0183008 A1 | 6/2018 | Song et al. |
| 2018/0190946 A1 | 7/2018 | Li et al. |
| 2018/0218668 A1 | 8/2018 | Aoyagi et al. |
| 2019/0027096 A1 | 1/2019 | Kim et al. |
| 2019/0057648 A1 | 2/2019 | Xu |
| 2019/0164478 A1 | 5/2019 | Kim et al. |
| 2019/0189232 A1 | 6/2019 | Wang |
| 2019/0228695 A1 | 7/2019 | Zou |
| 2019/0302815 A1 | 10/2019 | Tanaka et al. |
| 2019/0304374 A1 | 10/2019 | Wang et al. |
| 2019/0355305 A1 | 11/2019 | Yang et al. |
| 2019/0371880 A1 | 12/2019 | Ueno et al. |
| 2019/0392767 A1 | 12/2019 | Kim et al. |
| 2020/0159054 A1 | 5/2020 | Jeong et al. |
| 2021/0375173 A1 | 12/2021 | Wang et al. |
| 2022/0114933 A1 | 4/2022 | Zhu et al. |

FOREIGN PATENT DOCUMENTS

| | | |
|---|---|---|
| CN | 108074532 A | 5/2018 |
| CN | 108962968 A | 12/2018 |
| CN | 109754753 A | 5/2019 |
| KR | 1020200031310 A | 3/2020 |
| WO | 2018220683 A1 | 12/2018 |

* cited by examiner

DISPLAY PANEL AND MANUFACTURING METHOD THEREOF, AND DISPLAY DEVICE

CROSS-REFERENCE TO RELATED APPLICATION

The present application is a U.S. National Stage Application under 35 U.S.C. § 371 of International Patent Application No. PCT/CN2020/096874, filed on Jun. 18, 2020, the disclosure of which is incorporated by reference herein in its entirety.

TECHNICAL FIELD

The present disclosure relates to a display panel and a manufacturing method thereof, and a display device.

BACKGROUND

In recent years, due to the characteristics such as self-luminescence, flexibility, and simple manufacturing process, the OLED (organic light emitting diode) display panels are widely applied. Wearable displays and mobile displays are developing towards smaller frames and greater screen-to-body ratios.

SUMMARY

According to one aspect of the embodiments of the disclosure, a display panel is provided. The display panel comprises: a base substrate comprising a display area and a peripheral area surrounding the display area; a plurality of sub-pixels located at the display area, wherein each of the plurality of sub-pixels comprises a light-emitting element and a pixel driving circuit configured to drive the light-emitting element; a plurality of gate lines located at the display area and electrically connected to the plurality of sub-pixels; a plurality of light-emitting control lines located at the display area and electrically connected to the plurality of sub-pixels; a gate driving circuit located at the display area and comprising cascaded multistage gate driving units electrically connected to the plurality of gate lines, wherein one or more stages gate driving units of the multistage gate driving units comprise a plurality of gate driving sub-circuits, the plurality of gate driving sub-circuits comprises a first gate driving sub-circuit and a second gate driving sub-circuit that are spaced apart by pixel driving circuits of a first group of sub-pixels of the plurality of sub-pixels; and a light-emitting control driving circuit located at the display area and comprising cascaded multistage light-emitting control driving units electrically connected to the plurality of light-emitting control lines, wherein one or more stages light-emitting control driving units of the multistage light-emitting control driving units comprise a plurality of light-emitting control driving sub-circuits, the plurality of light-emitting control driving sub-circuits comprises a first light-emitting control driving sub-circuit and a second light-emitting control driving sub-circuit that are spaced apart by pixel driving circuits of a second group of sub-pixels of the plurality of sub-pixels.

In some embodiments, an orthographic projection of at least one of the plurality of gate driving sub-circuits on the base substrate overlaps with orthographic projections of anodes of light-emitting elements of a first portion of sub-pixels of the plurality of sub-pixels on the base substrate, and does not overlap with orthographic projections of anodes of light-emitting elements of remaining sub-pixels of the plurality of sub-pixels other than the first portion of sub-pixels on the base substrate.

In some embodiments, an orthographic projection of at least one of the plurality of light-emitting control driving sub-circuits on the base substrate overlaps with orthographic projections of anodes of light-emitting elements of a second portion of sub-pixels of the plurality of sub-pixels on the base substrate, and does not overlap with orthographic projections of anodes of light-emitting elements of remaining sub-pixels of the plurality of sub-pixels on the base substrate other than the second portion of sub-pixels.

In some embodiments, the display panel further comprises: a plurality of initialization lines located at the display area and electrically connected to the plurality of sub-pixels; and a plurality of reset lines located at the display area and electrically connected to the plurality of sub-pixels, wherein the first group of sub-pixels is electrically connected to a first initialization line of the plurality of initialization lines, a first reset line of the plurality of reset lines, a first gate line of the plurality of gate lines and a first light-emitting control line of the plurality of light-emitting control lines, the first initialization line and the first reset line are located on one side of the plurality of gate driving sub-circuits, and the first gate line and the first light-emitting control line are located on one side of the plurality of gate driving sub-circuits away from the first initialization line and the first reset line.

In some embodiments, the first group of sub-pixels is electrically connected to a first gate line of the plurality of gate lines; the first gate driving sub-circuit of each stage gate driving unit of the one or more stages gate driving units comprises a first input terminal of each stage gate driving unit, and the first input terminal is configured to receive a first input signal; and the second gate driving sub-circuit of each stage gate driving unit comprises a first output terminal of each stage gate driving unit, and the first output terminal is configured to output a gate driving signal to the first gate line.

In some embodiments, any one stage gate driving unit of the multistage gate driving units comprises the plurality of gate driving sub-circuits, and the first gate driving sub-circuit and the second gate driving sub-circuit are spaced apart by the pixel driving circuits of the first group of sub-pixels in a first direction; the first gate driving sub-circuit of the any one stage gate driving unit is located between the first gate driving sub-circuit of a former stage gate driving unit of the any one stage gate driving unit and the first gate driving sub-circuit of a latter stage gate driving unit of the any one stage gate driving unit in a second direction different from the first direction; and the second gate driving sub-circuit of the any one stage gate driving unit is located between the second gate driving sub-circuit of the former stage gate driving unit of the any one stage gate driving unit and the second gate driving sub-circuit of the latter stage gate driving unit of the any one stage gate driving unit in the second direction.

In some embodiments, the second group of sub-pixels comprises a plurality of first sub-pixels electrically connected to a first light-emitting control line of the plurality of light-emitting control lines, and a plurality of second sub-pixels electrically connected to a second light-emitting control line of the plurality of light-emitting control lines; the first light-emitting control driving sub-circuit of each stage light-emitting control driving unit of the one or more multistage light-emitting control driving units comprises a second input terminal of each stage light-emitting control driving unit, and the second input terminal is configured to receive a second input signal; and the second light-emitting control driving sub-circuit of each stage light-emitting control driving unit comprises a second output terminal of each stage light-emitting control driving unit, and the second output terminal is configured to output a light-emitting control signal to the first light-emitting control line and the second light-emitting control line.

In some embodiments, any one stage light-emitting control driving unit of the multistage light-emitting control driving units comprises the plurality of light-emitting control driving sub-circuits, and the first light-emitting control driving sub-circuit and the second light-emitting control driving sub-circuit are spaced apart by the pixel driving circuits of the first group of sub-pixels in a first direction; the first light-emitting control driving sub-circuit of the any one stage light-emitting control driving unit is located between the first light-emitting control driving sub-circuit of a former stage light-emitting control driving unit of the any one stage light-emitting control driving unit and the first light-emitting control driving sub-circuit of a latter stage light-emitting control driving unit of the any one stage light-emitting control driving unit in a second direction different from the first direction; and the second light-emitting control driving sub-circuit of the any one stage light-emitting control driving unit is located between the second light-emitting control driving sub-circuit of the former stage light-emitting control driving unit of the any one stage light-emitting control driving unit and the second light-emitting control driving sub-circuit of the latter stage light-emitting control driving unit of the any one stage light-emitting control driving unit in the second direction.

In some embodiments, the display panel further comprises a first group of circuit connection lines comprising a first circuit connection line and a second circuit connection line, wherein: the second gate driving sub-circuit is electrically connected to the first gate driving sub-circuit through the first circuit connection line and the second circuit connection line, an orthographic projection of one of the first circuit connection line and the second circuit connection line on the base substrate does not overlap with orthographic projections of the pixel driving circuits of the first group of sub-pixels on the base substrate, and an orthographic projection of the other of the first circuit connection line and the second circuit connection line on the base substrate overlaps with an orthographic projection of the pixel driving circuit of at least one sub-pixel of the first group of sub-pixels on the base substrate.

In some embodiments, the pixel driving circuit of the at least one sub-pixel of the first group of sub-pixels comprises: a first pixel driving sub-circuit located between the first circuit connection line and the second circuit connection line; a second pixel driving sub-circuit located on one side of the second circuit connection line away from the first pixel driving sub-circuit; and a connector electrically connected to the first pixel driving sub-circuit and the second pixel driving sub-circuit, wherein an orthographic projection of the connector on the base substrate overlaps with an orthographic projection of the second circuit connection line on the base substrate.

In some embodiments, the first gate driving sub-circuit comprises a first group of transistors and a second capacitor, and the second gate driving sub-circuit comprises a second group of transistors and a first capacitor; and a number of the second group of transistors is smaller than a number of the first group of transistors, and a width-to-length ratio of a channel of at least one transistor of the second group of transistors is greater than a width-to-length ratio of a channel of each transistor of the first group of transistors.

In some embodiments, the first gate driving sub-circuit further comprises: a first clock signal line configured to receive a first clock signal, a second clock signal line configured to receive a second clock signal, a first power line configured to receive a first power voltage and a second power line configured to receive a second power voltage; and the second gate driving sub-circuit further comprises: a third clock signal line configured to receive the first clock signal, a fourth clock signal line configured to receive the second clock signal, and a fourth power line configured to receive the second power voltage.

In some embodiments, the first power line is located on one side of the first group of transistors close to the second gate driving sub-circuit; the second power line is located on one side of the first group of transistors away from the second gate driving sub-circuit; the first clock signal line and the second clock signal line are located on one side of the second power line away from the second gate driving sub-circuit; the fourth power line is located on one side of the second group of transistors and the second capacitor away from the first gate driving sub-circuit; and the third clock signal line and the fourth clock signal line are located on one side of the second group of transistors and the second capacitor close to the first gate driving sub-circuit.

In some embodiments, each of the first group of transistors and the second group of transistors comprises a gate and an active layer which comprises a first electrode area, a second electrode area, and the channel located between the first electrode area and the second electrode area; and the first group of transistors comprises: a first transistor, wherein the gate of the first transistor is electrically connected to the first clock signal line, and the first electrode area of the first transistor serves as the first input terminal, a second transistor, wherein the gate of the second transistor is electrically connected to the second electrode area of the first transistor, and the first electrode area of the second transistor is electrically connected to the gate of the first transistor, a third transistor, wherein the gate of the third transistor is electrically connected to the gate of the first transistor, the first electrode area of the third transistor is electrically connected to the first power line, and the second electrode area of the third transistor is electrically connected to the second electrode area of the second transistor, a sixth transistor, wherein the gate of the sixth transistor is electrically connected to the second electrode area of the third transistor, and the first electrode area of the sixth transistor is electrically connected to the second power line, and a seventh transistor, wherein the gate of the seventh transistor is electrically connected to the second clock signal line, the first electrode area of the seventh transistor is electrically connected to the second electrode area of the sixth transistor, and the second electrode area of the seventh transistor is electrically connected to the second electrode area of the first transistor; the second group of transistors comprises: a fourth transistor, wherein the gate of the fourth transistor is electrically connected to the gate of the sixth transistor through the second circuit connection line, the first electrode area of the fourth transistor is electrically connected to the third power line, and the second electrode area of the fourth transistor serves as the first output terminal and is electrically connected to the first gate line, and a fifth transistor, wherein the gate of the fifth transistor is electrically connected to the second electrode area of the first transistor through the first circuit connection line, the first electrode area of the fifth transistor is electrically connected to the output electrode, and the second electrode area of the fifth transistor is electrically connected to the fourth clock signal line; a first electrode plate of the first capacitor is electrically connected to the gate of the fifth transistor, and a second electrode plate of the first capacitor is electrically connected to the output electrode; and a first electrode plate of the second capacitor is electrically connected to the gate of the sixth transistor, and a second electrode plate of the second capacitor is electrically connected to the second power line.

In some embodiments, the gate of the third transistor and the gate of the first transistor are integrally provided; the first electrode plate of the first capacitor and the gate of the fifth transistor are integrally provided; and the first electrode plate of the second capacitor and the gate of the sixth transistor are integrally provided.

In some embodiments, the gate of the second transistor is electrically connected to the second electrode area of the first transistor through a first connection electrode; the first electrode area of the second transistor is electrically connected to the gate of the first transistor through a second connection electrode; the gate of the sixth transistor is electrically connected to the second electrode area of the third transistor through a third connection electrode; the first electrode area of the fourth transistor is electrically connected to the third power line through a fourth connection electrode; and the second electrode area of the fifth transistor is electrically connected to the fourth clock signal line through a fifth connection electrode.

In some embodiments, the first group of circuit connection lines further comprises a third circuit connection line, wherein orthographic projections of the third circuit connection line and the second circuit connection line on the base substrate do not overlap with orthographic projections of the pixel driving circuits of the first group of sub-pixels on the base substrate, and an orthographic projection of the first circuit connection line on the base substrate overlaps with the orthographic projections of the pixel driving circuits of the first group of sub-pixels on the base substrate; and the plurality of gate driving sub-circuits further comprises a third gate driving sub-circuit located on one side of the second gate driving sub-circuit away from the first gate driving sub-circuit, electrically connected to the second gate driving sub-circuit through the third circuit connection line, and electrically connected to the first gate driving sub-circuit through the first circuit connection line.

In some embodiments, the first gate driving sub-circuit comprises: a third group of transistors, a first clock signal line configured to receive a first clock signal, a second clock signal line configured to receive a second clock signal, and a first power line configured to receive a first power voltage; the second gate driving sub-circuit comprises: at least one capacitor, a fourth group of transistors, and a second power line configured to receive a second power voltage, wherein a width-to-length ratio of a channel of one of the fourth group of transistors is greater than a width-to-length ratio of a channel of each of the third group of transistors; and the third gate driving sub-circuit comprises: a fifth group of transistors, a third clock signal line configured to receive the first clock signal and a fourth clock signal line configured to receive the second clock signal, wherein a width-to-length ratio of a channel of one of the fifth group of transistors is greater than the width-to-length ratio of the channel of each of the third group of transistors.

In some embodiments, the first power line is located on one side of the third group of transistors close to the second gate driving sub-circuit; the first clock signal line and the second clock signal line are located on one side of the third group of transistors away from the second gate driving sub-circuit; and the third clock signal line and the fourth clock signal line are located on one side of the fifth group of transistors away from the second gate driving sub-circuit.

In some embodiments, each of the third group of transistors, the fourth group of transistors and the fifth group of transistors comprises a gate and an active layer which comprises a first electrode area, a second electrode area, and the channel located between the first electrode area and the second electrode area; the third group of transistors comprises: a first transistor, wherein the gate of the first transistor is electrically connected to the first clock signal line, and the first electrode area of the first transistor serves as the first input terminal, a second transistor, wherein the gate of the second transistor is electrically connected to the second electrode area of the first transistor, and the first electrode area of the second transistor is electrically connected to the gate of the first transistor, and a third transistor, wherein the gate of the third transistor is electrically connected to the gate of the first transistor, the first electrode area of the third transistor is electrically connected to the first power line, and the second electrode area of the third transistor is electrically connected to the second electrode area of the second transistor; the fourth group of transistors comprises: a fourth transistor, wherein the gate of the fourth transistor is electrically connected to the second electrode area of the second transistor through the second circuit connection line, the first electrode area of the fourth transistor is electrically connected to the second power line, and the second electrode area of the fourth transistor is electrically connected to the first gate line through a first output electrode, and a sixth transistor, wherein the gate of the sixth transistor is electrically connected to the gate of the fourth transistor, and the first electrode area of the sixth transistor is electrically connected to the second power line; and the at least one capacitor comprises: a first capacitor, wherein a first electrode plate of the first capacitor is electrically connected to the gate of the second transistor through the first circuit connection line, and a second electrode plate of the first capacitor is electrically connected to the first output electrode, and a second capacitor, wherein a first electrode plate of the second capacitor is electrically connected to the gate of the fourth transistor, and a second electrode plate of the second capacitor is electrically connected to the second power line; the fifth group of transistors comprises: a fifth transistor, wherein the gate of the fifth transistor is electrically connected to the gate of the second transistor through the first circuit connection line, the first electrode area of the fifth transistor is electrically connected to a second output electrode, and the second electrode area of the fifth transistor is electrically connected to the fourth clock signal line, and a seventh transistor, wherein the gate of the seventh transistor is electrically connected to the fourth clock signal line, the first electrode area of the seventh transistor is electrically connected to the second electrode area of the sixth transistor through the third circuit connection line, and the second electrode area of the seventh transistor is electrically connected to the gate of the fifth transistor, wherein one of the second electrode area of the fourth transistor and the first electrode area of the fifth transistor serves as the first output terminal.

In some embodiments, the gate of the first transistor and the gate of the third transistor are integrally provided; and the gate of the fourth transistor, the gate of the sixth transistor and the first electrode plate of the second capacitor are integrally provided.

In some embodiments, the display panel further comprises a second group of circuit connection lines comprising a fourth circuit connection line and a fifth circuit connection line, wherein: the second light-emitting control driving sub-circuit is electrically connected to the first light-emitting control driving sub-circuit through the fourth circuit connection line and the fifth circuit connection line, and orthographic projections of the fourth circuit connection line and the fifth circuit connection line on the base substrate overlaps with orthographic projections of the pixel driving circuits of the second group of sub-pixels on the base substrate.

In some embodiments, the first light-emitting control driving sub-circuit comprises a first group of transistors, a second capacitor, a first power line configured to receive a first power voltage, and a second power line configured to receive a second power voltage; and the second light-emitting control driving sub-circuit comprises a second group of transistors, a first capacitor, a third capacitor, a first clock signal line configured to receive a first clock signal, and a second clock signal line configured to receive a second clock signal, wherein a number of the first group of transistors is smaller than a number of the second group of transistors, and a width-to-length ratio of channels of at least one of the first group of transistors is greater than a width-to-length ratio of a channel of each of the second group of transistors.

In some embodiments, the first light-emitting control driving sub-circuit comprises: a first sub-circuit located on one side of the first light-emitting control line away from the second light-emitting control line, and comprising a first sub-group of transistors which comprises at least one transistor of the first group of transistors, and a second sub-circuit located between the first light-emitting control line and the second light-emitting control line, and comprising the second capacitor and a second sub-group of transistors which comprises other transistors of the first group of transistors other than the first sub-group of transistors; the second light-emitting control driving sub-circuit comprises: a third sub-circuit located on one side of the first light-emitting control line away from the second light-emitting control line, electrically connected to the first sub-circuit through the fourth circuit connection line, and comprising a third sub-group of transistors which comprises at least one transistor of the second group of transistors, and a fourth sub-circuit located between the first light-emitting control line and the second light-emitting control line, electrically connected to the second sub-circuit through the fifth circuit connection line, and comprising the first capacitor and a fourth sub-group of transistors which comprises other transistors of the second group of transistors other than the first sub-group of transistors.

In some embodiments, the second light-emitting control driving sub-circuit further comprises a third power line configured to receive the first power voltage and a fourth power line configured to receive the second power voltage.

In some embodiments, each of the first group of transistors and the second group of transistors comprises a gate and an active layer which comprises a first electrode area, a second electrode area, and the channel located between the first electrode area and the second electrode area; the second group of transistors comprises: a first transistor, wherein the gate of the first transistor is electrically connected to the first clock signal line, and the first electrode area of the first transistor serves as the second input terminal, a second transistor, wherein the gate of the second transistor is electrically connected to the second electrode area of the first transistor, and the first electrode area of the second transistor is electrically connected to the gate of the first transistor, a third transistor, wherein the gate of the third transistor is electrically connected to the second electrode area of the second transistor, and the first electrode area of the third transistor is electrically connected to the fourth power line, a fourth transistor, wherein the gate of the fourth transistor is electrically connected to the second clock signal line, the first electrode area of the fourth transistor is electrically connected to the second electrode area of the third transistor, and the second electrode area of the fourth transistor is electrically connected to the gate of the second transistor, a fifth transistor, wherein the gate of the fifth transistor is electrically connected to the gate of the first transistor, the first electrode area of the fifth transistor is electrically connected to the third power line, and the second electrode area of the fifth transistor is electrically connected to the second electrode area of the second transistor, a sixth transistor, wherein the gate of the sixth transistor is electrically connected to the gate of the third transistor, and the first electrode area of the sixth transistor is electrically connected to the gate of the fourth transistor; a seventh transistor, wherein the gate of the seventh transistor is electrically connected to the gate of the fourth transistor, and an eighth transistor, wherein the first electrode area of the eighth transistor is electrically connected to the fourth power line, and the second electrode area of the eighth transistor is electrically connected to the second electrode area of the seventh transistor; the first group of transistors comprises: a ninth transistor, wherein the gate of the ninth transistor is electrically connected to the second electrode area of the seventh transistor through the fifth circuit connection line, the first electrode area of the ninth transistor is electrically connected to the second power line, and the second electrode area of the ninth transistor is electrically connected to the first light-emitting control line and the second light-emitting control line through a second output electrode, and a tenth transistor, wherein the first electrode area of the tenth transistor is electrically connected to the second output electrode, and the second electrode area of the tenth transistor is electrically connected to the first power line; a first electrode plate of the first capacitor is electrically connected to the gate of the third transistor and the gate of the sixth transistor, and a second electrode plate of the first capacitor is electrically connected to the second electrode area of the sixth transistor and the first electrode area of the seventh transistor; a first electrode plate of the second capacitor is electrically connected to the gate of the ninth transistor, and a second electrode plate of the second capacitor is electrically connected to the second power line; a first electrode plate of the third capacitor is electrically connected to the gate of the second transistor, the gate of the eighth transistor, and the gate of the tenth transistor, and a second electrode plate of the third capacitor is electrically connected to the gate of the fourth transistor; the first sub-group of transistors comprises the tenth transistor; the second sub-group of transistors comprises the ninth transistor; the third sub-group of transistors comprises the first transistor, the second transistor, and the fifth transistor; the fourth sub-group of transistors comprises the third transistor, the fourth transistor, the sixth transistor, the seventh transistor, and the eighth transistor; and the third sub-circuit further comprises the third capacitor.

In some embodiments, the gate of the fifth transistor and the gate of the first transistor are integrally provided; the gate of the seventh transistor and the gate of the fourth transistor are integrally provided; the first electrode plate of the first capacitor and the gate of the third transistor and the gate of the sixth transistor are integrally provided; the first electrode plate of the second capacitor and the gate of the ninth transistor are integrally provided; the first electrode plate of the third capacitor and the gate of the second transistor are integrally provided.

In some embodiments, the second group of circuit connection lines further comprises a sixth circuit connection line and a seventh circuit connection line; and the third sub-circuit is electrically connected to the first power line through the sixth circuit connection line, and electrically connected to the second power line through the seventh circuit connection line.

In some embodiments, each of the first group of transistors and the second group of transistors comprises a gate and an active layer which comprises a first electrode area, a second electrode area, and the channel located between the first electrode area and the second electrode area; the second group of transistors comprises: a first transistor, wherein the gate of the first transistor is electrically connected to the first clock signal line, and the first electrode area of the first transistor serves as the second input terminal, a second transistor, wherein the gate of the second transistor is electrically connected to the second electrode area of the first transistor, and the first electrode area of the second transistor is electrically connected to the gate of the first transistor, a third transistor, wherein the gate of the third transistor is electrically connected to the second electrode area of the second transistor, and the first electrode area of the third transistor is electrically connected to the second power line through the seventh circuit connection line, a fourth transistor, wherein the gate of the fourth transistor is electrically connected to the second clock signal line, the first electrode area of the fourth transistor is electrically connected to the second electrode area of the third transistor, and the second electrode area of the fourth transistor is electrically connected to the gate of the second transistor, a fifth transistor, wherein the gate of the fifth transistor is electrically connected to the gate of the first transistor, the first electrode area of the fifth transistor is electrically connected to the first power line through the sixth circuit connection line, and the second electrode area of the fifth transistor is electrically connected to the second electrode area of the second transistor, a sixth transistor, wherein the gate of the sixth transistor is electrically connected to the gate of the third transistor, a seventh transistor, wherein the gate of the seventh transistor is electrically connected to the first electrode area of the sixth transistor and the second clock signal line, and the second electrode area of the seventh transistor is electrically connected to the first electrode area of the sixth transistor; the first group of transistors comprises: an eighth transistor, wherein the gate of the eighth transistor is electrically connected to the gate of the second transistor through the fourth circuit connection line, the first electrode area of the eighth transistor is electrically connected to the second power line, and the second electrode area of the eighth transistor is electrically connected to the second electrode area of the seventh transistor through the fifth circuit connection line, a ninth transistor, wherein the gate of the ninth transistor is electrically connected to the second electrode area of the seventh transistor through the fifth circuit connection line, the first electrode area of the ninth transistor is electrically connected to the first power line, and the second electrode area of the ninth transistor is electrically connected to the first light-emitting control line and the second light-emitting control line through a second output electrode, and a tenth transistor, wherein the gate of the tenth transistor is electrically connected to the gate of the second transistor through the fourth circuit connection line, the first electrode area of the tenth transistor is electrically connected to the second output electrode, and the second electrode area of the tenth transistor is electrically connected to the first power line; a first electrode plate of the first capacitor is electrically connected to the gate of the sixth transistor, and a second electrode plate of the first capacitor is electrically connected to the first electrode area of the sixth transistor and the first electrode area of the seventh transistor; a first electrode plate of the second capacitor is electrically connected to the gate of the ninth transistor, and a second electrode plate of the second capacitor is electrically connected to the second power line; a first electrode plate of the third capacitor is electrically connected to the gate of the seventh transistor, and a second electrode plate of the third capacitor is electrically connected to; the first sub-group of transistors comprises the tenth transistor; the second sub-group of transistors comprises the eighth transistor and the ninth transistor; the third sub-group of transistors comprises the first transistor, the second transistor, the third transistor, the fourth transistor and the fifth transistor; the fourth sub-group of transistors comprises the sixth transistor and the seventh transistor; and the fourth sub-circuit further comprises the third capacitor.

In some embodiments, the gate of the fifth transistor and the gate of the first transistor are integrally provided; the gate of the eighth transistor and the fourth circuit connection line are integrally provided; the first electrode plate of the first capacitor and the gate of the sixth transistor are integrally provided; the first electrode plate of the second capacitor and the gate of the ninth transistor are integrally provided; and the first electrode plate of the third capacitor and the gate of the seventh transistor are integrally provided.

In some embodiments, the display panel further comprises: a plurality of light-emitting control lines located at the display area and electrically connected to the plurality of sub-pixels; a plurality of power lines located at the display area and electrically connected to the plurality of sub-pixels; a plurality of reset lines located at the display area and electrically connected to the plurality of sub-pixels; and a plurality of initialization lines located at the display area and electrically connected to the plurality of sub-pixels; the first pixel driving sub-circuit comprises: a driving transistor comprising a first gate and a first active layer, a plurality of transistors comprising a first light-emitting control transistor, and a storage capacitor comprising a first electrode plate and a second electrode plate, wherein the first electrode plate is electrically connected to one of the plurality of power lines; and the second pixel driving sub-circuit comprises a first reset transistor, each of the first reset transistor and the plurality of transistors comprises a second gate and a second active layer, and each of the second active layer and the first active layers comprises a first electrode area, a second electrode area, and a channel located between the first electrode area and the second electrode area, wherein: a first gate of the driving transistor is electrically connected to the second electrode plate of the storage capacitor, and the first electrode area of the driving transistor is electrically connected to the one of the plurality of power lines, the second gate of the first light-emitting control transistor is electrically connected to one of the plurality of light-emitting control lines, the first electrode area of the first light-emitting control transistor is electrically connected to the second electrode area of the driving transistor, and the second electrode area of the first light-emitting control transistor is electrically connected to the one end of the connector, the second gate of the first reset transistor is electrically connected to one of the plurality of reset lines, the first electrode area of the first reset transistor is electrically connected to one of the plurality of initialization lines, and the second electrode area of the first reset transistor is electrically connected to the other end of the connector, and the anode of the light-emitting element of the at least one sub-pixel is electrically connected to the one end of the connector.

In some embodiments, the display panel further comprises: a plurality of data lines located at the display area and electrically connected to the plurality of sub-pixels; the plurality of transistors further comprises: a data writing transistor, wherein the second gate of the data writing transistor is electrically connected to one of the plurality of gate lines, the first electrode area of the data writing transistor is electrically connected to one of the plurality of data lines, and the second electrode area of the data writing transistor is electrically connected to the first electrode area of the driving transistor, a second reset transistor, wherein the second gate of the second reset transistor is electrically connected to another one of the plurality of reset lines, the first electrode area of the second reset transistor is electrically connected to the second electrode plate of the storage capacitor, and the second electrode area of the second reset transistor is electrically connected to another one of the plurality of initialization lines, a second light-emitting control transistor, wherein the second gate of the second light-emitting control transistor is electrically connected to the one of the plurality of light-emitting control lines, the first electrode area of the second light-emitting control transistor is electrically connected to the one of the plurality of power lines, and the second electrode area of the second light-emitting control transistor is electrically connected to the first electrode area of the driving transistor, and a threshold compensation transistor, wherein the second gate of the threshold compensation transistor is electrically connected to the one of the plurality of gate lines, the first electrode area of the threshold compensation transistor is electrically connected to the first electrode area of the second reset transistor, and the second electrode area of the threshold compensation transistor is electrically connected to the second electrode area of the driving transistor.

According to another aspect of the embodiments of the disclosure, a display device is provided. The display device comprises: the display panel according to any one of the above embodiments.

According to still another aspect of the embodiments of the disclosure, a manufacturing method of a display panel is provided. The manufacturing method comprises: providing a base substrate comprising a display area and a peripheral area surrounding the display area; and forming a plurality of sub-pixels, a plurality of gate lines, a plurality of light-emitting control lines, a gate driving circuit and a light-emitting control driving circuit at the display area, wherein: each of the plurality of sub-pixels comprises a light-emitting element and a pixel driving circuit configured to drive the light-emitting element, the plurality of gate lines is electrically connected to the plurality of sub-pixels, the plurality of light-emitting control lines is electrically connected to the plurality of sub-pixels, the gate driving circuit comprises cascaded multistage gate driving units electrically connected to the plurality of gate lines, wherein one or more stages gate driving units of the multistage gate driving units comprise a plurality of gate driving sub-circuits, the plurality of gate driving sub-circuits comprises a first gate driving sub-circuit and a second gate driving sub-circuit that are spaced apart by pixel driving circuits of a first group of sub-pixels of the plurality of sub-pixels, and the light-emitting control driving circuit comprises cascaded multistage light-emitting control driving units electrically connected to the plurality of light-emitting control lines, wherein one or more stages light-emitting control driving units of the multistage light-emitting control driving units comprise a plurality of light-emitting control driving sub-circuits, the plurality of light-emitting control driving sub-circuits comprises a first light-emitting control driving sub-circuit and a second light-emitting control driving sub-circuit that are spaced apart by pixel driving circuits of a second group of sub-pixels of the plurality of sub-pixels.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1A:
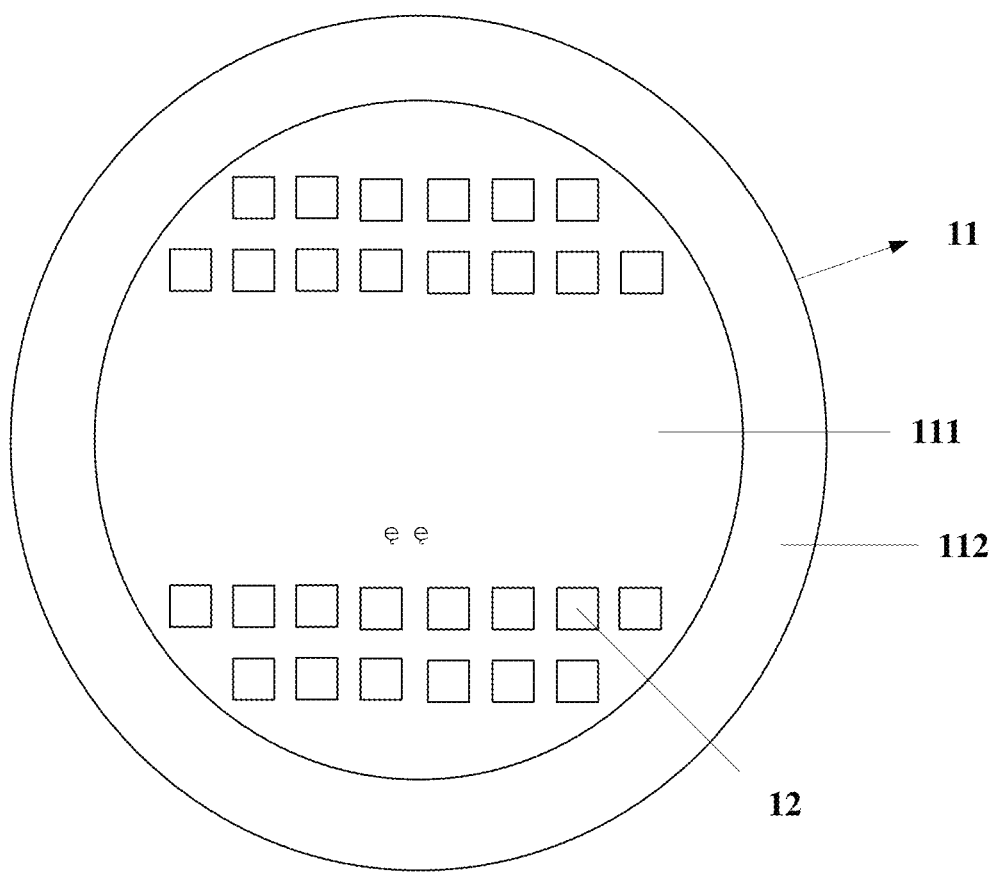
FIG. 1A is a schematic structural view showing a display panel according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the related art, in order to drive sub-pixels of the display panel to emit light, a driving circuit, such as a gate driving circuit or a light-emitting control driving circuit, is provided in a peripheral area of the display panel. The inventors have noticed that, for some small-sized wearable devices, such as a round watch or the like, a smaller frame size is required.

In view of this, the embodiments of the present disclosure provide the following technical solutions.

Figure 1B:
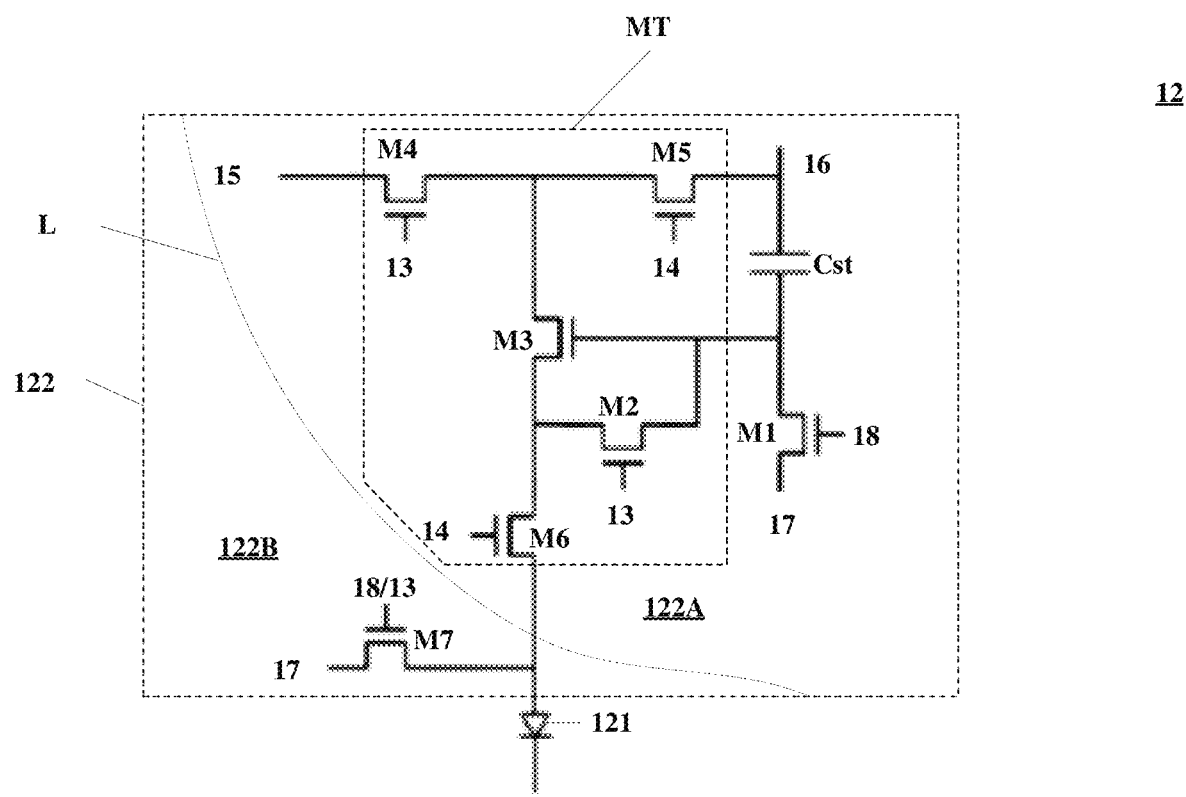
FIG. 1B is a schematic circuit view showing a sub-pixel according to an embodiment of the present disclosure.

FIG. 1A is a schematic structural view showing a display panel according to an embodiment of the present disclosure. FIG. 1B is a schematic circuit view showing a sub-pixel according to an embodiment of the present disclosure.

As shown in FIG. 1A, the display panel comprises a base substrate 11 and a plurality of sub-pixels 12.

The base substrate 11 comprises a display area 111 and a peripheral area 112 surrounding the display area 111. Here, the display area 111 is schematically shown to be substantially in a circular shape, and the peripheral area 112 is schematically shown to be substantially in a shape of a circular ring. It should be understood that the embodiments of the present disclosure are not limited thereto. For example, in other embodiments, the display area 111 may be substantially in a rectangular shape, and the peripheral area 112 may be substantially in a shape of a rectangular ring. In some embodiments, the base substrate 11 may comprise a flexible substrate, such as a polyimide (PI) substrate or the like.

The plurality of sub-pixels 12 is located at the display area 111. For example, the plurality of sub-pixels 12 may comprise a red sub-pixel, a green sub-pixel, a blue sub-pixel, or the like.

As shown in FIG. 1B, each sub-pixel 12 comprises a light-emitting element 121 and a pixel driving circuit 122 configured to drive the light-emitting element 121. For example, the light-emitting element 121 may comprise an organic light emitting diode (OLED) or the like. For example, referring to FIG. 1B, the pixel driving circuit 122 may comprise seven transistors and one capacitor (7T1C). For example, the seven transistors may be PMOS (P-channel metal oxide semiconductor) transistors. For another example, some of the seven transistors are PMOS transistors, and the other transistors are NMOS (N-channel metal oxide semiconductor) transistors. In other embodiments, the pixel driving circuit 122 may comprise six transistors and one capacitor (6T1C).

It should be noted that, for the display panels in different embodiments introduced below, reference may be made to the above description for the base substrate 11 and the plurality of sub-pixels 12, and the detailed introduction will not be repeated in the following description.

Figure 2:
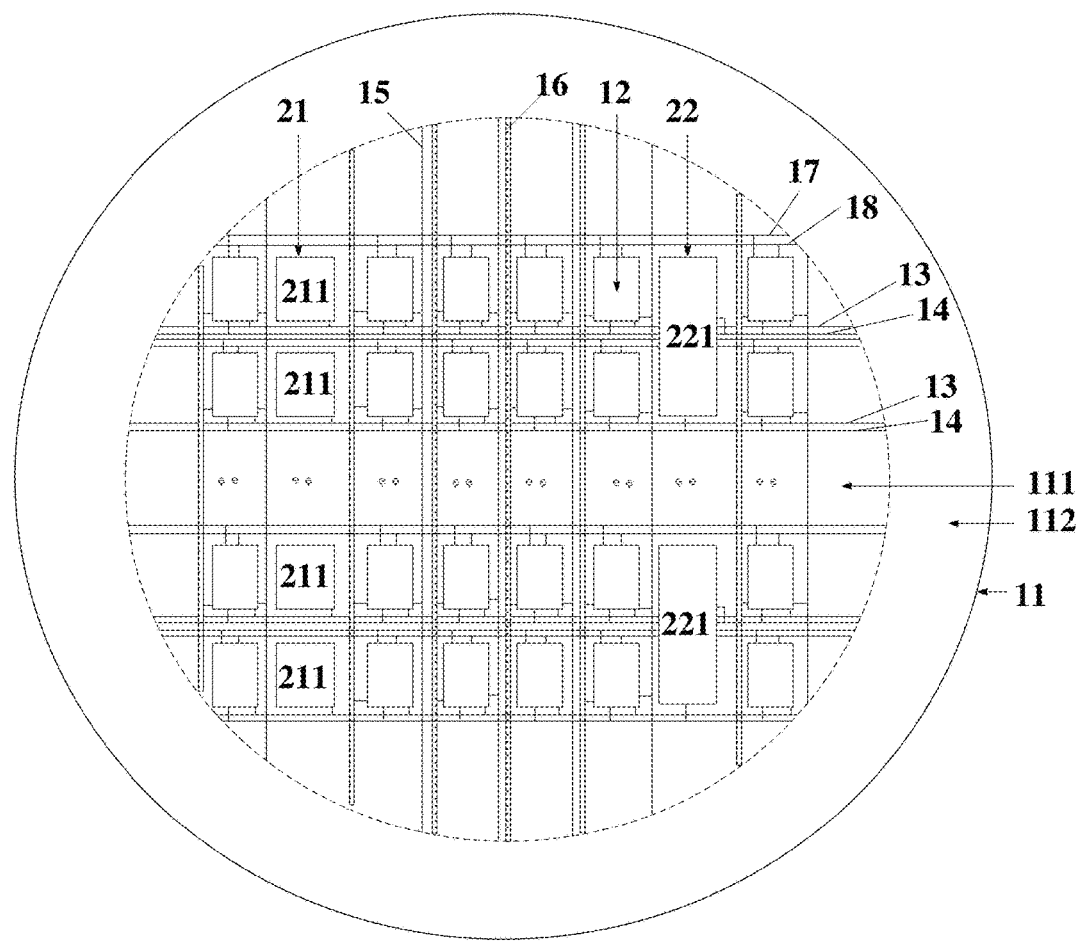
FIG. 2 is a schematic structure view showing a display panel according to another embodiment of the present disclosure.
Figure 3A:
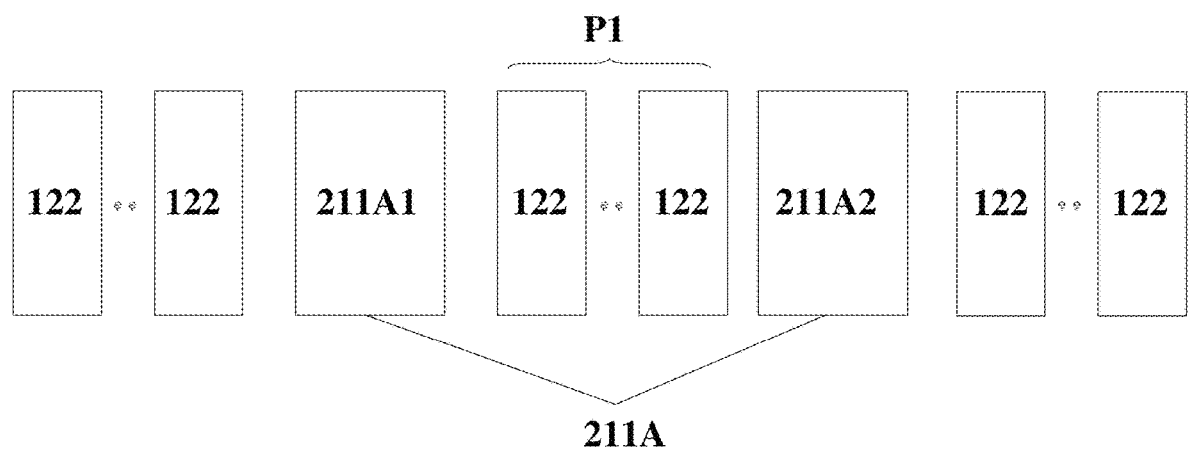
FIG. 3A is a schematic view showing the distribution of a plurality of gate driving sub-circuits according to an embodiment of the present disclosure.
Figure 3B:
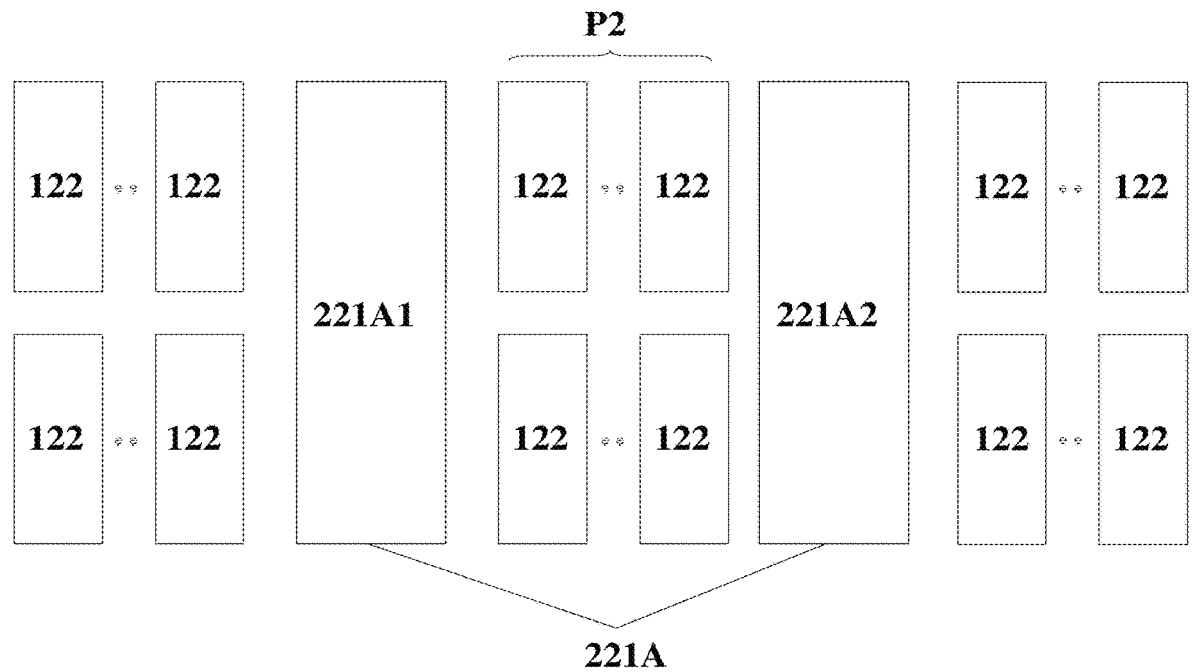
FIG. 3B is a schematic view showing the distribution of a plurality of light-emitting control driving sub-circuits according to an embodiment of the present disclosure.

FIG. 2 is a schematic view showing the structure of a display panel according to another embodiment of the present disclosure. FIG. 3A is a schematic view showing the distribution of a plurality of gate driving sub-circuits according to an embodiment of the present disclosure. FIG. 3B is a schematic view showing the distribution of a plurality of light-emitting control driving sub-circuits according to an embodiment of the present disclosure.

As shown in FIG. 2, the display panel comprises a base substrate 11, a plurality of sub-pixels 12, a plurality of gate lines 13, a plurality of light-emitting control lines 14, a gate driving circuit 21 and a light-emitting control driving circuit 22.

The base substrate 11 comprises a display area 111 and a peripheral area 112 surrounding the display area 111. The plurality of sub-pixels 12 is located at the display area 111. The plurality of gate lines 13 is located at the display area 111 and electrically connected to the plurality of sub-pixels 12. The plurality of gate lines 13 is configured to provide gate driving signals to the plurality of sub-pixels 12. The plurality of light-emitting control lines 14 is located at the display area 111 and electrically connected to the plurality of sub-pixels 12. The plurality of light-emitting control lines 14 is configured to provide light-emitting control signals to the plurality of sub-pixels 12.

The gate driving circuit 21 is located at the display area 111 and comprises cascaded multistage gate driving units 211. The multistage gate driving units 211 are electrically connected to the plurality of gate lines 13. For example, the multistage gate driving units 211 are electrically connected to the plurality of gate lines 13 in a one-to-one correspondence. For example, the gate driving unit 211 may be a shift register.

As shown in FIG. 3A, one or more stages gate driving units 211 of the multistage gate driving circuits 211 may comprise a plurality of gate driving sub-circuits 211A. The plurality of gate driving sub-circuits 211A may comprise a first gate driving sub-circuit 211A1 and a second gate driving sub-circuit 211A2. Here, the first gate driving sub-circuit 211A1 and the second gate driving sub-circuit 211A2 are spaced apart by the pixel driving circuits 122 of a first group of sub-pixels P1 of the plurality of sub-pixels 12.

The light-emitting control driving circuit 22 is located at the display area 111 and comprises cascaded multistage light-emitting control driving units 221. The multistage light-emitting control driving units 221 are electrically connected to a plurality of light-emitting control lines 14. For example, one stage light-emitting control driving unit 221 is electrically connected to two light-emitting control lines 14. For example, the light-emitting control driving unit 221 may be a shift register.

As shown in FIG. 3B, one or more stages light-emitting control driving units 221 of the multistage light-emitting control driving units 221 comprise a plurality of light-emitting control driving sub-circuits 221A. The plurality of light-emitting control driving sub-circuits 221A comprises a first light-emitting control driving sub-circuit 221A1 and a second light-emitting control driving sub-circuit 221A2. Here, the first light-emitting control driving sub-circuit 221A1 and the second light-emitting control driving sub-circuit 221A2 are spaced apart by the pixel driving circuits 122 of a second group of sub-pixels P2 (referred to as a sixth group of sub-pixels P6 in some embodiments) of the plurality of sub-pixels 12.

In the above embodiments, the gate driving circuit 21 and the light-emitting control driving circuit 22 are both located at the display area 111. At least one stage gate driving unit 211 of the gate driving circuit 21 comprises a plurality of gate driving sub-circuits 211A distributed in the pixel driving circuits 122 of the plurality of sub-pixels 12, and at least one stage light-emitting control driving unit 221 of the light-emitting control driving circuit comprises a plurality of light-emitting control driving sub-circuits 221A distributed in the pixel driving circuits 122 of the plurality of sub-pixels 12. Such a structure is beneficial to reduce the frame size of the display panel.

The gate driving unit 211 of the gate driving circuit 21 may be split in different methods to obtain a plurality of corresponding gate driving sub-circuits 211A, which will be introduced below in conjunction with different embodiments.

FIGS. 4A-4F are schematic views showing the layout of different layers in a gate driving unit according to some implementations of the present disclosure. FIG. 5A is an enlarged schematic view showing 211A1 shown in FIG. 4A. FIG. 5B is an enlarged schematic view showing 211A2 shown in FIG. 4A. Some splitting methods of the gate driving unit 211 of the gate driving circuit 21 will be introduced below in conjunction with FIGS. 2, 4A-4F, and 5A-5B.

In some embodiments, referring to FIG. 2, the display panel further comprises a plurality of initialization lines 17 and a plurality of reset lines 18. The plurality of initialization lines 17 is located at the display area 111 and electrically connected to the plurality of sub-pixels 12. The plurality of initialization lines 17 is configured to provide initialization signals to the plurality of sub-pixels 12. The plurality of reset lines 18 is located at the display area 111 and electrically connected to the plurality of sub-pixels 12. The plurality of reset lines 18 is configured to provide reset signals to the plurality of sub-pixels 12.

Figure 4A:
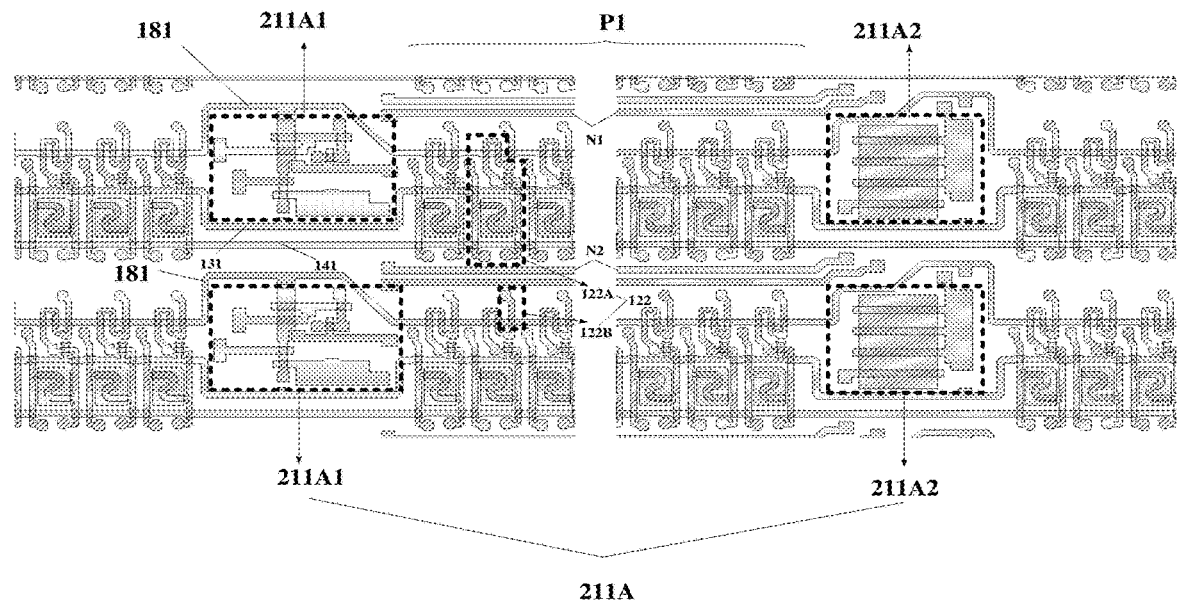
FIGS. 4A-4F are schematic views showing the layout of different layers in a gate driving unit according to some implementations of the present disclosure.
Figure 4B:
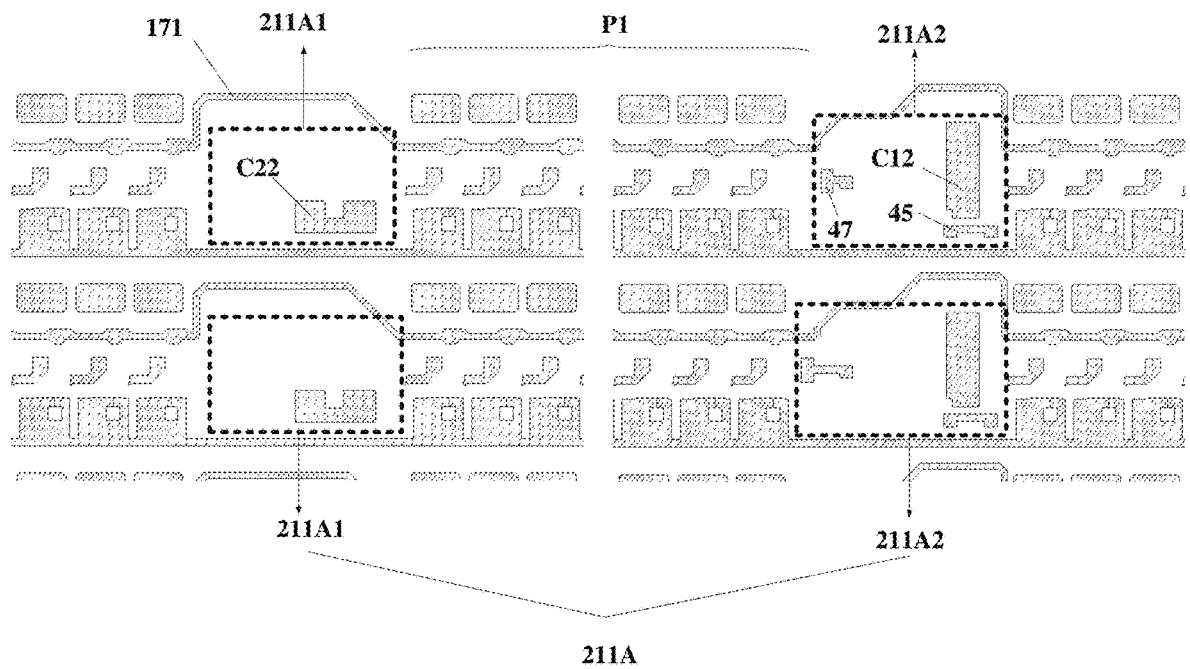
Figure 5A:
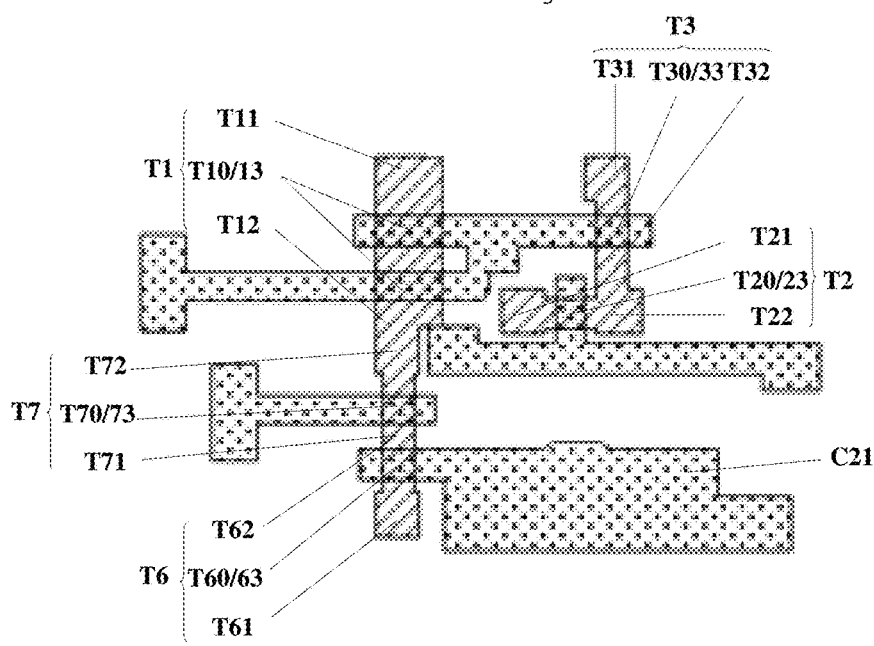
FIG. 5A is an enlarged schematic view showing 211A1 shown in FIG. 4A.
Figure 5B:
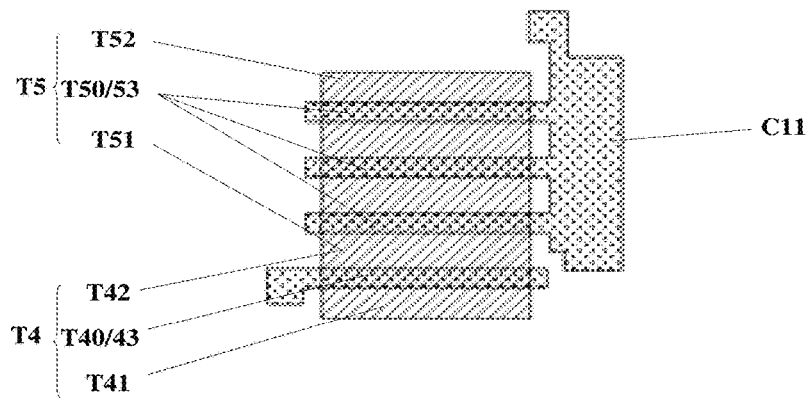
FIG. 5B is an enlarged schematic view showing 211A2 shown in FIG. 4A.

Referring to FIGS. 4A and 4B, the first group of sub-pixels P1 are electrically connected to a first initialization line 171 of the plurality of initialization lines 17, a first reset line 181 of the plurality of reset lines 18, a first grate line 131 of the plurality of gate lines 13 and a first light-emitting control line 141 of the plurality of light-emitting control lines 14. Here, the first initialization line 171 and the first reset line 181 are located on one side of the plurality of gate driving sub-circuits 211A, and the first gate line 131 and the first light-emitting control line 141 are located on one side of the plurality of gate driving sub-circuits 211A away from the first initialization line 171 and the first reset line 181. Such a structure is beneficial to reduce the space occupied by these signal lines, thereby helping to improve the resolution of the display panel.

Figure 4C:
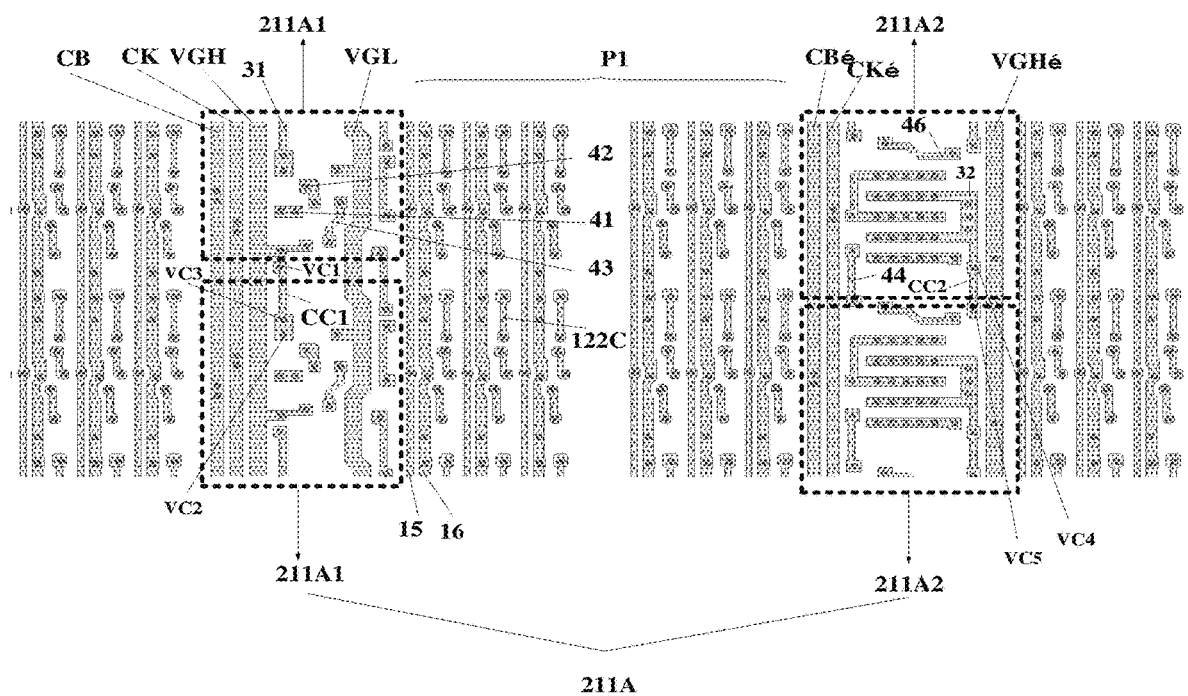
Figure 4D:
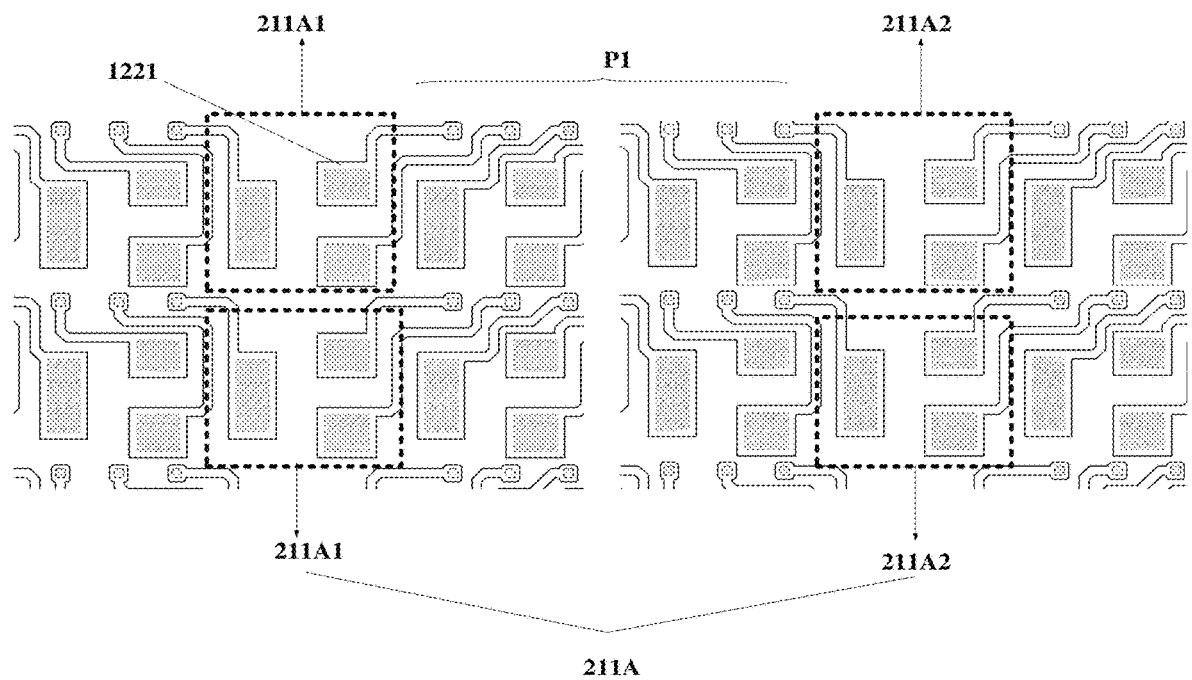
Figure 4E:
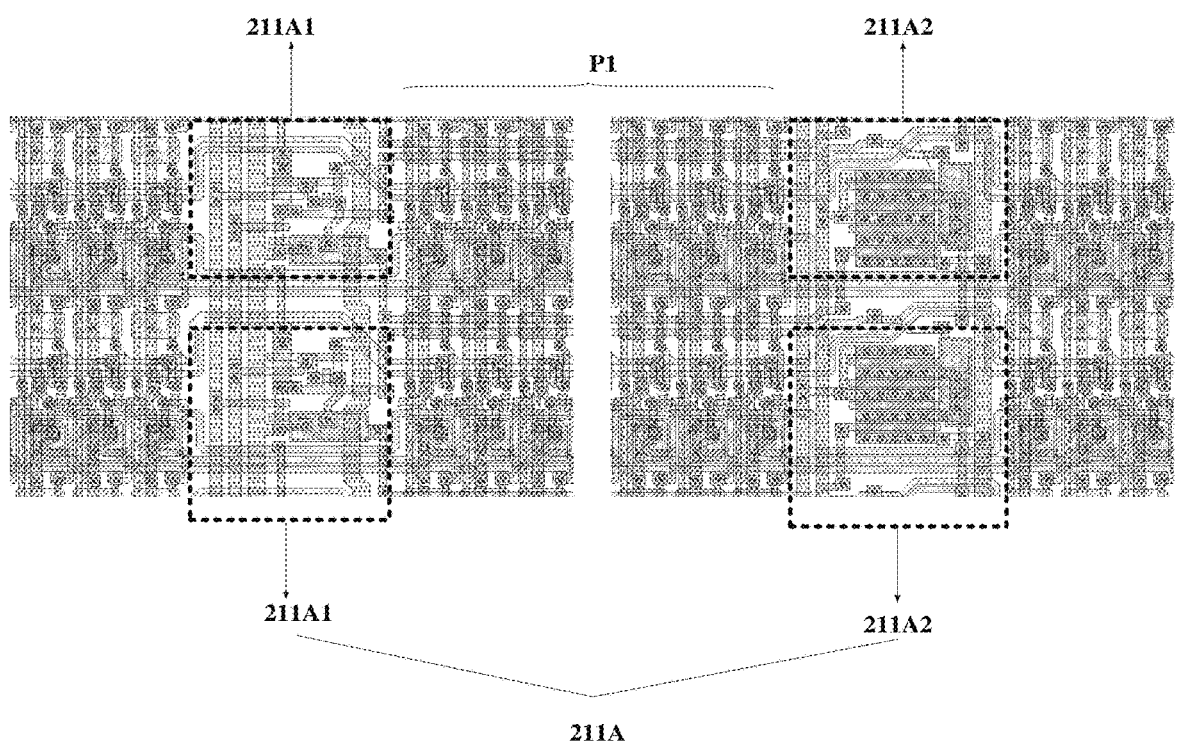
Figure 4F:
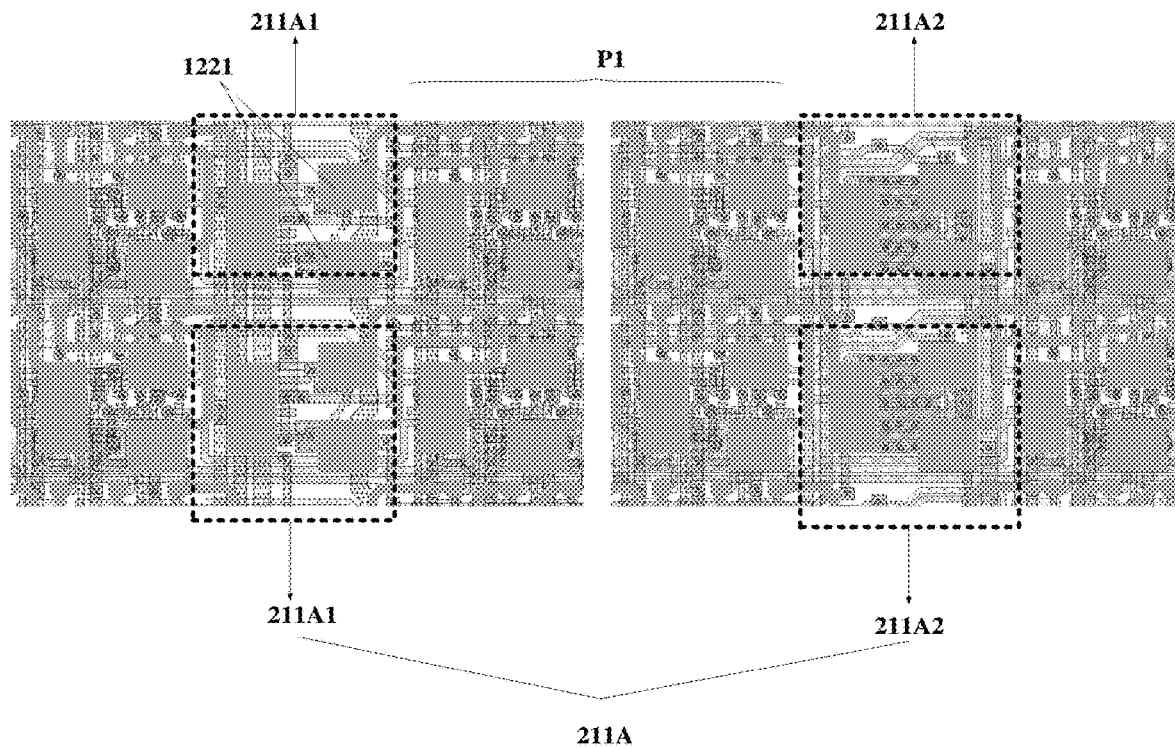

In some embodiments, referring to FIG. 4F, an orthographic projection of at least one of the plurality of gate driving sub-circuits 211A on the base substrate 11 overlaps with orthographic projections of the anodes 1211 of the light-emitting elements 121 of a first portion of sub-pixels 12 of the plurality of sub-pixels 12 on the base substrate 11, and does not overlap with orthographic projection of the anodes 1211 of the light-emitting elements 121 of the remaining sub-pixels 12 of the plurality of sub-pixels 12 other than the first portion of sub-pixels 12 on the base substrate 11. In this way, it is possible to reduce the frame size of the display panel without affecting the display uniformity as much as possible.

In some embodiments, the first group of sub-pixels P1 are electrically connected to the first gate line 131 of the plurality of gate lines 13. The first gate driving sub-circuit 211A1 of each stage gate driving unit 211 of the one or more stages gate driving units 211 comprise a first input terminal IN1 of each stage gate driving unit 211. The first input terminal IN1 is configured to receive a first input signal. The second gate driving sub-circuit 211A2 of each stage gate driving unit 211 of the one or more stages gate driving units 211 comprises a first output terminal OUT1 of each stage gate driving unit 211. The first output terminal OUT1 is configured to output a gate driving signal to the first gate line 131. It should be understood that, the first input terminal IN1 of the first stage gate driving unit 211 may receive a signal from outside the gate driving circuit 21 as the first input signal, and the first input terminal IN1 of each of other stages gate driving units 211 may receive the gate driving signal from a former stage gate driving unit 211 as the first input signal.

In some embodiments, referring to FIGS. 4A-4F, any one stage gate driving unit 211 of the multistage gate driving units 211 comprises a plurality of gate driving sub-circuits 211A. The first gate driving sub-circuit 211A1 and the second gate driving sub-circuit 211A2 are spaced apart by the pixel driving circuits 122 of the first group of sub-pixels P1 in a first direction. The first gate driving sub-circuit 211A1 in any one stage gate driving unit 211 is located between the first gate driving sub-circuit 211A1 of a former stage gate driving unit 211 of the any one stage gate driving unit 211 and the first gate driving sub-circuit 211A1 of a latter stage gate driving unit 211 of the any one stage gate driving unit 211 in a second direction different from the first direction. The second gate driving sub-circuit 211A2 of any one stage gate driving unit 211 is located between the second gate driving sub-circuit 211A2 of a former stage gate driving unit 211 of the any one stage gate driving unit 211 and the second gate driving sub-circuit 211A2 of a latter stage gate driving unit 211 of the any one stage gate driving unit 211 in the second direction. For example, the second direction is perpendicular to the first direction. For example, the first direction is a row direction in which the plurality of sub-pixels 12 is arranged, and the second direction is a column direction in which the plurality of sub-pixels 12 is arranged.

In some embodiments, the display panel further comprises a first group of circuit connection lines. Referring to FIG. 4A, the first group of circuit connection lines comprises a first circuit connection line N1 and a second circuit connection line N2. The second gate driving sub-circuit 211A2 is electrically connected to the first gate driving sub-circuit 211A1 through the first circuit connection line N1 and the second circuit connection line N2. An orthographic projection of one of the first circuit connection line N1 and the second circuit connection line N2 on the base substrate 11 does not overlap with orthographic projections of the pixel driving circuits 122 of the first group of sub-pixels P1 on the base substrate 11, and an orthographic projection of the other of the first circuit connection line N1 and the second circuit connection line N2 on the base substrate 11 overlaps with an orthographic projection of the pixel driving circuit 122 of at least one sub-pixel 12 of the first group of sub-pixels P1 on the base substrate 11. For example, referring to FIG. 4A, the orthographic projection of the first circuit connection line N1 on the base substrate 11 does not overlap with the orthographic projections of the pixel driving circuits 122 of the first group of sub-pixels P1 on the base substrate 11, and the orthographic projection of the second circuit connection line N2 on the base substrate 11 overlaps with the orthographic projection of the pixel driving circuit 122 of at least one sub-pixel of the first group of sub-pixels P1 on the base substrate 11. It should be understood that, the orthographic projection of the first circuit connection line N1 on the base substrate 11 overlaps with orthographic projections of the pixel driving circuits 122 of the first group of sub-pixels P1 located between the first gate driving sub-circuit 211A1 and the second gate driving sub-circuit 211A2 in a former stage gate driving unit 211 on the base substrate 11.

In some embodiments, referring to FIGS. 4A and 4C, the pixel driving circuit 122 of at least one sub-pixel 12 of the first group of sub-pixels P1 comprises a first pixel driving sub-circuit 122A, a second pixel driving sub-circuit 122B and a connector 122C. The first pixel driving sub-circuit 122A is located between the first circuit connection line N1 and the second circuit connection line N2, the second pixel driving sub-circuit 122B is located on one side of the second circuit connection line N2 away from the first pixel driving sub-circuit 122A, and the connector 122C is electrically connected to the first pixel driving sub-circuit 122A and the second pixel driving sub-circuit 122B. For example, one end of the connector 122C is electrically connected to the first pixel driving sub-circuit 122A through a via hole, and the other end of the connector 122C is electrically connected to the second pixel driving sub-circuit 122B through a via hole. Here, an orthographic projection of the connector 122C on the base substrate 11 overlaps with an orthographic projection of the second circuit connection line N2 on the base substrate 11.

In some embodiments, the first gate driving sub-circuit 211A1 comprises a first group of transistors GT1 and a second capacitor C2, and the second gate driving sub-circuit 211A2 comprises a second group of transistors GT2 and a first capacitor C1. The number of the second group of transistors GT2 is smaller than the number of the first group of transistors GT1, and the width-to-length ratio of the channel of at least one transistor in the second group of transistors GT2 is greater than the width-to-length ratio of the channel of each transistor in the first group of transistors GT1. In this way, the number and sizes of transistors in the first gate driving sub-circuit 211A1 and the second gate driving sub-circuit 211A2 are comprehensively considered, so that the space occupied by the first gate driving sub-circuit 211A1 is relatively close to the space occupied by the second gate driving sub-circuit 211A2.

In some embodiments, referring to FIG. 4C, the first gate driving sub-circuit 211A1 further comprises a first clock signal line CK configured to receive a first clock signal, and a second clock signal line CB configured to receive a second clock signal, a first power line VGL configured to receive a first power voltage, and a second power line VGH configured to receive a second power voltage. The second gate driving sub-circuit 211A2 further comprises a third clock signal line CK' configured to receive the first clock signal, a fourth clock signal line CB' configured to receive the second clock signal, and a fourth power line VGH' configured to receive the second power voltage. For example, the first power voltage is smaller than the second power voltage.

As some implementations, the first power line VGL is located on one side of the first group of transistors GT1 close to the second gate driving sub-circuit 211A2, the second power line VGH is located on one side of the first group of transistors GT1 away from the second gate driving sub-circuit 211A2, the first clock signal line CK and the second clock signal line CB are located on one side of the second power line VGH away from the second gate driving sub-circuit 211A2, the fourth power line VGH' is located on one side of the second group of transistors GT2 and the second capacitor C2 away from the first gate driving sub-circuit 211A1, the third clock signal line CK' and the fourth clock signal line CB' are located on one side of the second group of transistors GT2 and the second capacitor C2 close to the first gate driving sub-circuit 211A1.

Figure 6:
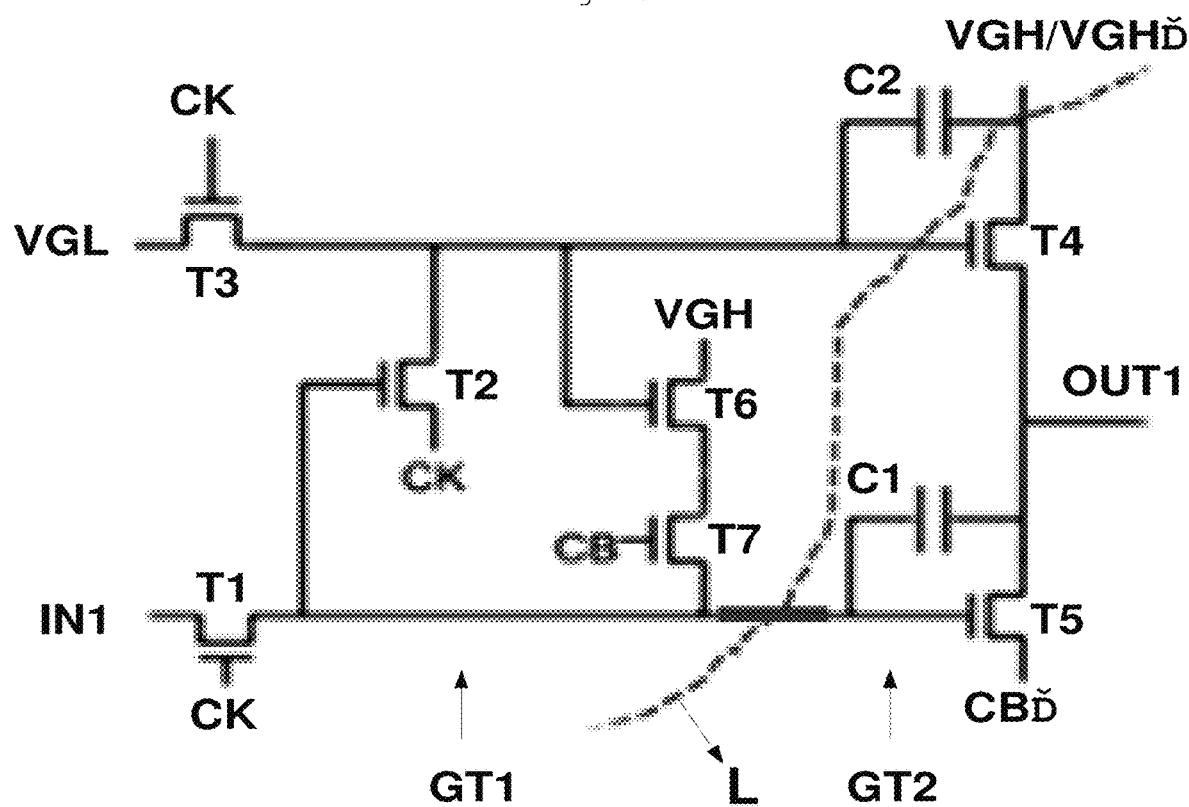
FIG. 6 is a schematic circuit view showing a gate driving unit according to an embodiment of the present disclosure.

FIG. 6 is a schematic circuit view showing a gate driving unit according to an embodiment of the present disclosure.

Some implementations of the first group of transistors GT1 and the second group of transistors GT2 will be introduced below in conjunction with FIG. 6.

Referring to FIG. 6, the first group of transistors GT1 is located on the left side of the line L, and the second group of transistors GT2 is located on the right side of the line L. For example, the first group of transistors GT1 comprises a first transistor T1, a second transistor T2, a third transistor T3, a sixth transistor T6, and a seventh transistor T7. For example, the second group of transistors GT2 comprises a fourth transistor T4 and a fifth transistor T5.

Each transistor in the first group of transistors GT1 and the second group of transistors GT2 comprises a gate and an active layer. Here, the active layer comprises a first electrode area, a second electrode area, and a channel located between the first electrode area and the second electrode area. It should be understood that, an area of the active layer of each transistor covered by the gate is the channel, and areas not covered by the gate comprises the first electrode area and the second electrode area. As some implementations, the material of the active layer may comprise polysilicon, such as low temperature polysilicon (LTPS). For example, the first transistor T1 comprises a gate T10 and an active layer comprising a first electrode area T11, a second electrode area T12, and a channel T13 between the first electrode area T11 and the second electrode area T12, and so forth. The active layers of the transistors T2-T7 sequentially comprise a channel T23, a channel T33, a channel T43, a channel T53, a channel T63, and a channel T73.

Referring to FIGS. 5A and 4A-4C, the gate T10 of the first transistor T1 is electrically connected to the first clock signal line CK, and the first electrode area T11 of the first transistor T1 serves as the first input terminal IN1. For example, the first electrode area T11 of the first transistor T1 may be electrically connected to an input electrode 31 to receive the first input signal.

The gate T20 of the second transistor T2 is electrically connected to the second electrode area T12 of the first transistor T1, and the first electrode area T21 of the second transistor T2 is electrically connected to the gate of the first transistor T1. For example, the gate T20 of the second transistor T2 is electrically connected to the second electrode area T12 of the first transistor T1 through a first connection electrode 41. For example, the first electrode area T21 of the second transistor T2 is electrically connected to the gate T10 of the first transistor T1 through a second connection electrode 42. It should be noted that, in the present disclosure, the expression that one member or area is connected to another member or area through a connection electrode may be understood that: one member or area is electrically connected to one end of the connection electrode through a via hole, and another member or area is electrically connected to the other end of the connection electrode through another via hole.

The gate of the third transistor T3 is electrically connected to the gate T10 of the first transistor T1, the first electrode area T31 of the third transistor T3 is electrically connected to the first power line VGL, and the second electrode area T32 of the third transistor T3 is electrically connected to the second electrode area T22 of the second transistor T2. For example, the gate T30 of the third transistor T3 and the gate T10 of the first transistor T1 are integrally provided.

The gate T60 of the sixth transistor T6 is electrically connected to the second electrode area T32 of the third transistor T3, and the first electrode area T61 of the sixth transistor T6 is electrically connected to the second power line VGH. For example, the gate T60 of the sixth transistor T6 is electrically connected to the second electrode area T32 of the third transistor T3 through a third connection electrode 43.

The gate T70 of the seventh transistor T7 is electrically connected to the second clock signal line CB, the first electrode area T71 of the seventh transistor T7 is electrically connected to the second electrode area T62 of the sixth transistor T6, and the second electrode area T72 of the seventh transistor T7 is electrically connected to the second electrode area T12 of the first transistor T1.

Referring to FIGS. 5B and 4A-4C, the gate T40 of the fourth transistor T4 is electrically connected to the gate T60 of the sixth transistor T6 through the second circuit connection line N2, and the first electrode area T41 of the fourth transistor T4 is electrically connected to the third power line VGL', and the second electrode area T42 of the fourth transistor T4 serve as the first output terminal OUT1. For example, the second electrode area T42 of the fourth transistor T4 may be electrically connected to the first gate line 131 through an output electrode 32 (refer to FIG. 4C). For example, the gate T40 of the fourth transistor T4 is electrically connected to the second circuit connection line N2 through a fourth connection electrode 44. For example, the first electrode area 41 of the fourth transistor T4 is electrically connected to the third power line VGL' through a fifth connection electrode 45.

The gate T50 of the fifth transistor T5 is electrically connected to the second electrode area T12 of the first transistor T1 through the first circuit connection line N1, the first electrode area T51 of the fifth transistor T5 is electrically connected to the output electrode 32, and the second electrode area T52 of the fifth transistor T5 is electrically connected to the third clock signal line CK'. For example, the gate T50 of the fifth transistor T5 is electrically connected to the first circuit connection line N1 through a sixth connection electrode 46. For example, the second electrode area of the fifth transistor T5 is electrically connected to the fourth clock signal line CB' through a seventh connection electrode 47.

The first electrode plate C11 of the first capacitor C1 is electrically connected to the gate T50 of the fifth transistor T5, and the second electrode plate C12 of the first capacitor C1 is electrically connected to the output electrode 32. For example, the first electrode plate C11 of the first capacitor C1 and the gate T50 of the fifth transistor T5 are integrally provided. The first electrode plate C21 of the second capacitor C2 is electrically connected to the gate T60 of the sixth transistor T6, and the second electrode plate C22 of the second capacitor C2 is electrically connected to the second power line VGH. For example, the first electrode plate C21 of the second capacitor C2 and the gate T60 of the sixth transistor T6 are integrally provided.

FIGS. 7A-7F are schematic views showing the layout of different layers in a gate driving unit according to other implementations of the present disclosure. FIG. 8A is an enlarged schematic view showing 211A1 shown in FIG. 7A. FIG. 8B is an enlarged schematic view showing 211A2 shown in FIG. 7A. FIG. 8C is an enlarged schematic view showing 211A3 shown in FIG. 7A.

Other splitting methods of the gate driving unit 211 of the gate driving circuit 21 will be introduced below in conjunction with FIGS. 7A-7F and FIGS. 8A-8C.

Figure 7A:
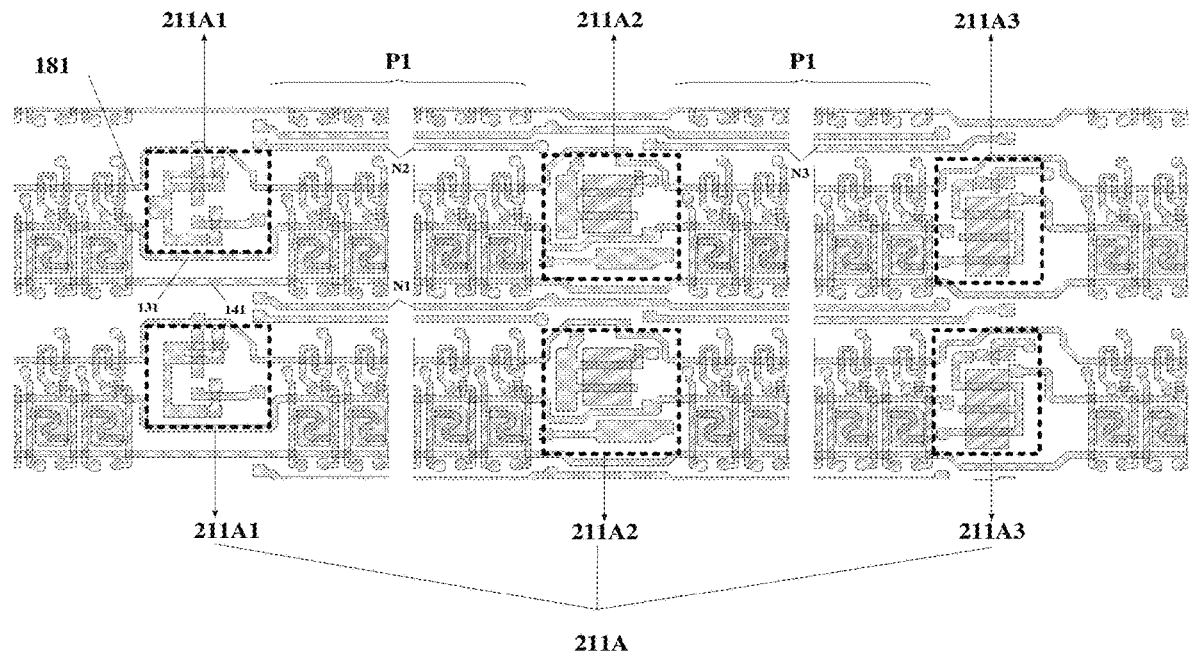
FIGS. 7A-7F are schematic views showing the layout of different layers in a gate driving unit according to other implementations of the present disclosure.
Figure 7B:
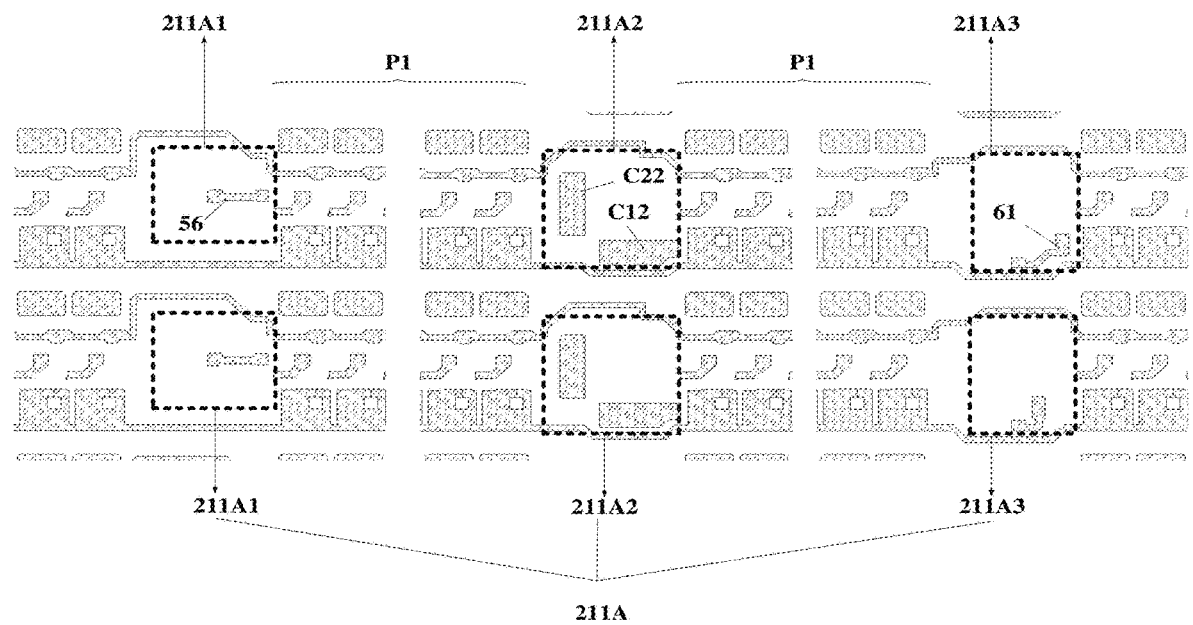
Figure 8A:
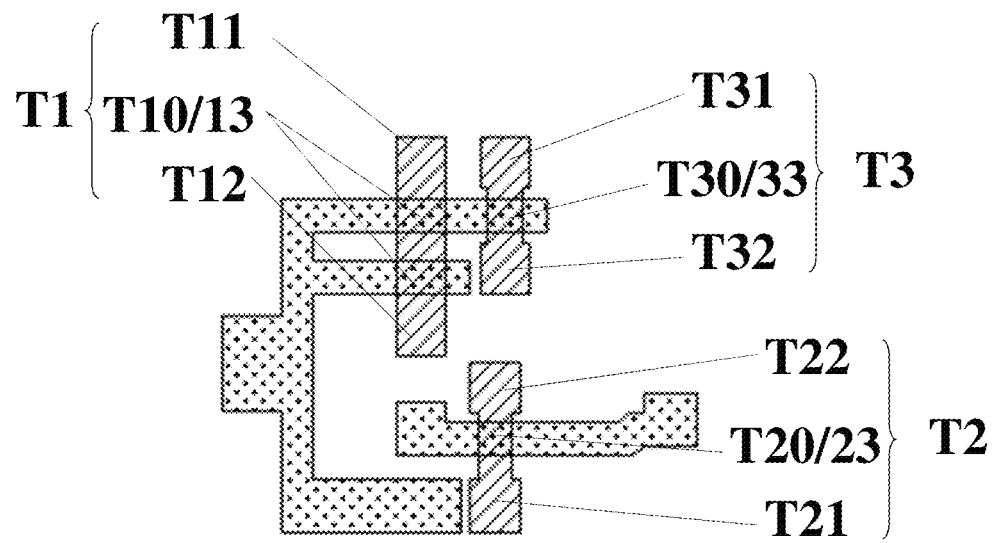
FIG. 8A is an enlarged schematic view showing 211A1 shown in FIG. 7A.
Figure 8B:
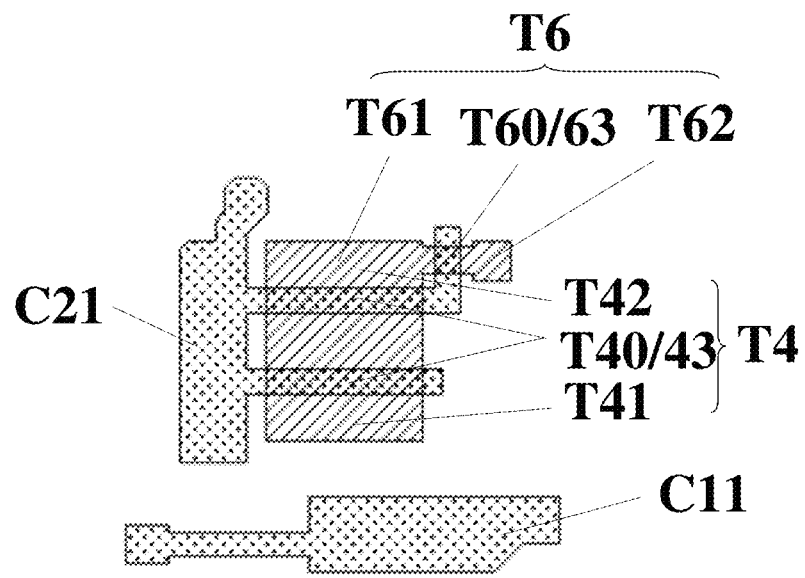
FIG. 8B is an enlarged schematic view showing 211A2 shown in FIG. 7A.
Figure 8C:
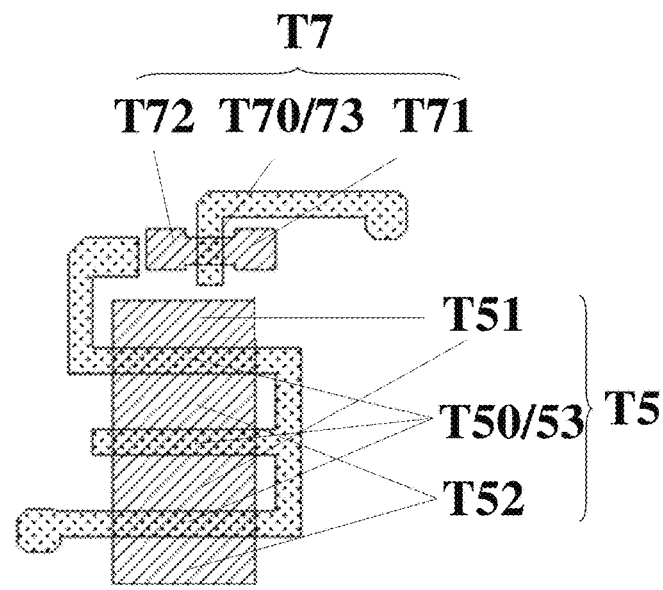
FIG. 8C is an enlarged schematic view showing 211A3 shown in FIG. 7A.

In some embodiments, referring to FIG. 7A, the first group of circuit connection lines comprises a first circuit connection line N1, a second circuit connection line N2 and a third circuit connection line N3. Orthographic projections of the third circuit connection line N3 and the second circuit connection line N2 on the base substrate 11 do not overlap with orthographic projections of the pixel driving circuits 122 of the first group of sub-pixels P1 on the base substrate 11, and an orthographic projection of the first circuit connection line N1 on the base substrate 11 overlaps with the orthographic projections of the pixel driving circuits 122 of the first group of sub-pixels P1 on the base substrate 11. It should be understood that, the orthographic projections of the third circuit connection line N3 and the second circuit connection line N2 on the base substrate 11 overlap with orthographic projections of the pixel driving circuits 122 of the first group of sub-pixels P1 located between the first gate driving sub-circuit 211A1 and the second gate driving sub-circuit 211A2 in a former stage gate driving unit 211 on the base substrate 11.

The plurality of gate driving sub-circuits 211A further comprises a third gate driving sub-circuit 211A3. The third gate driving sub-circuit 211A3 is located on one side of the second gate driving sub-circuit 211A2 away from the first gate driving sub-circuit 211A1. The third gate driving sub-circuit 211A3 is electrically connected to the second gate driving sub-circuit 211A2 through the third circuit connection line N3. In addition, the third gate driving sub-circuit 211A3 is electrically connected to the first gate driving sub-circuit 211A1 through the first circuit connection line N1. Here, the third gate driving sub-circuit 211A3 and the second gate driving sub-circuit 211A2 are spaced apart by another first group of sub-pixels P1.

In some embodiments, the first gate driving sub-circuit 211A1 comprises a third group of transistors GT3, a first clock signal line CK configured to receive a first clock signal, a second clock signal line CB configured to receive a second clock signal and a first power line VGL configured to receive a first power voltage. The second gate driving sub-circuit 211A2 comprises at least one capacitor, a fourth group of transistors GT4, and a second power line VGH configured to receive a second power voltage. The width-to-length ratio of the channel of one transistor in the fourth group of transistors GT4 is greater than the width-to-length ratio of the channel of each transistor in the third group of transistors GT3. The third gate driving sub-circuit 211A3 comprises a fifth group of transistors GT5, a third clock signal line CK' configured to receive the first clock signal, and the fourth clock signal line CB' configured to receive the second clock signal. The width-to-length ratio of the channel of one transistor in the five groups of transistors GT5 is greater than the width-to-length ratio of the channel of each transistor in the third group of transistors GT3.

As some implementations, the first power line VGL is located on one side of the third group of transistors GT3 close to the second gate driving sub-circuit 211A2. As some implementations, the first clock signal line CK and the second clock signal line CB are located on one side of the third group of transistors GT3 away from the second gate driving sub-circuit 211A2. As some implementations, the third clock signal line CK' and the fourth clock signal line CB' are located on one side of the fifth group of transistors GT5 away from the second gate driving sub-circuit 211A2.

Figure 9:
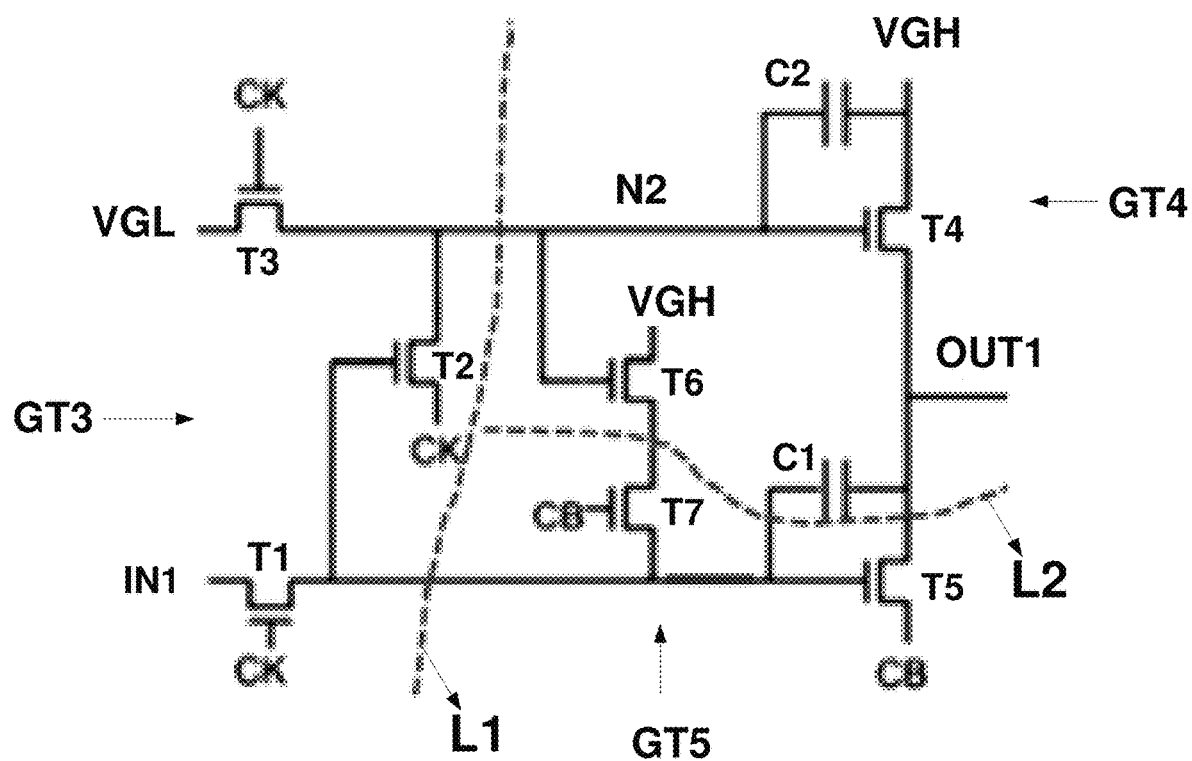
FIG. 9 is a schematic circuit view showing a gate driving unit according to another embodiment of the present disclosure.

FIG. 9 is a schematic circuit view showing a gate driving unit according to another embodiment of the present disclosure.

Some implementations of at least one capacitor of the second gate driving sub-circuit 211A2, the third group of transistors GT3, the fourth group of transistors GT4, and the fifth group of transistors GT5 will be introduced below in conjunction with FIG. 9.

Referring to FIG. 9, the third group of transistors GT3 are located on the left side of line L1, the fourth group of transistors GT4 are located on the right side of line L1 and the upper side of line L2, and the fifth group of transistors GT5 are located on the right side of line L1 and the lower side of the line L2. For example, the third group of transistors GT3 comprises a first transistor T1, a second transistor T2, and a third transistor T3. For example, the fourth group of transistors GT4 comprises a fourth transistor T4 and a sixth transistor T6. For example, the fifth group of transistors GT5 comprises a fifth transistor T5 and a seventh transistor T7. For example, at least one capacitor of the second gate driving sub-circuit 211A2 comprises a first capacitor C1 and a second capacitor C2.

Each transistor in the third group of transistors GT3, the fourth group of transistors GT4, and the fifth group of transistors GT5 comprises a gate and an active layer. Here, the active layer comprises a first electrode area, a second electrode area, and a channel located between the first electrode area and the second electrode area. As some implementations, the material of the active layer may comprise, for example, polysilicon, such as low-temperature polysilicon. For example, the first transistor T1 comprises a gate T10 and an active layer comprising a first electrode area T11, a second electrode area T12, and a channel T13 between the first electrode area T11 and the second electrode area T12, and so forth. The active layers of the transistors T2-T7 sequentially comprise a channel T23, a channel T33, a channel T43, a channel T53, a channel T63, and a channel T73.

Referring to FIG. 8A, the gate T10 of the first transistor T1 is electrically connected to the first clock signal line CK, and the first electrode area T11 of the first transistor T1 serves as the first input terminal IN1. For example, the first electrode area T11 of the first transistor T1 may be electrically connected to the input electrode 31 to receive the first input signal.

The gate T20 of the second transistor T2 is electrically connected to the second electrode area T12 of the first transistor T1, and the first electrode area T21 of the second transistor T2 is electrically connected to the gate T10 of the first transistor T1. For example, the gate T20 of the second transistor T2 is electrically connected to the second electrode area T12 of the first transistor T1 through a connection electrode 51 shown in FIG. 7C, and the first electrode area T21 of the second transistor T2 is electrically connected to the gate T10 of the first transistor T1 through a connection electrode 52 shown in FIG. 7C.

The gate T30 of the third transistor T3 is electrically connected to the gate T10 of the first transistor T1, the first electrode area T31 of the third transistor T3 is electrically connected to the first power line VGL, and the second electrode area T32 of the third transistor T3 is electrically connected to the second electrode area T22 of the second transistor T2. For example, the gate T30 of the third transistor T3 and the gate T10 of the first transistor T1 are integrally provided. For example, the second electrode area T32 of the third transistor T3 is electrically connected to the second electrode area T22 of the second transistor T2 through a connection electrode 53 shown in FIG. 7C.

Referring to FIG. 8B, the gate of the fourth transistor T4 is electrically connected to the second electrode area T22 of the second transistor T2 through the second circuit connection line N2, the first electrode area T41 of the fourth transistor T4 is electrically connected to the second power line VGH, and the second electrode area T42 of the fourth transistor T4 is electrically connected to the first gate line 131 through a first output electrode 32. For example, the gate of the fourth transistor T4 is electrically connected to the second circuit connection line N2 through a connection electrode 54 shown in FIG. 7C, and the second circuit connection line N2 is electrically connected to the second electrode area T21 of the second transistor T2 through a connection electrode 55 shown in FIG. 7C and a connection electrode 56 shown in FIG. 7B.

The gate T60 of the sixth transistor T6 is electrically connected to the gate T40 of the fourth transistor T4, and the first electrode area T61 of the sixth transistor T6 is electrically connected to the second power line VGH. For example, the gate T60 of the sixth transistor T6 and the gate T40 of the fourth transistor T4 are integrally provided. For example, the first electrode area T61 of the sixth transistor T6 is electrically connected to the second power line VGH through a via hole.

The first electrode plate C11 of the first capacitor C1 is electrically connected to the gate T20 of the second transistor T2 through the first circuit connection line N1, and the second electrode plate C12 of the first capacitor C1 is electrically connected to the first output electrode 32. For example, the first electrode plate C11 of the first capacitor C1 is electrically connected to the first circuit connection line N1 through a connection electrode 57 shown in FIG. 7C, and the first circuit connection line N1 is electrically connected to the gate T20 of the second transistor T2 through a connection electrode 58 shown in FIG. 7C. For example, the second electrode plate C12 of the first capacitor C1 is electrically connected to the first output electrode 32 through a via hole.

The first electrode plate C21 of the second capacitor C2 is electrically connected to the gate T40 of the fourth transistor T4, and the second electrode plate C22 of the second capacitor C2 is electrically connected to the second power line VGH. For example, the first electrode plate C21 of the second capacitor C2 and the gate T40 of the fourth transistor T4 are integrally provided. For example, the second electrode plate C22 of the second capacitor C2 is electrically connected to the second power line VGH through a via hole.

Referring to FIG. 8C, the gate T50 of the fifth transistor T5 is electrically connected to the gate T20 of the second transistor T2 through the first circuit connection line N1, the first electrode area T51 of the fifth transistor T5 is electrically connected to a second output electrode 32', and the second electrode area T52 of the fifth transistor T5 is electrically connected to the fourth clock signal line CB'. For example, the gate T50 of the fifth transistor T5 is electrically connected to the first circuit connection line N1 through a connection electrode 59 shown in FIG. 7C. For example, the second electrode area T52 of the fifth transistor T5 is electrically connected to the fourth clock signal line CB' through a connection electrode 60 shown in FIG. 7C and a connection electrode 61 shown in FIG. 7B.

The gate T70 of the seventh transistor T7 is electrically connected to the fourth clock signal line CB', and the first electrode area T71 of the seventh transistor T7 is electrically connected to the second electrode area T62 of the sixth transistor T6 through the third circuit connection line N3, and the second electrode area T72 of the seventh transistor T7 is electrically connected to the gate T50 of the fifth transistor T5. For example, the first electrode T71 area of the seventh transistor T7 is electrically connected to the third circuit connection line N3 through a connection electrode 62 shown in FIG. 7C, and the second electrode area T72 of the seventh transistor T7 is electrically connected to the gate T50 of the fifth transistor T5 through a connection electrode 63 shown in FIG. 7C.

One of the second electrode area T42 of the fourth transistor T4 and the first electrode area T51 of the fifth transistor T5 in FIG. 8A may serve as the first output terminal OUT1 shown in FIG. 9.

The light-emitting control driving unit 221 of the light-emitting control driving circuit 22 may also be split in different methods to obtain a plurality of corresponding light-emitting control driving sub-circuits 221A, which will be introduced below in conjunction with different embodiments.

FIGS. 10A-10F are schematic views showing the layout of different layers in a light-emitting control driving unit according to some implementations of the present disclosure. FIG. 11A is an enlarged schematic view showing 221A2 shown in FIG. 10A. FIG. 11B is an enlarged schematic view showing 221A1 shown in FIG. 10A.

Some splitting methods of the light-emitting control driving unit 221 of the light-emitting control driving circuit 22 will be introduced below in conjunction with FIGS. 10A-10F and FIGS. 11A-11B.

Figure 10A:
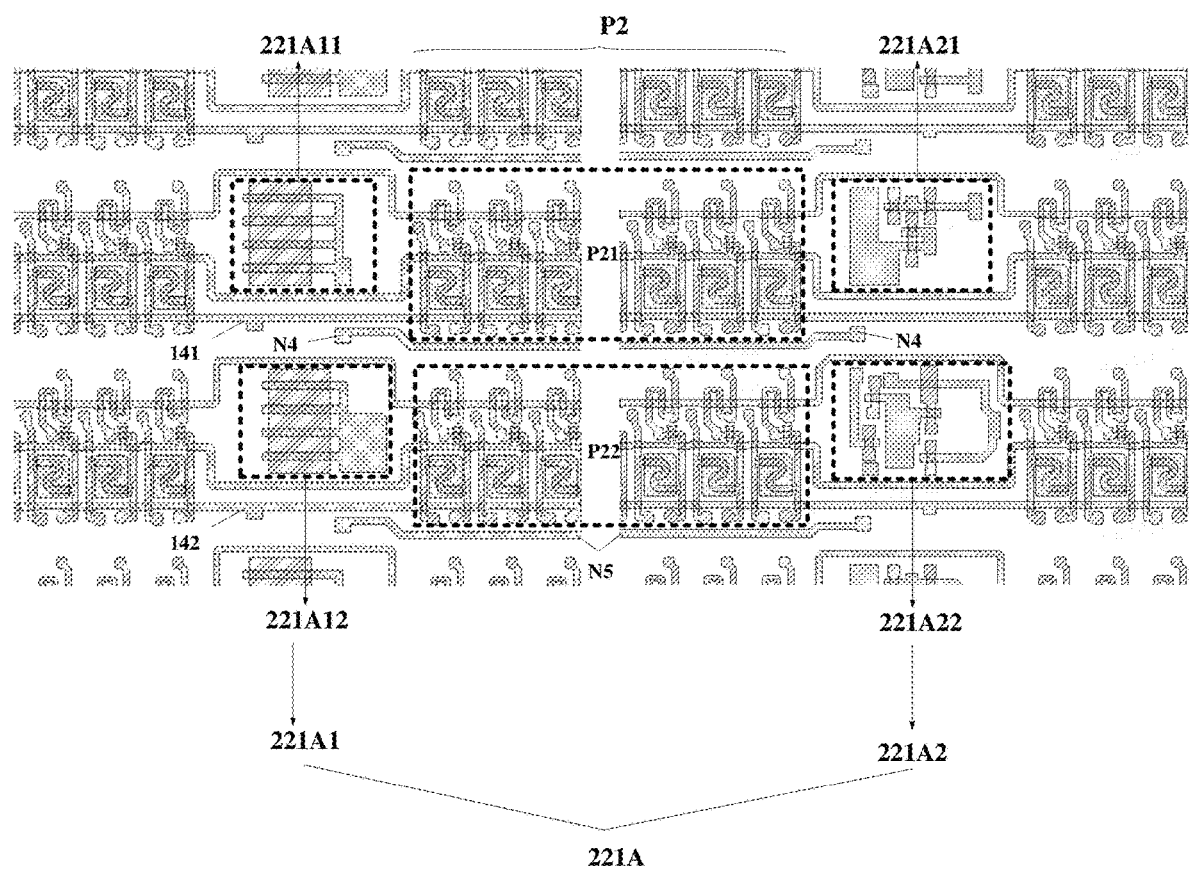
FIGS. 10A-10F are schematic views showing the layout of different layers in a light-emitting control driving unit according to some implementations of the present disclosure.
Figure 10B:
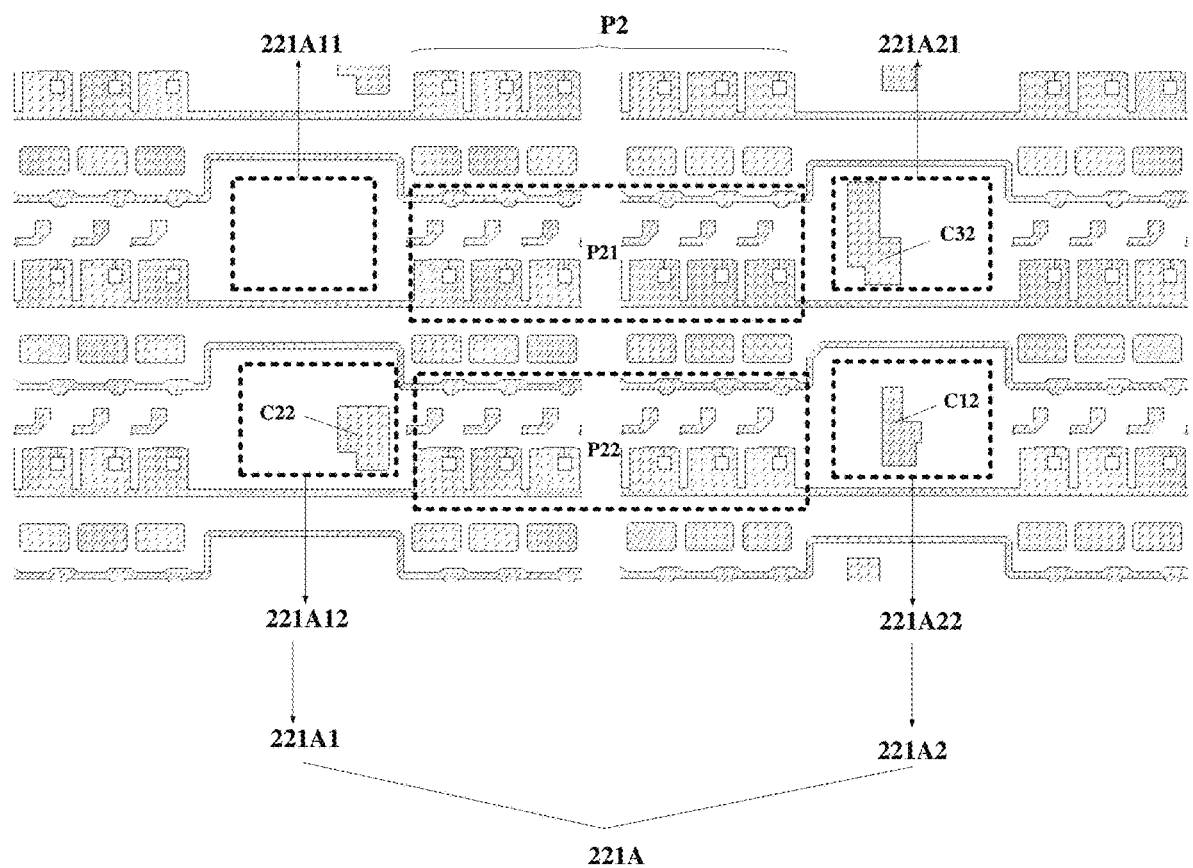
Figure 11A:
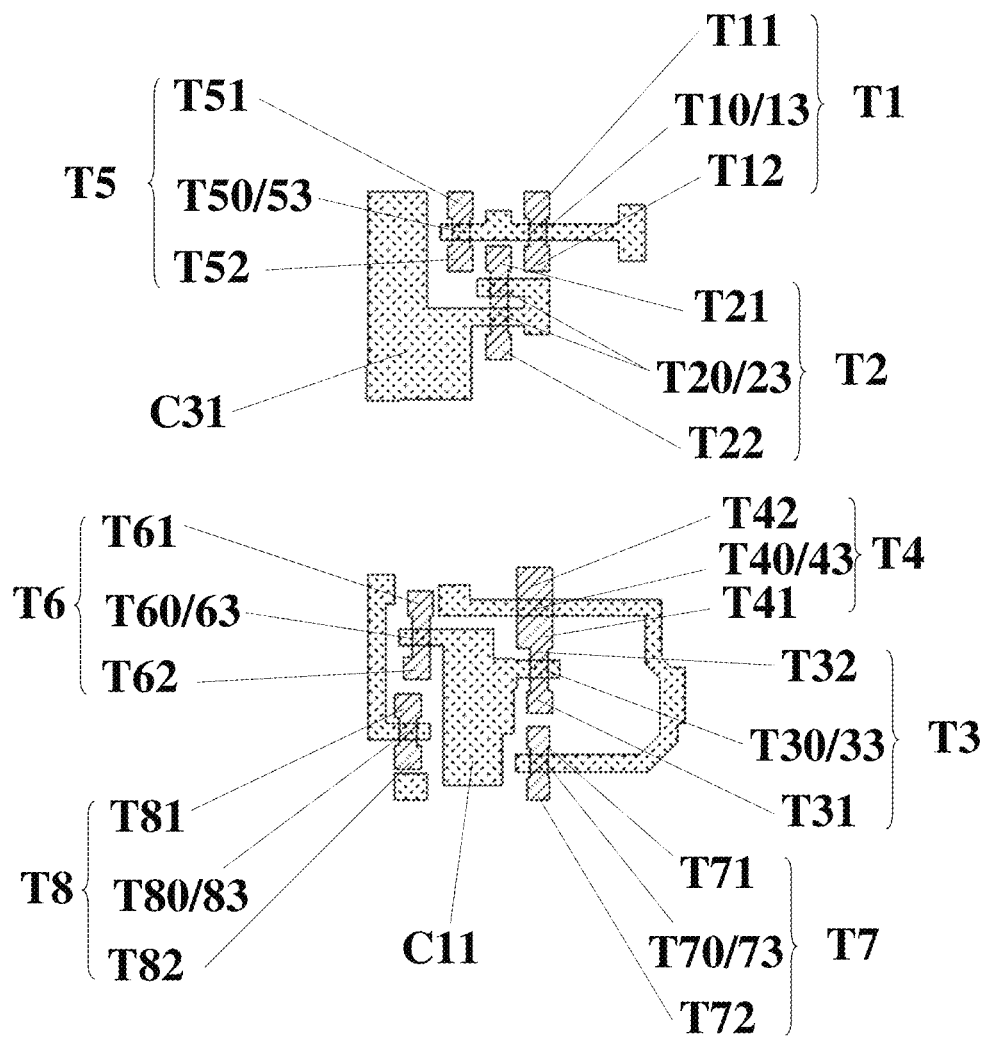
FIG. 11A is an enlarged schematic view showing 221A2 shown in FIG. 10A.
Figure 11B:
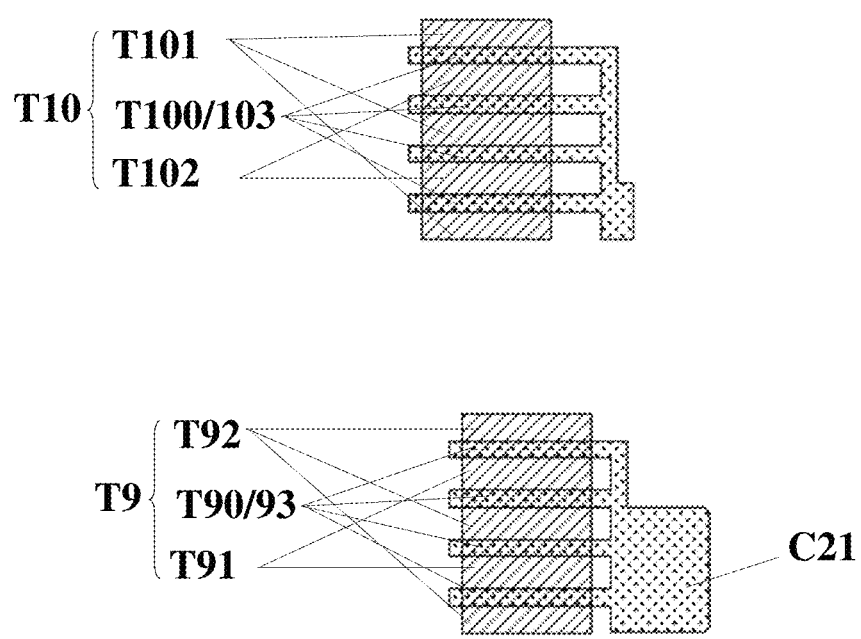
FIG. 11B is an enlarged schematic view showing 221A1 shown in FIG. 10A.

In some embodiments, referring to FIG. 10A, the second group of sub-pixels P2 comprises a plurality of first sub-pixels P21 and a plurality of second sub-pixels P22. The plurality of first sub-pixels P21 is electrically connected to the first light-emitting control line 141 of the plurality of light-emitting control lines 14, and the plurality of second sub-pixels P22 is electrically connected to the second light-emitting control line 142 of the plurality of light-emitting control lines 14. The first light-emitting control driving sub-circuit 221A1 of each light-emitting control driving unit 221 in the one or more stages light-emitting control driving units 221 comprises a second input terminal IN2 of each light-emitting control driving unit 221. The second input terminal IN2 is configured to receive a second input signal. The second light-emitting control driving sub-circuit 221A2 of each light-emitting control driving unit 221 in the one or more stages light-emitting control driving units 221 comprises a second output terminal OUT2 of each light-emitting control driving unit 221. The second output terminal OUT2 is configured to output light-emitting control signals to the first light-emitting control line 141 and the second light-emitting control line 142.

Figure 10C:
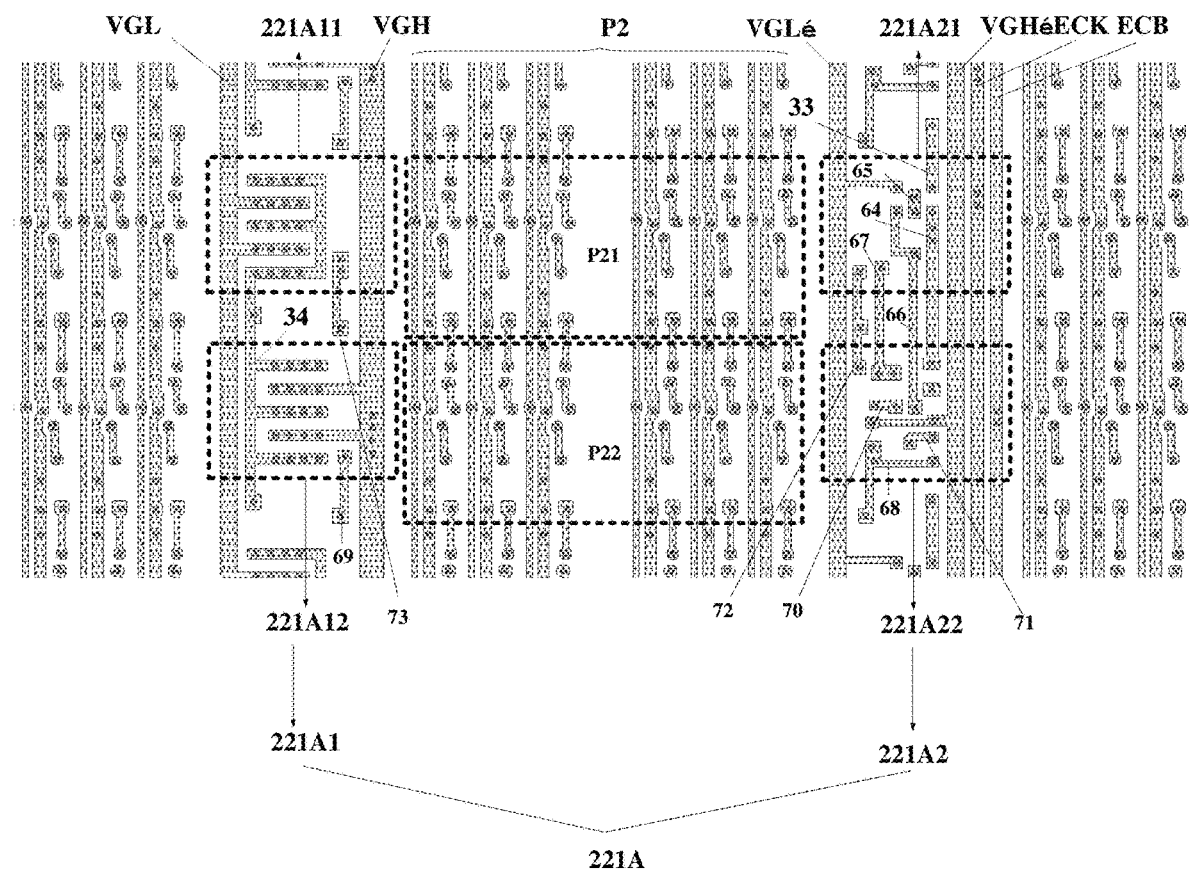
Figure 10D:
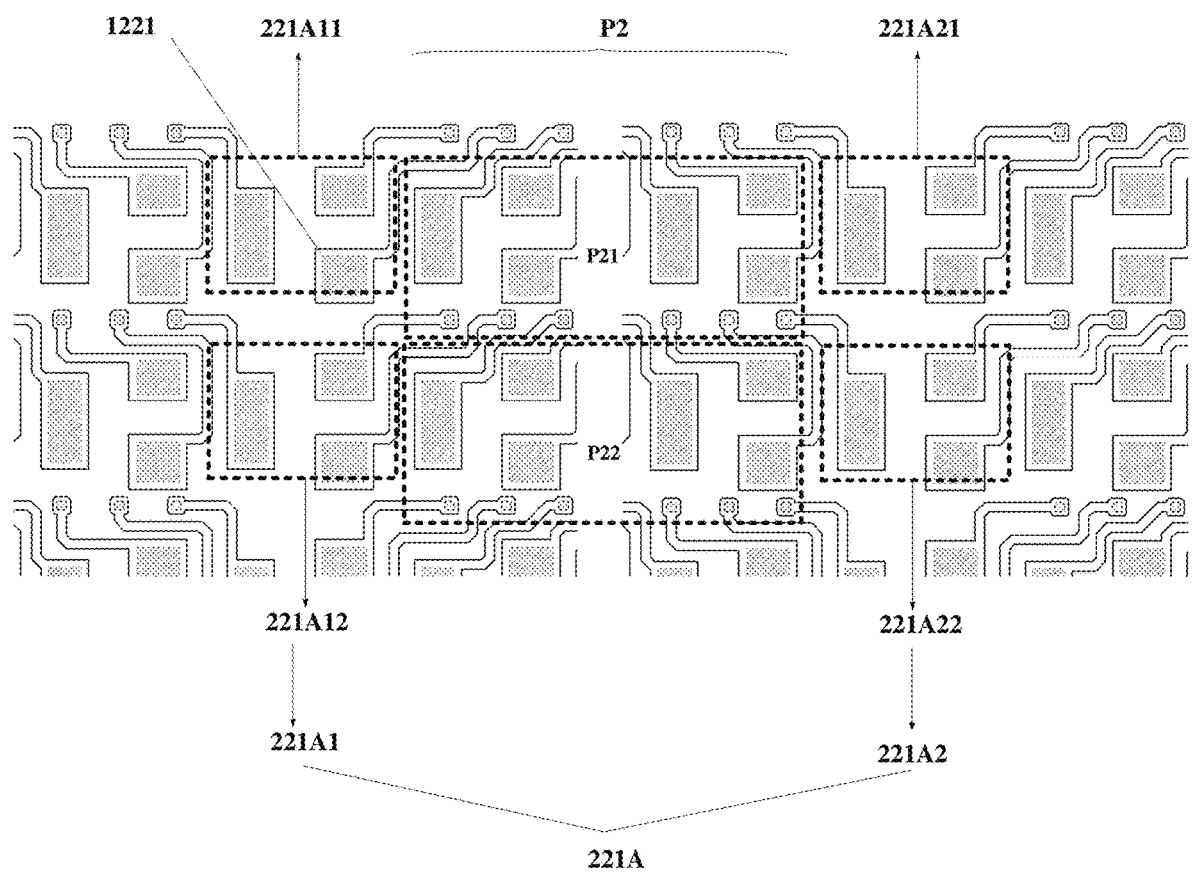
Figure 10E:
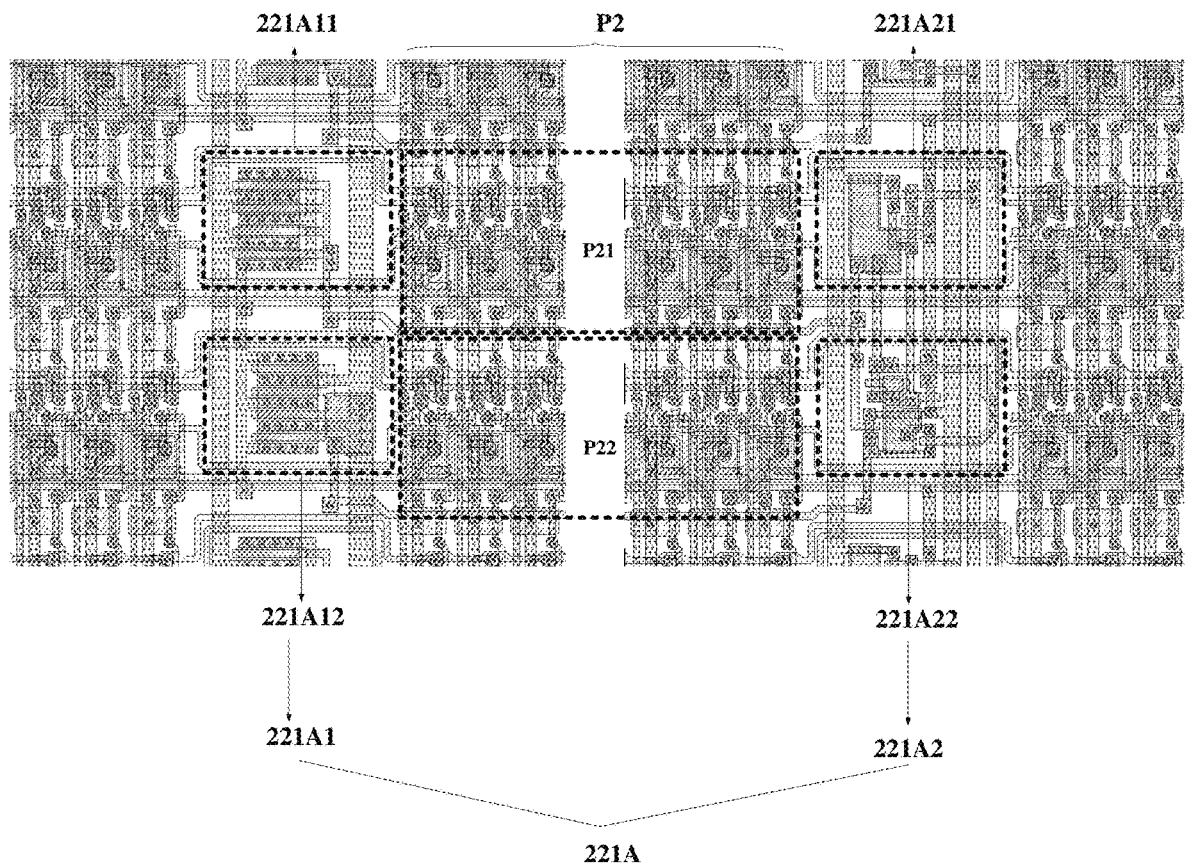
Figure 10F:
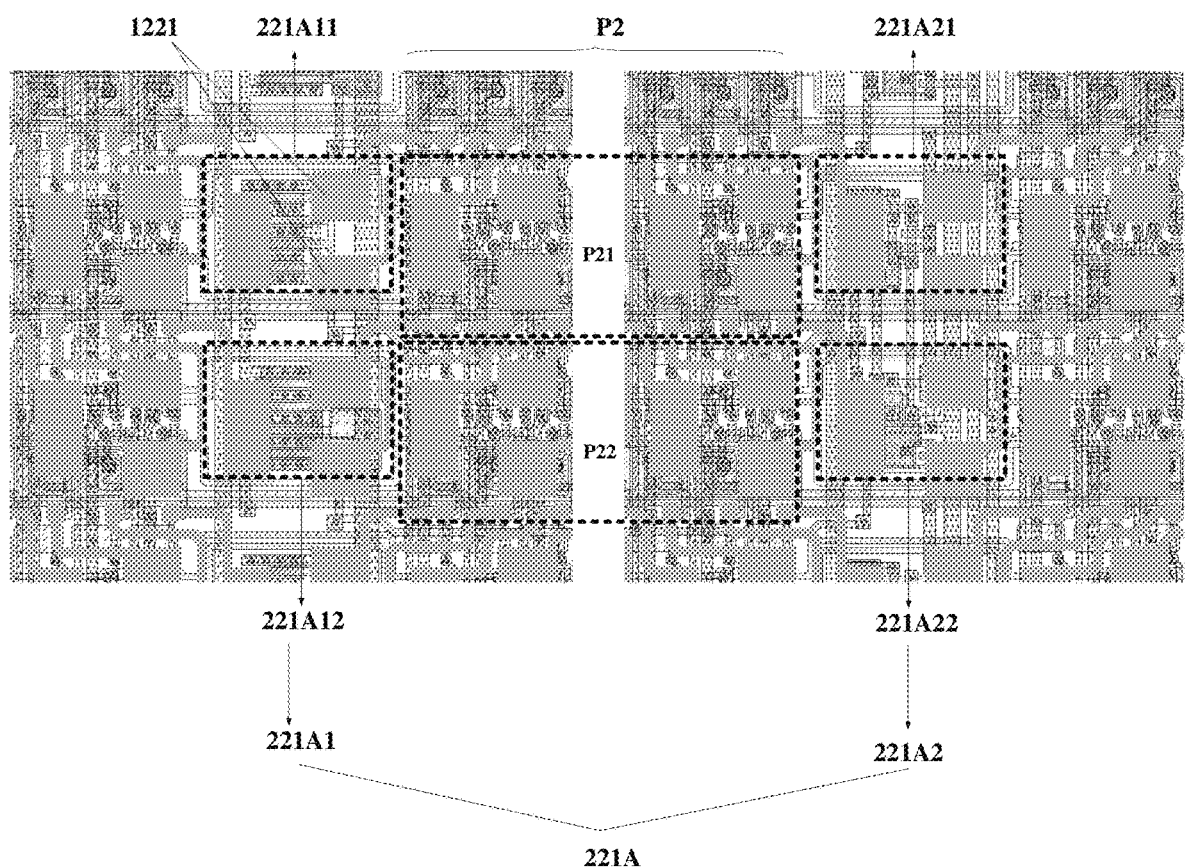

In some embodiments, referring to FIG. 10F, an orthographic projection of at least one of the plurality of light-emitting control driving sub-circuits 221A on the base substrate 11 overlaps with orthographic projections of anodes 1211 of light-emitting elements 121 of a second portion of sub-pixels 12 of the plurality of sub-pixels 12 on the base substrate 11, and does not overlap orthographic projections of anodes 1211 of light-emitting elements 121 of the remaining sub-pixels of the plurality of sub-pixels 12 on the base substrate 11 other than the second portion of sub-pixels 12. In this way, it is possible to reduce the frame size of the display panel without affecting the display uniformity as much as possible.

In some embodiments, referring to FIGS. 10A-10F, any one stage light-emitting control driving unit 221 of the multistage light-emitting control driving units 221 comprises a plurality of light-emitting control driving sub-circuits 221A, and the first light-emitting control driving sub-circuit 221A1 and the second light-emitting control driving sub-circuit 221A2 are spaced apart by the pixel driving circuits 122 of the second group of sub-pixels P2 in a first direction. The first light-emitting control driving sub-circuit 221A1 in the any one stage light-emitting control driving unit 221 is located between the first light-emitting control driving sub-circuit 221A1 in a former stage light-emitting control driving unit 221 of the any one stage light-emitting control driving unit 221 and the first light-emitting control driving sub-circuit 221A1 in a latter stage light-emitting control driving unit 221 of the any one stage light-emitting control driving unit 221 in a second direction different from the first direction. The second light-emitting control driving sub-circuit 221A2 in the anyone stage light-emitting control driving unit 221 is located between the second light-emitting control driving sub-circuit 221A2 in the former stage light-emitting control driving unit 221 of the any one stage light-emitting control driving unit 221 and the second light-emitting control driving sub-circuit 221A2 in the latter stage light-emitting control driving unit 221 of the any one stage light-emitting control driving unit 221 in the second direction different. For example, the second direction is perpendicular to the first direction.

In some embodiments, the display panel further comprises a second group of circuit connection lines. Referring to FIG. 10A, the second group of circuit connection lines comprises a fourth circuit connection line N4 and a fifth circuit connection line N5. The second light-emitting control driving sub-circuit 221A2 is electrically connected to the first light-emitting control driving sub-circuit 221A1 through the fourth circuit connection line N4 and the fifth circuit connection line N5. Here, orthographic projections of the fourth circuit connection line N4 and the fifth circuit connection line N5 on the base substrate 11 overlap with orthographic projections of pixel driving circuits 122 of the second group of sub-pixels P2 on the base substrate 11.

In some embodiments, the first light-emitting control driving sub-circuit 221A1 comprises a first group of transistors GT1, a second capacitor C2, a first power line VGL configured to receive a first power voltage, and a second power line VGH configured to receive a second power voltage. The second light-emitting control driving sub-circuit 221A2 comprises a second group of transistors GT2, a first capacitor C1, a third capacitor C3, a first clock signal line ECK configured to receive the first clock signal, and a second clock signal line ECB configured to receive the second clock signal. Here, the number of the first group of transistors GT1 is smaller than the number of the second group of transistors GT2, and the width-to-length ratio of the channel of at least one transistor in the first group of transistors GT1 is greater than the width-to-length ratio of the channel of each transistor in the second group of transistors GT2. In some embodiments, the width-to-length ratio of the channel of each transistor in the first group of transistors GT1 is greater than the width-to-length ratio of the channel of each transistor in the second group of transistors GT2.

In the above embodiments, the number and sizes of transistors in the first light-emitting control driving sub-circuit 221A1 and the second light-emitting control driving sub-circuit 221A2 are comprehensively considered, so that the space occupied by the first light-emitting control driving sub-circuit 221A1 is relatively close to the space occupied by the second light-emitting control driving sub-circuit 221A2.

In some embodiments, the second light-emitting control driving sub-circuit 221A2 may further comprise power lines configured to receive the first power voltage and the second power voltage. For example, referring to FIG. 10C, the second light-emitting control driving sub-circuit 221A2 may further comprise a third power line VGL' configured to receive the first power voltage and a fourth power line VGH' configured to receive the second power voltage. In other embodiments, the second light-emitting control driving sub-circuit 221A2 may not comprise the power lines configured to receive the first power voltage and the second power voltage. In this case, the second light-emitting control driving sub-circuit 221A2 may be electrically connected to the first power line VGL and the second power line VGH in the first light-emitting control driving sub-circuit 221A1 through a circuit connection line.

In some embodiments, referring to FIG. 10A, the first light-emitting control driving sub-circuit 221A1 comprises a first sub-circuit 221A11 and a second sub-circuit 221A12, and the second light-emitting control driving sub-circuit 221A2 comprises a third sub-circuit 221A21 and a fourth sub-circuit 221A22.

Some implementations of the first sub-circuit 221A11, the second sub-circuit 221A12, the third sub-circuit 221A21, and the fourth sub-circuit 221A22 will be introduced below.

In some implementations, the first sub-circuit 221A11 is located on one side of the first light-emitting control line 141 away from the second light-emitting control line 142, and the second sub-circuit 221A12 is located between the first light-emitting control line 141 and the second light-emitting control line 142. The first sub-circuit 221A11 comprises a first sub-group of transistors GT11 which comprises at least one transistor in the first group of transistors GT1. The second sub-circuit 221A12 comprises a second sub-group of transistors GT12 and a second capacitor C2, and the second sub-group of transistors GT12 comprises other transistors in the first group of transistors GT1 other than the first sub-group of transistors GT11.

In some implementations, the third sub-circuit 221A21 is located on one side of the first light-emitting control line 141 away from the second light-emitting control line 142, and electrically connected to the first sub-circuit 221A11 through the fourth circuit connection line N4. The fourth sub-circuit 221A22 is located between the first light-emitting control line 141 and the second light-emitting control line 142, and electrically connected to the second sub-circuit 221A12 through the fifth circuit connection line N5. The third sub-circuit 221A21 comprises a third sub-group of transistors GT21 which comprises at least one transistor in the second group of transistors GT2. The fourth sub-circuit 221A22 comprises a fourth sub-group of transistors GT22 and a first capacitor C1, and the fourth sub-group of transistors GT22 comprises other transistors in the second group of transistors GT2 other than the first sub-group of transistors GT11.

According to different embodiments of the present disclosure, one of the third sub-circuit 221A21 and the fourth sub-circuit 221A22 further comprises a third capacitor C3, which will be made below in conjunction with different embodiments.

Figure 12:
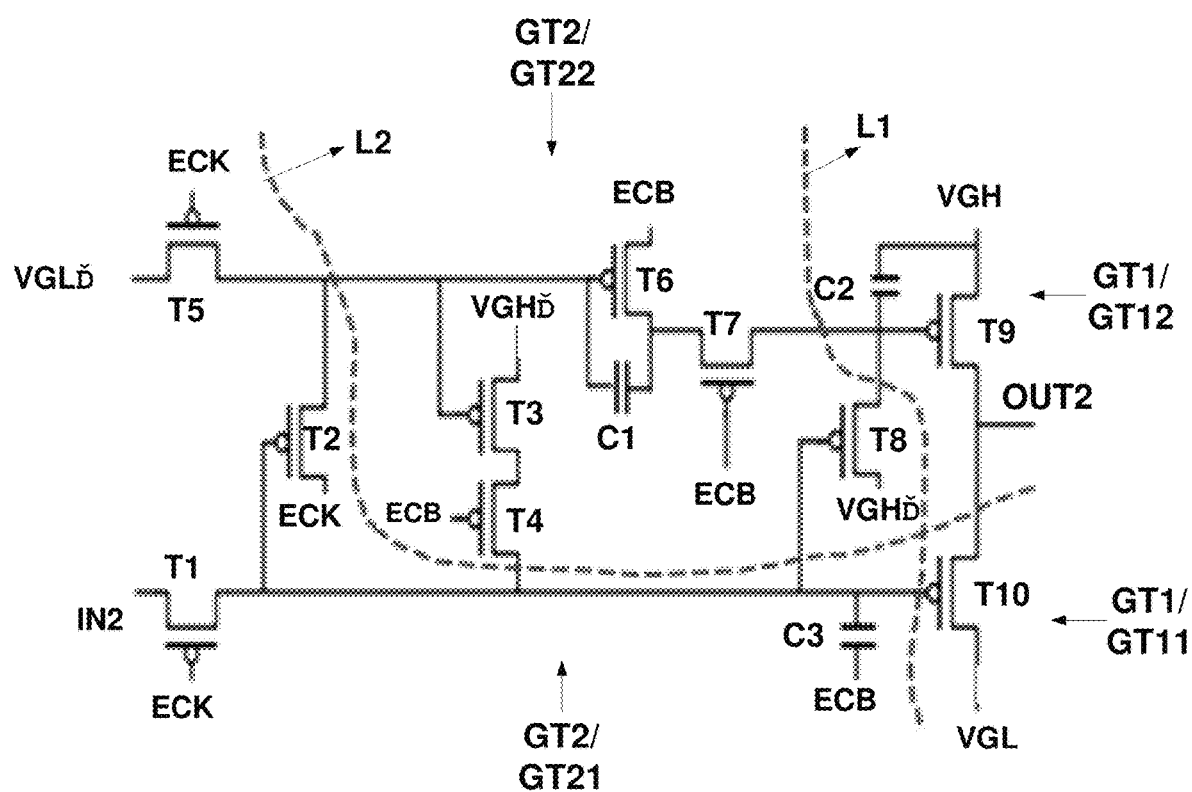
FIG. 12 is a schematic circuit view showing a light-emitting control driving unit according to an embodiment of the present disclosure.

FIG. 12 is a schematic circuit view showing a light-emitting control driving unit according to an embodiment of the present disclosure.

Some implementations of the first group of transistors GT1 and the second group of transistors GT2 will be introduced below in conjunction with FIG. 12, FIG. 10A-10F, and FIG. 11A-FIG. 11B. In these implementations, the third sub-circuit 221A21 further comprises a third capacitor C3. In addition, the second light-emitting control driving sub-circuit 221A2 further comprises a third power line VGL' configured to receive the first power voltage and a fourth power line VGH' configured to receive the second power voltage.

Referring to FIG. 12, the second group of transistors GT2 is located on the left side of the line L1, and the first group of transistors GT1 is located on the right side of the line L1. The second group of transistors GT2 comprises a first transistor T1, a second transistor T2, a third transistor T3, a fourth transistor T4, a fifth transistor T5, a sixth transistor T6, a seventh transistor T7, and an eighth transistor T8. The first group of transistors GT1 comprises a ninth transistor T9 and a tenth transistor T10.

The first sub-group of transistors GT11 is located on the right side of line L1 and the lower side of line L2, the second sub-group of transistors GT12 is located on the right side of line L1 and the upper side of line L2, the third sub-group of transistors GT21 is located on the left side of line L1 and the left side of the line L2, and the fourth sub-group transistor GT22 is located on the left side of the line L1 and on the right side of the line L2. The first sub-group of transistors GT11 comprises a tenth transistor T10, the second sub-group of transistors GT12 comprises a ninth transistor T9, the third sub-group of transistors GT21 comprises a first transistor T1, a second transistor T2, and a fifth transistor T5, and the fourth subgroup of transistors GT22 comprises a third transistor T3, a fourth transistor T4, a sixth transistor T6, a seventh transistor T7, and an eighth transistor T8.

Each transistor in the first group of transistors GT1 and the second group of transistors GT1 comprises a gate and an active layer. The active layer comprises a first electrode area, a second electrode area, and a channel located between the first electrode area and the second electrode area. The material of the active layer may comprise, for example, polysilicon, such as low-temperature polysilicon. For example, the first transistor T1 comprises a gate T10 and an active layer which comprises a first electrode area T11, a second electrode area T12, and a channel T13 between the first electrode area T11 and the second electrode area T12, and so forth. The active layers of the transistors T2-T10 sequentially comprises a channel T23, a channel T33, a channel T43, a channel T53, a channel T63, a channel T73, a channel T83, a channel T93, and a channel T103.

The gate T10 of the first transistor T1 is electrically connected to the first clock signal line CK, and the first electrode area T11 of the first transistor T1 serves as the second input terminal IN2. For example, the first electrode area T11 of the first transistor T1 may be electrically connected to the second input electrode 33 to receive a second input signal.

The gate T20 of the second transistor T2 is electrically connected to the second electrode area T12 of the first transistor T1, and the first electrode area T21 of the second transistor T2 is electrically connected to the gate T10 of the first transistor T1. The gate T20 of the second transistor T2 is electrically connected to the second electrode area T12 of the first transistor T1 through a connection electrode 64 shown in FIG. 10C. For example, the first electrode area T21 of the second transistor T2 is electrically connected to the gate T10 of the first transistor T1 through a connection electrode 65 shown in FIG. 10C.

The gate T30 of the third transistor T3 is electrically connected to the second electrode area T22 of the second transistor T2, and the first electrode area T31 of the third transistor T3 is electrically connected to the fourth power line VGH'. For example, the gate T30 of the third transistor T3 is electrically connected to the second electrode area T22 of the second transistor T2 through a connection electrode 66 shown in FIG. 10C.

The gate T40 of the fourth transistor T4 is electrically connected to the second clock signal line ECB, the first electrode area T41 of the fourth transistor T4 is electrically connected to the second electrode area T32 of the third transistor T3, and the second electrode area T42 of the fourth transistor T4 is electrically connected to the gate T20 of the second transistor T2. For example, the second electrode area T42 of the fourth transistor T4 is electrically connected to the gate T20 of the second transistor T2 through a connection electrode 64 shown in FIG. 10C.

The gate T50 of the fifth transistor T5 is electrically connected to the gate T10 of the first transistor T1, the first electrode area T51 of the fifth transistor T5 is electrically connected to the third power line VGL', and the second electrode area T52 of the fifth transistor T5 is electrically connected to the second electrode area T22 of the second transistor T2. For example, the gate T50 of the fifth transistor T5 and the gate T10 of the first transistor T1 are integrally provided. For example, the second electrode area T52 of the fifth transistor T5 is electrically connected to the second electrode area T22 of the second transistor T2 through the connection electrode 66 shown in FIG. 10C.

The gate T60 of the sixth transistor T6 is electrically connected to the gate T30 of the third transistor T3, and the first electrode area T61 of the sixth transistor T6 is electrically connected to the gate T40 of the fourth transistor T4. For example, the gate T60 of the sixth transistor T6 and the gate T30 of the third transistor T3 are integrally provided. For example, the first electrode area T61 of the sixth transistor T6 is electrically connected to the gate T40 of the fourth transistor T4 through a connection electrode 67 shown in FIG. 10C.

The gate T70 of the seventh transistor T7 is electrically connected to the gate T40 of the fourth transistor T4. For example, the gate T70 of the seventh transistor T7 and the gate T40 of the fourth transistor T4 are integrally provided.

The first electrode area T81 of the eighth transistor T8 is electrically connected to the fourth power line VGH', and the second electrode area T82 of the eighth transistor T8 is electrically connected to the second electrode area T72 of the seventh transistor T7. For example, the second electrode area T82 of the eighth transistor T8 is electrically connected to the second electrode area T72 of the seventh transistor T7 through a connection electrode 68 shown in FIG. 10C.

The gate T90 of the ninth transistor T9 is electrically connected to the second electrode area T72 of the seventh transistor T7 through the fifth circuit connection line N5, the first electrode area T91 of the ninth transistor T9 is electrically connected to the second power line VGH, and the second electrode area T92 of the transistor T9 serves as a second output terminal OUT2. For example, the second electrode area T92 of the ninth transistor T9 is electrically connected to the first light-emitting control line 141 and the second light-emitting control line 142 through a second output electrode 34. For example, the gate T90 of the ninth transistor T9 is electrically connected to the fifth circuit connection line N5 through a connection electrode 69 shown in FIG. 10C, and the fifth circuit connection line N5 is electrically connected to the second electrode area T72 of the seventh transistor T7 through the connection electrode 68 shown in FIG. 10C.

The first electrode area T101 of the tenth transistor T10 is electrically connected to the second output electrode 34, and the second electrode area T102 of the tenth transistor T10 is electrically connected to the first power line VGL.

The first electrode plate C11 of the first capacitor C1 is electrically connected to the gate T30 of the third transistor T3 and the gate T60 of the sixth transistor T6, and the second electrode plate C12 of the first capacitor C1 is electrically connected to the second electrode area T62 of the sixth transistor T6 and the first electrode area T71 of the seventh transistor T7. The first electrode plate C11 of the first capacitor C1, the gate T30 of the third transistor T3 and the gate T60 of the sixth transistor T6 are integrally provided. For example, the second electrode plate C12 of the first capacitor C1 is electrically connected to the second electrode area T62 of the sixth transistor T6 through a connection electrode 70 shown in FIG. 10C, and electrically connected to the first electrode area T71 of the seventh transistor T7 through a connection electrode 71 shown in FIG. 10C.

The first electrode plate C21 of the second capacitor C2 is electrically connected to the gate T90 of the ninth transistor T9, and the second electrode plate C22 of the second capacitor C2 is electrically connected to the second power line VGH. For example, the first electrode plate C21 of the second capacitor C2 and the gate T90 of the ninth transistor T9 are integrally provided.

The first electrode plate C31 of the third capacitor C3 is electrically connected to the gate T20 of the second transistor T2, the gate T80 of the eighth transistor T8 and the gate T100 of the tenth transistor T10, and the second electrode plate C32 of the third capacitor C3 is electrically connected to the gate T40 of the fourth transistor T4. For example, the first electrode plate C31 of the third capacitor C3 and the gate T20 of the second transistor T2 are integrally provided.

For example, the first electrode plate C31 of the third capacitor C3 is electrically connected to the fourth circuit connection line N4 and the gate T80 of the eighth transistor T8 through the connection electrode 72 shown in FIG. 10C, and the fourth circuit connection line N4 is electrically connected to the gate T100 of the tenth transistor T10 through a connection electrode 73 shown in FIG. 10C. For example, the second electrode plate C32 of the third capacitor C3 is electrically connected to the gate T40 of the fourth transistor T4 through a connection electrode 67 shown in FIG. 10C.

FIGS. 13A-13F are schematic views showing the layout of different layers in a light-emitting control driving unit according to other implementations of the present disclosure. FIG. 14A is an enlarged schematic view showing 221A2 shown in FIG. 13A. FIG. 14B is an enlarged schematic view showing 221A1 shown in FIG. 13A.

Other splitting methods of the light-emitting control driving unit 221 of the light-emitting control driving circuit 22 will be introduced below in conjunction with FIGS. 13A to 13F and FIGS. 14A to 14B.

Figure 13A:
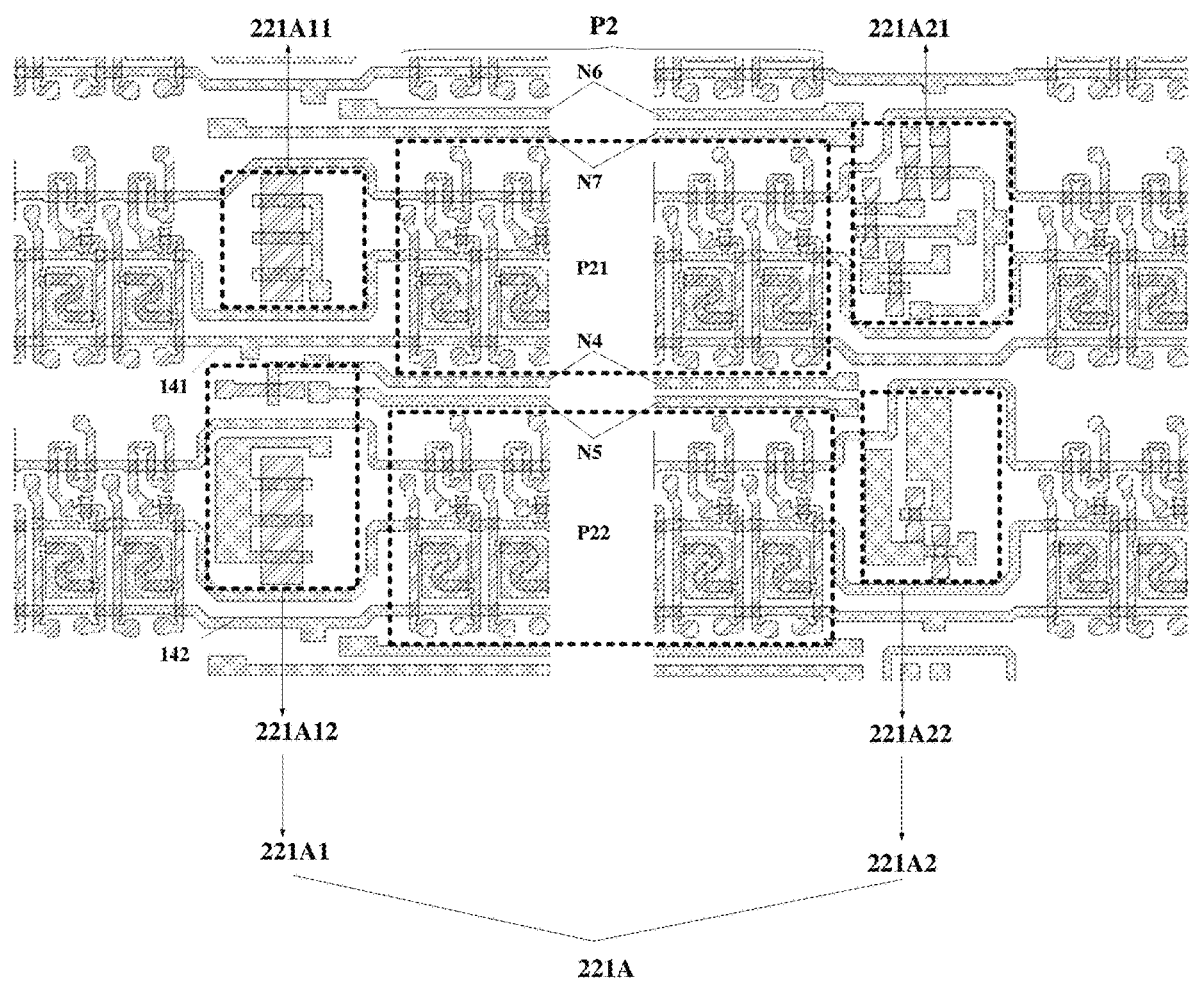
FIGS. 13A-13F are schematic views showing the layout of different layers in a light-emitting control driving unit according to other implementations of the present disclosure.
Figure 13B:
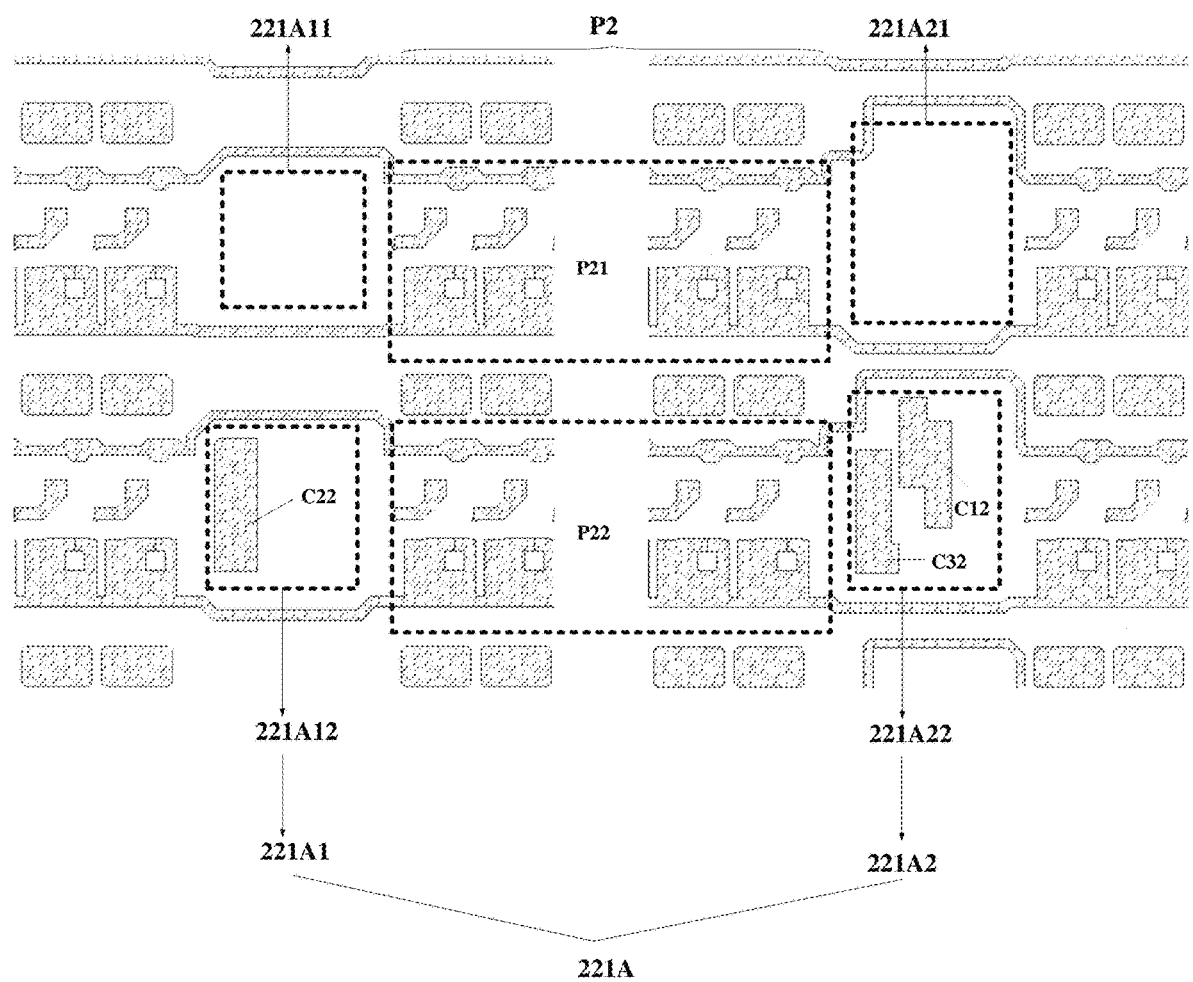
Figure 13C:
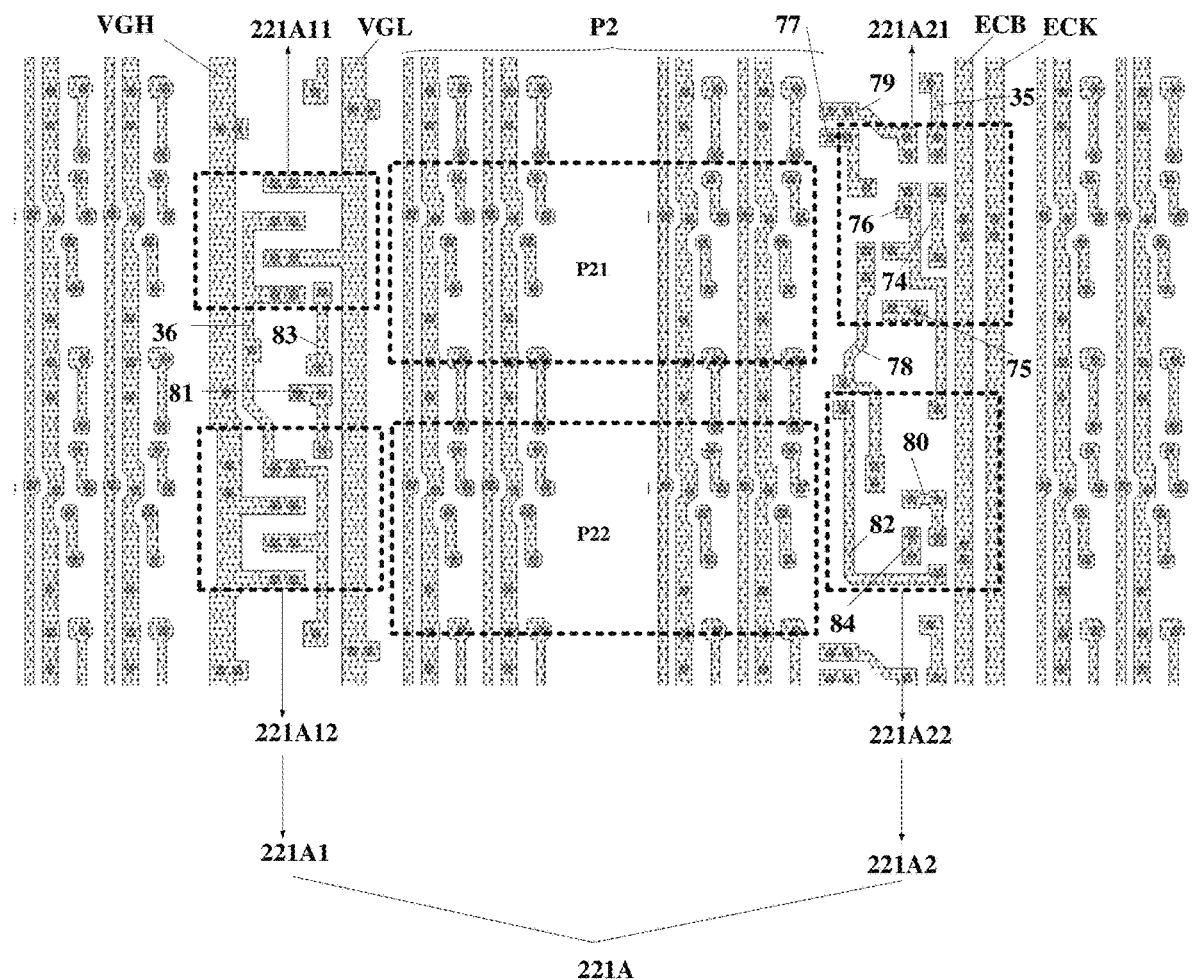
Figure 13D:
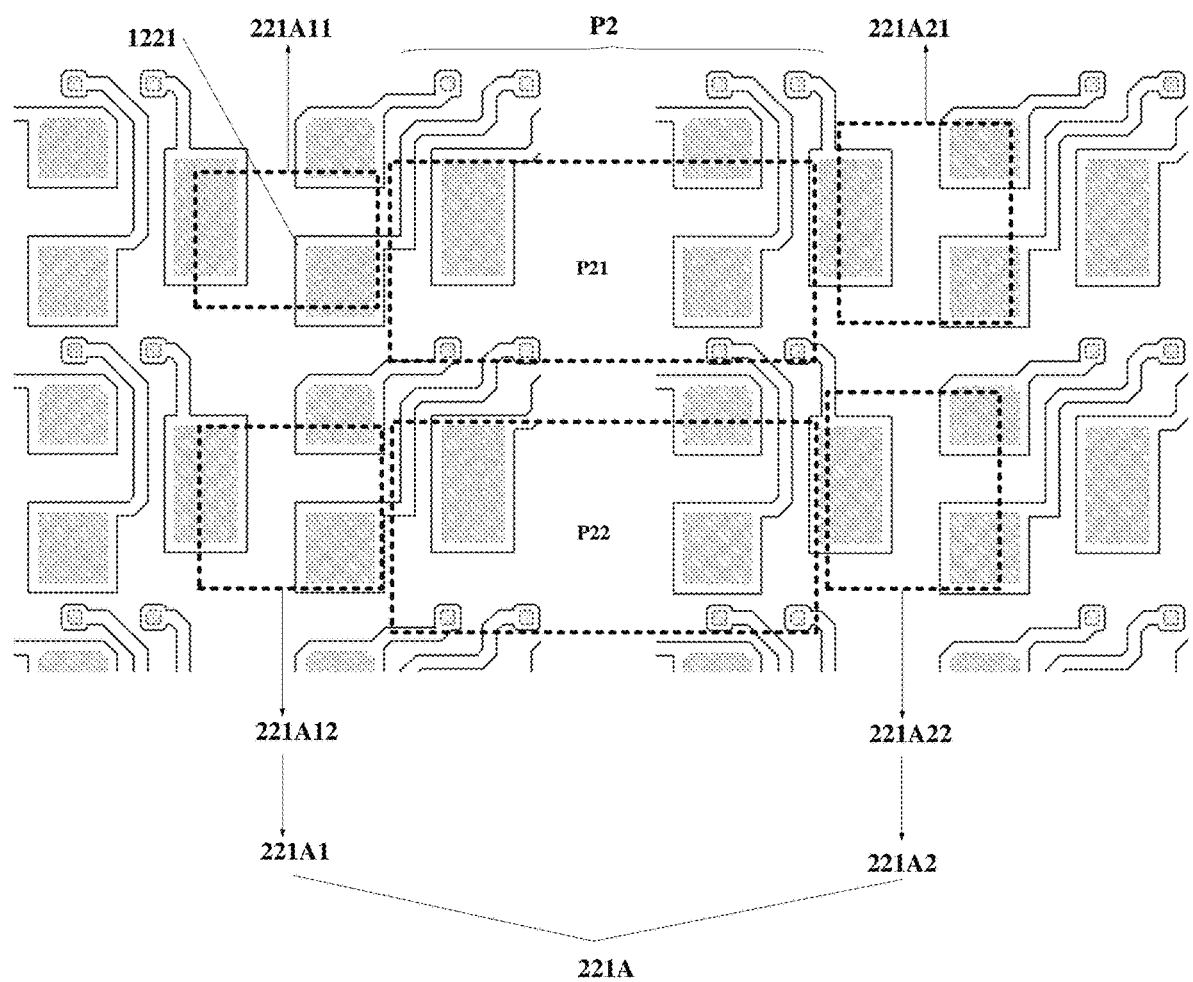
Figure 13E:
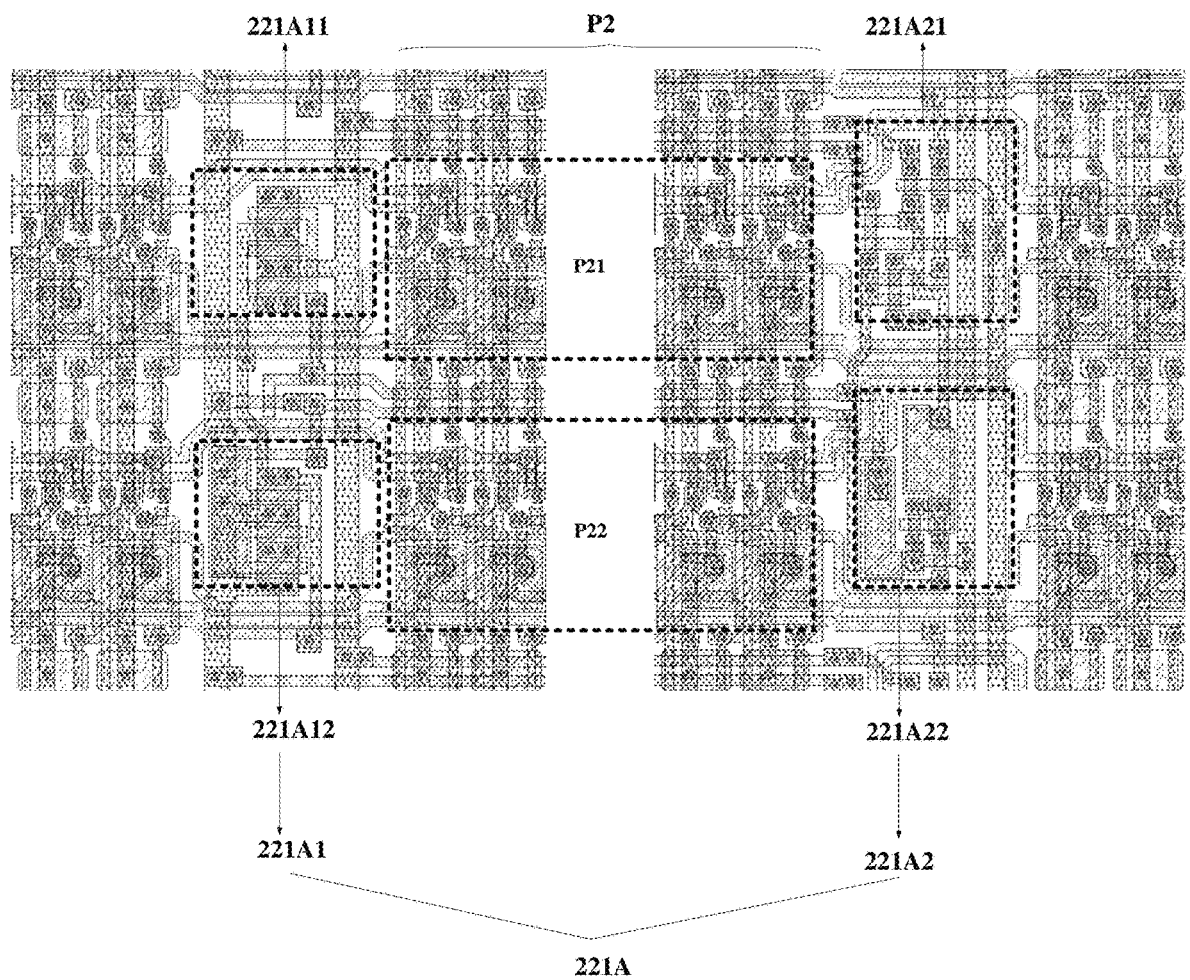
Figure 13F:
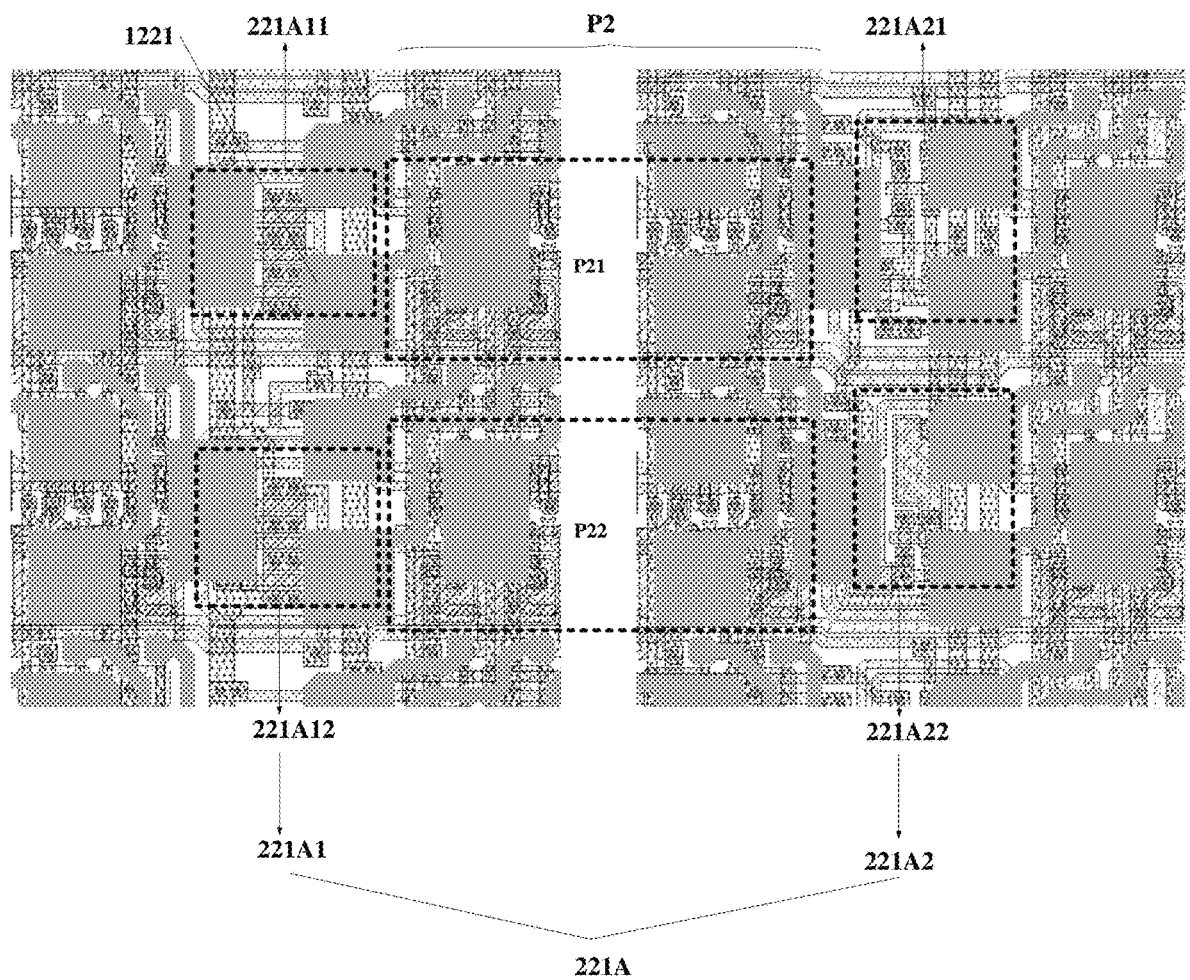
Figure 14A:
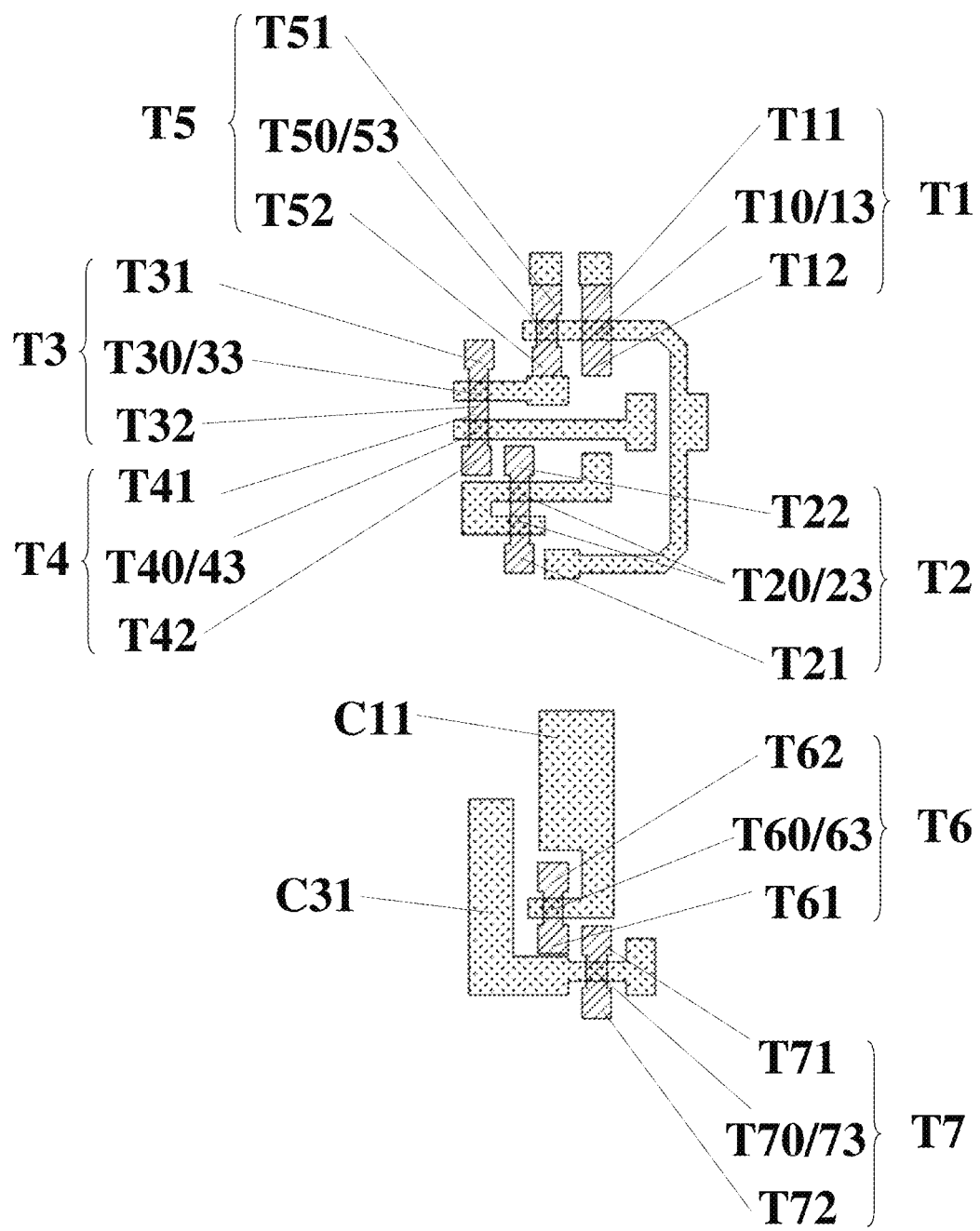
FIG. 14A is an enlarged schematic view showing 221A2 shown in FIG. 13A.
Figure 14B:
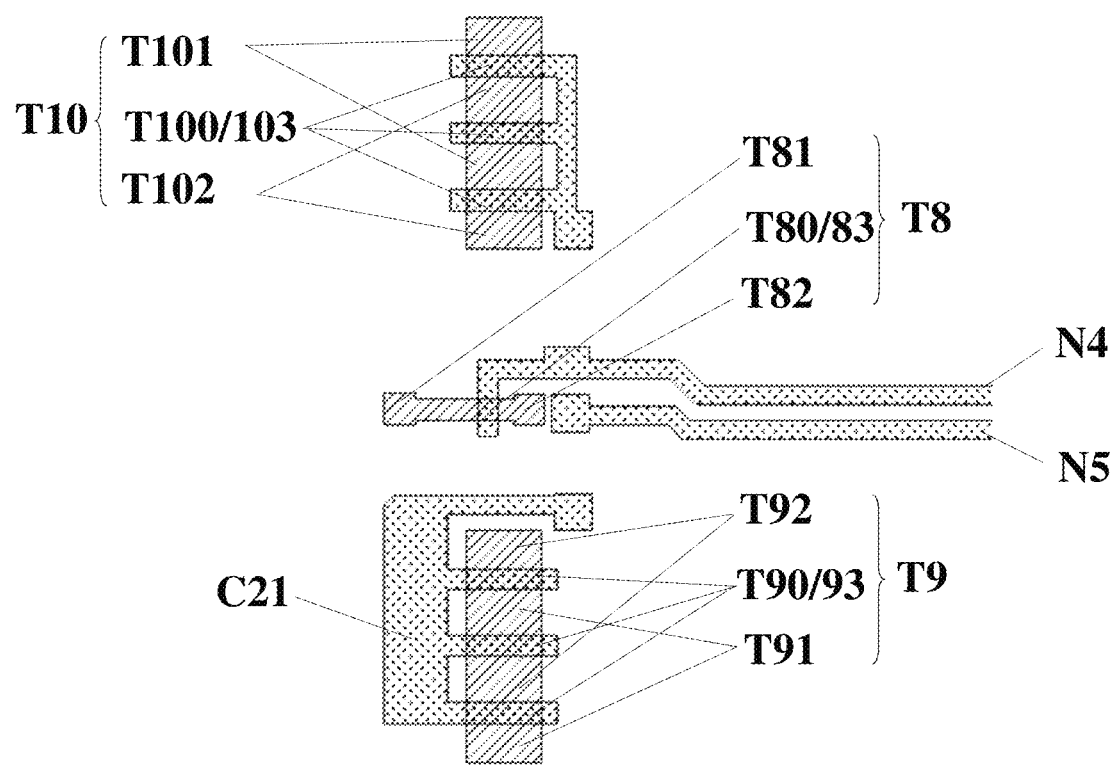
FIG. 14B is an enlarged schematic view showing 221A1 shown in FIG. 13A.

Referring to FIG. 13A, the second group of circuit connection lines comprises a fourth circuit connection line N4 and a fifth circuit connection line N5, a sixth circuit connection line N6 and a seventh circuit connection line N7. The first light-emitting control driving sub-circuit 221A1 comprises a first sub-circuit 221A11 and a second sub-circuit 221A12, and the second light-emitting control driving sub-circuit 221A2 comprises a third sub-circuit 221A21 and a fourth sub-circuit 221A22. The third sub-circuit 221A21 is electrically connected to the first power line VGL through the sixth circuit connection line N6, and electrically connected to the second power line VGH through the seventh circuit connection line N7. In this case, the second light-emitting control driving sub-circuit 221A2 may not comprise the third power line VGL' and the fourth power line VGH', thereby reducing the space occupied by the second light-emitting control driving sub-circuit 221A2, and further reducing the space occupied by the light-emitting control driving unit 221.

Figure 15:
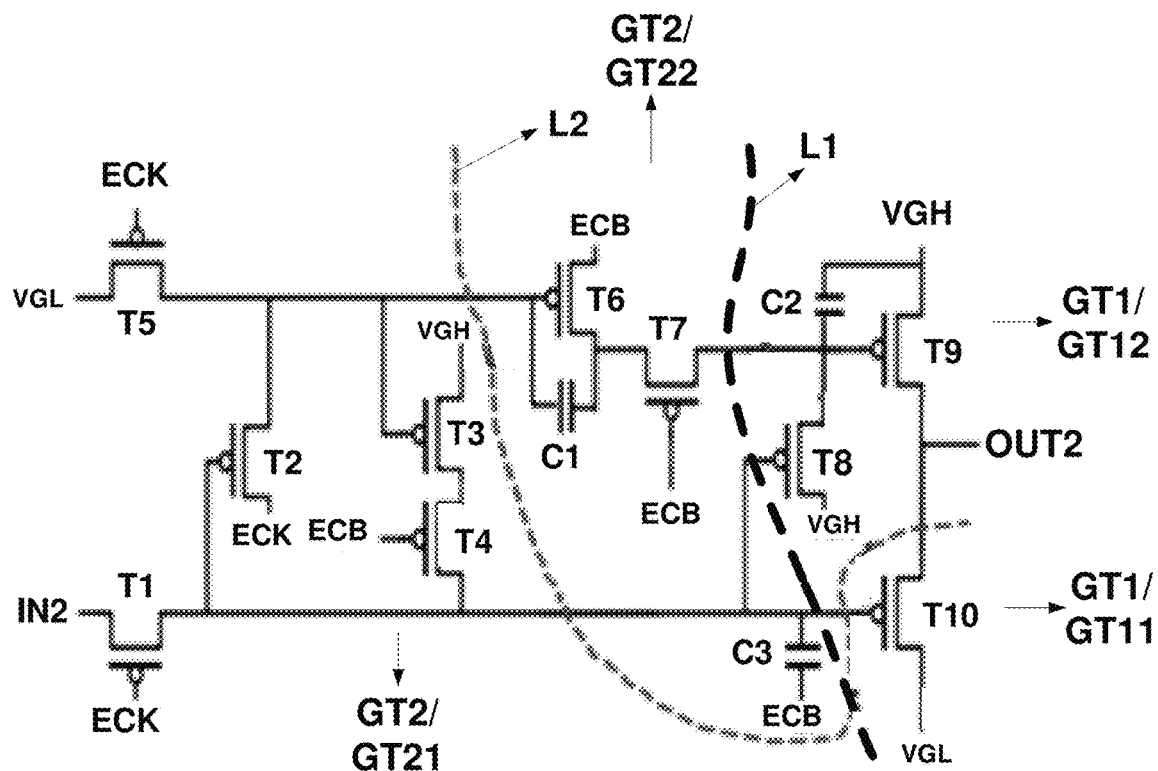
FIG. 15 is a schematic circuit view showing a light-emitting control driving unit according to another embodiment of the present disclosure.

FIG. 15 is a schematic circuit view showing a light-emitting control driving unit according to another embodiment of the present disclosure.

Other implementations of the first group of transistors GT1 and the second group of transistors GT2 will be introduced below in conjunction with FIGS. 15, 13A-13F, and 14A-14B. In these implementations, the fourth sub-circuit 221A22 further comprises a third capacitor C3.

Referring to FIG. 15, the second group of transistors GT2 is located on the left side of the line L1, and the first group of transistors GT1 is located on the right side of the line L1. The second group of transistors GT2 comprises a first transistor T1, a second transistor T2, a third transistor T3, a fourth transistor T4, a fifth transistor T5, a sixth transistor T6, and a seventh transistor T7. The first group of transistors GT1 comprises an eighth transistor T8, a ninth transistor T9, and a tenth transistor T10.

The first sub-group of transistors GT11 is located on the right side of line L1 and the lower side of line L2, the second sub-group of transistors GT12 is located on the right side of line L1 and the upper side of line L2, the third sub-group of transistors GT21 is located on the left side of line L1 and the left side of the line L2, and the fourth sub-group transistor GT22 is located on the left side of the line L1 and on the right side of the line L2. The first sub-group of transistors GT11 comprises a tenth transistor T10, the second sub-group of transistors GT12 comprises an eighth transistor T8 and a ninth transistor T9, the third sub-group of transistors GT21 comprises a first transistor T1, a second transistor T2, a third transistor T3, a fourth transistor T4 and a fifth transistor T5, and the fourth sub-group of transistors GT22 comprises a sixth transistor T6 and a seventh transistor T7.

Similarly, each transistor in the first group of transistors GT1 and the second group of transistors GT2 comprises a gate and an active layer. The active layer comprises a first electrode area, a second electrode area, and a channel located between the first electrode area and the second electrode area. For example, the first transistor T1 comprises a gate T10 and an active layer which comprises a first electrode area T11, a second electrode area T12, and a channel T13 between the first electrode area T11 and the second electrode area T12, and so forth. The active layers of the transistors T2-T10 sequentially comprises a channel T23, a channel T33, a channel T43, a channel T53, a channel T63, a channel T73, a channel T83, a channel T93, and a channel T103.

The gate T10 of the first transistor T1 is electrically connected to the first clock signal line ECK, and the first electrode area T11 of the first transistor T1 serves as the second input terminal IN2. For example, the second input terminal IN2 is electrically connected to the second input electrode 35 to receive the second input signal.

The gate T20 of the second transistor T2 is electrically connected to the second electrode area T12 of the first transistor T1, and the first electrode area T21 of the second transistor T2 is electrically connected to the gate T10 of the first transistor T1. For example, the gate T20 of the second transistor T2 is electrically connected to the second electrode area T12 of the first transistor T1 through a connection electrode 74 shown in FIG. 13C. For example, the first electrode area T21 of the second transistor T2 is electrically connected to the gate T10 of the first transistor T1 through a connection electrode 75 shown in FIG. 13C.

The gate of the third transistor T3 is electrically connected to the second electrode area T22 of the second transistor T2, and the first electrode area T31 of the third transistor T3 is electrically connected to the second power line VGH through the seventh circuit connection line N7. For example, the gate of the third transistor T3 is electrically connected to the second electrode area T22 of the second transistor T2 through the connection electrode 76 shown in FIG. 13C. For example, the first electrode area T31 of the third transistor T3 is electrically connected to the seventh circuit connection line N7 through a connection electrode 77 shown in FIG. 13C, and the seventh circuit connection line N7 is electrically connected to the second power line VGH through a via hole.

The gate T40 of the fourth transistor T4 is electrically connected to the second clock signal line ECB, the first electrode area T41 of the fourth transistor T4 is electrically connected to the second electrode area T32 of the third transistor T3, and the second electrode area T42 of the fourth transistor T4 is electrically connected to the gate T20 of the second transistor T2. For example, the first electrode area T41 of the fourth transistor T4 and the second electrode area T32 of the third transistor T3 are integrally provided. For example, the second electrode area T42 of the fourth transistor T4 is electrically connected to the gate T20 of the second transistor T2 through a connection electrode 78 shown in FIG. 13C.

The gate T50 of the fifth transistor T5 is electrically connected to the gate T10 of the first transistor T1, the first electrode area T51 of the fifth transistor T5 is electrically connected to the first power line VGL through the sixth circuit connection line N6, and the second electrode area T52 of the fifth transistor T5 of the second transistor is electrically connected to the second electrode area T22 of the second transistor T2. For example, the gate T50 of the fifth transistor T5 and the gate T10 of the first transistor T1 are integrally provided. For example, the first electrode area T51 of the fifth transistor T5 is electrically connected to the sixth circuit connection line N6 through a connection electrode 79 shown in FIG. 13C, and the sixth circuit connection line N6 is electrically connected to the first power line VGL through a via hole. For example, the second electrode area T52 of the fifth transistor T5 is electrically connected to the second electrode area T22 of the second transistor T2 through a connection electrode 76 shown in FIG. 13C.

The gate T60 of the sixth transistor T6 is electrically connected to the gate T30 of the third transistor T3. For example, the gate T60 of the sixth transistor T6 is electrically connected to the gate T30 of the third transistor T3 through a connection electrode 76 shown in FIG. 13C.

The gate T70 of the seventh transistor T7 is electrically connected to the first electrode area T61 of the sixth transistor T6 and the second clock signal line ECB, and the first electrode area T71 of the seventh transistor T7 is electrically connected to the second electrode area T62 of the sixth transistor T6. For example, the gate T70 of the seventh transistor T7 is electrically connected to the first electrode area T61 of the sixth transistor T6 through a connection electrode 84 shown in FIG. 13C. For example, the second electrode area T72 of the seventh transistor T7 is electrically connected to the first electrode area T61 of the sixth transistor T6 through a connection electrode 80 shown in FIG. 13C.

The gate T80 of the eighth transistor T8 is electrically connected to the gate T20 of the second transistor T2 through the fourth circuit connection line N4, the first electrode area T81 of the eighth transistor T8 is electrically connected to the second power line VGH, and the second electrode area T82 of the eighth transistor T8 is electrically connected to the second electrode area T72 of the seventh transistor T7 through the fifth circuit connection line N5. For example, the gate T80 of the eighth transistor T8 and the fourth circuit connection line N4 are integrally provided. For example, the fourth circuit connection line N4 is electrically connected to the gate T20 of the second transistor T2 through the connection electrode 78 shown in FIG. 13C. For example, the second electrode area T82 of the eighth transistor T8 is electrically connected to the fifth circuit connection line N5 through a connection electrode 81 shown in FIG. 13C, and the fifth circuit connection line N5 is electrically connected to the second electrode area T72 of the seventh transistor T7 through a connection electrode 82 shown in FIG. 13C.

The gate T90 of the ninth transistor T9 is electrically connected to the second electrode area T72 of the seventh transistor T7 through the fifth circuit connection line N5, the first electrode area T91 of the ninth transistor T9 is electrically connected to the second power line VGH, and the second electrode area T92 of the transistor T9 is electrically connected to the first light-emitting control line 141 and the second light-emitting control line 142 through the second output electrode 36.

The gate T100 of the tenth transistor T10 is electrically connected to the gate T20 of the second transistor T2 through the fourth circuit connection line N4, the first electrode area T11 of the tenth transistor T10 is electrically connected to the second output electrode 36, and the second electrode area T12 of the tenth transistor T10 is electrically connected to the first power line VGL. For example, the gate T100 of the tenth transistor T10 is electrically connected to the fourth circuit connection line N4 through a connection electrode 83 shown in FIG. 13C.

The first electrode plate C11 of the first capacitor C1 is electrically connected to the gate T60 of the sixth transistor T6, and the second electrode plate C12 of the first capacitor C1 is electrically connected to the first electrode area T61 of the sixth transistor T6 and the first electrode area T71 of the seventh transistor T7. For example, the first electrode plate C11 of the first capacitor C1 and the gate T60 of the sixth transistor T6 are integrally provided. For example, the second electrode plate C12 of the first capacitor C1 is electrically connected to the first electrode area T61 of the sixth transistor T6 and the first electrode area T71 of the seventh transistor T7 through the connection electrode 80 shown in FIG. 13C.

The first electrode plate C21 of the second capacitor C2 is electrically connected to the gate T90 of the ninth transistor T9, and the second electrode plate C22 of the second capacitor C2 is electrically connected to the second power line VGH. For example, the first electrode plate C21 of the second capacitor C2 and the gate T90 of the ninth transistor T9 are integrally provided.

The first electrode plate C31 of the third capacitor C3 is electrically connected to the gate T70 of the seventh transistor T7, and the second electrode plate C32 of the third capacitor C3 is electrically connected to the fourth circuit connection line N4. For example, the first electrode plate C31 of the third capacitor C3 and the gate T70 of the seventh transistor T7 are integrally provided. For example, the second electrode plate C32 of the third capacitor C3 is electrically connected to the fourth circuit connection line N4 through the connection electrode 78 shown in FIG. 13C.

Multiple splitting methods of the gate driving unit 211 and the light-emitting control driving unit 221 according to different embodiments of the present disclosure have been introduced above. In the following introduction, the gate driving unit 211 and the light-emitting control driving unit 221 may be split according to the methods introduced above.

The inventors have also noticed that, in the case of splitting the gate driving unit 211 and the light-emitting control driving unit 221 into a plurality of sub-circuits, circuit connection lines between different sub-circuits may adversely affect the sub-pixels 12. In the related art, the circuit connection lines may overlap with the active layer in the pixel driving circuit 122 to form a transistor, thereby affecting the normal display of the sub-pixels 12 and further affecting the display effect of the display panel.

In view of this, the embodiments of the present disclosure also provide the following technical solutions.

Figure 16A:
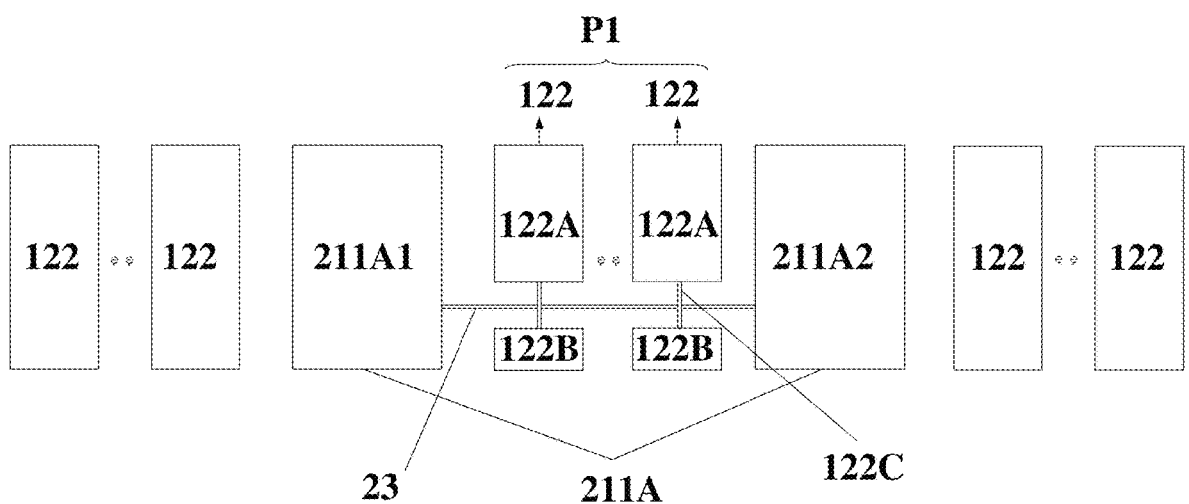
FIG. 16A is a schematic view showing the distribution of a plurality of gate driving sub-circuits according to another embodiment of the present disclosure.
Figure 16B:
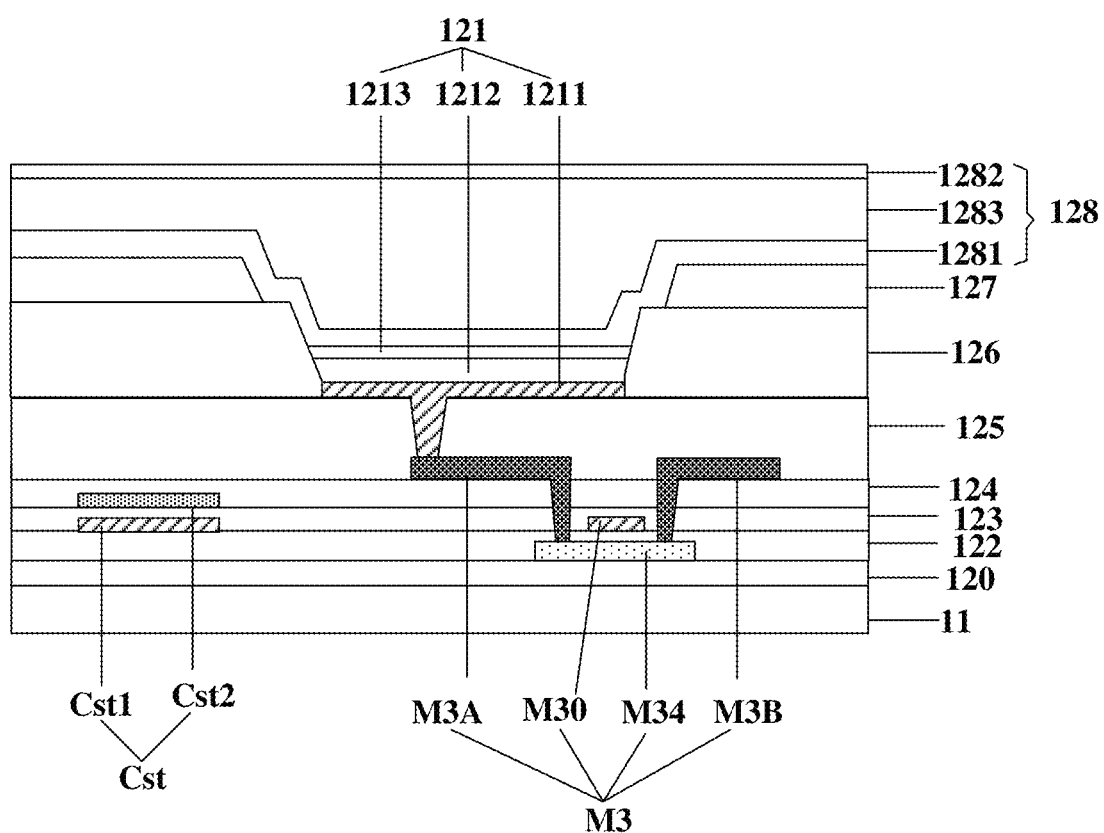
FIG. 16B is a schematic partial cross-sectional view showing a sub-pixel according to an embodiment of the present disclosure.

FIG. 16A is a schematic view showing the distribution of a plurality of gate driving sub-circuits according to another embodiment of the present disclosure. FIG. 16B is a schematic partial cross-sectional view showing a sub-pixel according to an embodiment of the present disclosure.

Referring to FIGS. 1B, 2 and 16A and 16B, the display panel comprises a base substrate 11, a plurality of sub-pixels 12, a plurality of gate lines 13, a plurality of light-emitting control lines 14, a gate driving circuit 21, and a gate driving sub-circuit connection line 23.

The base substrate 11 comprises a display area 111 and a peripheral area 112 surrounding the display area 111. The plurality of sub-pixels 12 is located at the display area 111. Each sub-pixel 12 comprises a light-emitting element 121 and a pixel driving circuit 122 configured to drive the light-emitting element 121. The plurality of gate lines 13 is located at the display area 111 and electrically connected to the plurality of sub-pixels 12.

The gate driving circuit 21 is located at the display area 111 and comprises cascaded multistage gate driving units 211. The multistage gate driving units 211 are electrically connected to the plurality of gate lines 13. For example, the multistage gate driving units 211 are electrically connected to the plurality of gate lines 13 in a one-to-one correspondence.

As shown in FIG. 16A, one or more stages gate driving units 211 in the multistage gate driving circuits 211 comprise a plurality of gate driving sub-circuits 211A. The plurality of gate driving sub-circuits 211A comprises a first gate driving sub-circuit 211A1 and a second gate driving sub-circuit 211A2. The first gate driving sub-circuit 211A1 and the second gate driving sub-circuit 211A2 are spaced apart by the pixel driving circuits 122 of the first group of sub-pixels P1 of the plurality of sub-pixels 12.

The gate driving sub-circuit connection line 23 is located at the display area 111. One end of the gate driving sub-circuit connection line 23 is electrically connected to the first gate driving sub-circuit 211A1, and the other end of the gate driving sub-circuit connection line 23 is electrically connected to the second gate driving sub-circuit 211A2.

The pixel driving circuit 122 of at least one sub-pixel 12 in the first group of sub-pixels P1 comprises a first pixel driving sub-circuit 122A and a second pixel driving sub-circuit 122B. The first pixel driving sub-circuit 122A is located on one side of the gate driving sub-circuit connection line 23, and the second pixel driving sub-circuit 122B is located on one side of the gate driving sub-circuit connection line 23 away from the first pixel driving sub-circuit 122A.

The first pixel driving sub-circuit 122A comprises a driving transistor M3, such as the driving transistor M3 shown in FIG. 1B. Referring to FIG. 16B, the driving transistor M3 comprises a first active layer M34 located on one side of the base substrate 11. For example, the material of the first active layer M34 comprises a semiconductor material such as polysilicon.

One end of the connector 122C is electrically connected to the first pixel driving sub-circuit 122A, and the other end of the connector 122C is electrically connected to the second pixel driving sub-circuit 122A2. An orthographic projection of the connector 122C on the base substrate 11 overlaps with an orthographic projection of the gate driving sub-circuit connection line 23 on the base substrate 11. The connector 122C and the first active layer T14 are located in different layers.

It should be noted that, in the embodiments of the present disclosure, the expression that a plurality of components are located in different layers means that the plurality of components are formed by performing a plurality of patterning processes on different material layers, and the expression that a plurality of components are located in a same layer means that the plurality of components are formed by performing a patterning process on a same material layer. Therefore, the material of the connector 122C is different from the material of the first active layer M34.

In the above embodiments, the connector 122C and the first active layer M34 are located in different layers, and there is no transistor formed between the gate driving sub-circuit connection line 23 and the connector 122C. Therefore, at least the problem of a reduced display effect of the display panel resulting from the transistor formed between the gate driving sub-circuit connection line 23 and the connector 122C is alleviated.

In some embodiments, referring to FIG. 16B, the driving transistor M3 further comprises a first gate M30 located on one side of the first active layer M34 away from the base substrate 11, a first insulating layer 123 located on one side of the first gate M30 away from the base substrate 11, a second insulating layer 124 located on one side of the first insulating layer 123 away from the base substrate 11, and a first electrode M3A (e.g., drain) and a second electrode M3B (e.g., source) which are located on one side of the second insulating layer 124 away from the base substrate 11 and electrically connected to the first active layer M34. In some embodiments, the driving transistor M3 further comprises a gate dielectric layer 122 located on one side of the first active layer M34 away from the base substrate 11, and the first gate M30 is located on one side of the gate dielectric layer 122 away from the base substrate 11. For example, the first electrode M3A and the second electrode M3B each is electrically connected to the first active layer M34 through a via hole penetrating through the second insulating layer 124, the first insulating layer 123, and the gate dielectric layer 122 respectively.

FIG. 16B also shows a light-emitting element 121. For example, the light-emitting element 121 comprises an anode 1211, a functional layer 1212 located on one side of the anode 1211 away from the base substrate 11, and a cathode 1213 located on one side of the functional layer 1212 away from the base substrate 11. For example, the anode 1211 of the light-emitting element 121 is electrically connected to the first electrode M3A of the driving transistor M3. Here, the functional layer 1212 comprises at least a light-emitting layer, such as an organic light-emitting layer. In some embodiments, the functional layer 1212 may further comprise one or more of an electron transport layer, an electron injection layer, a hole transport layer, and a hole injection layer.

In some embodiments, referring to FIG. 16B, the sub-pixel 12 may further comprise a buffer layer 120 located between the base substrate 11 and the first active layer M34, and a planarization layer 125 covering the first electrode M3A and the second electrode M3B, a pixel defining layer 126 for defining a plurality of sub-pixels 12, a support layer 127 and an encapsulation layer 128. For example, the anode 1211 of the light-emitting element 121 may be electrically connected to the first electrode M3A of the driving transistor M3 through a via hole penetrating through the planarization layer 125. For example, the pixel defining layer 126 has a plurality of openings corresponding to the plurality of sub-pixels 12, and the light-emitting elements 121s of the plurality of sub-pixels 12 are located in the plurality of openings. For example, the encapsulation layer 128 may comprise a thin film encapsulation layer. In some embodiments, the encapsulation layer 128 may comprise a first inorganic layer 1281, a second inorganic layer 1282, and an organic layer 1283 located between the first inorganic layer 1281 and the second inorganic layer 1282.

As some implementations, one or more of the second insulating layer 125, the first insulating layer 124, the gate dielectric layer 122, the buffer layer 120, the planarization layer 125, the pixel defining layer 126, and the support layer 127 may comprise, for example, an organic insulating material such as polyimide or resin material, or comprise an inorganic insulating material such as silicon oxide, silicon nitride, or silicon oxynitride.

Referring to FIG. 16B, the first pixel driving sub-circuit 122A further comprises a storage capacitor Cst. The storage capacitor Cst comprises a first electrode plate Cst1 located in a same layer as the first gate M30, and a second electrode plate Cst2 located between the first insulating layer 123 and the second insulating layer 124. It should be understood that, the storage capacitor Cst further comprises the first insulating layer 123 located between the first electrode plate Cst1 and the second electrode plate Cst2.

For example, the gate driving sub-circuit connection line 23 is located in a same layer as the first gate M30, and at least one of the second electrode plate Cst2, the first electrode M3A or the second electrode M3B is located in a same layer as the connector 122C. In other words, at least the first insulating layer 123 is disposed between the gate driving sub-circuit connection line 23 and the connector 122C.

In some implementations, the gate driving sub-circuit connection line 23 is located in a same layer as the first gate M30, and the second electrode plate Cst2 is located in a same layer as the connector 122C. In this case, the first insulating layer 123 is disposed between the gate driving sub-circuit connection line 23 and the connector 122C, which reduces the adverse effect of the gate driving sub-circuit connection line 23 on the sub-pixels 12.

In other implementations, the gate driving sub-circuit connection line 23 is located in a same layer as the first gate M30, and the first electrode M3A and the second electrode M3B are located in a same layer as the connector 122C. In this case, the first insulating layer 123 and the second insulating layer 124 are disposed between the gate driving sub-circuit connection line 23 and the connector 122C, which further reduces the adverse effect of the gate driving sub-circuit connection line 23 on the sub-pixels 12.

In the case where the gate driving unit 211 is split into a plurality of gate driving sub-circuits 211A according to the method shown in FIGS. 4A to 4F, the gate driving sub-circuit connection line 23 may be the second circuit connection line N2 shown in FIG. 4A. In other words, the second circuit connection line N2 shown in FIG. 4A is located in a same layer as the first gate M30 shown in FIG. 16B, and the connector 122C shown in FIG. 4C is located in a same layer as the first electrode M3A and the second electrode M3B which are shown in FIG. 16B. In addition, in some embodiments, the first circuit connection line N1 shown in FIG. 4A is located in a same layer as the first gate M30 shown in FIG. 16B, and the connector 122C which overlaps with the first circuit connection line N1 is located in a same layer as the first electrode M3A and the second electrode M3B shown in FIG. 16B.

Figure 7C:
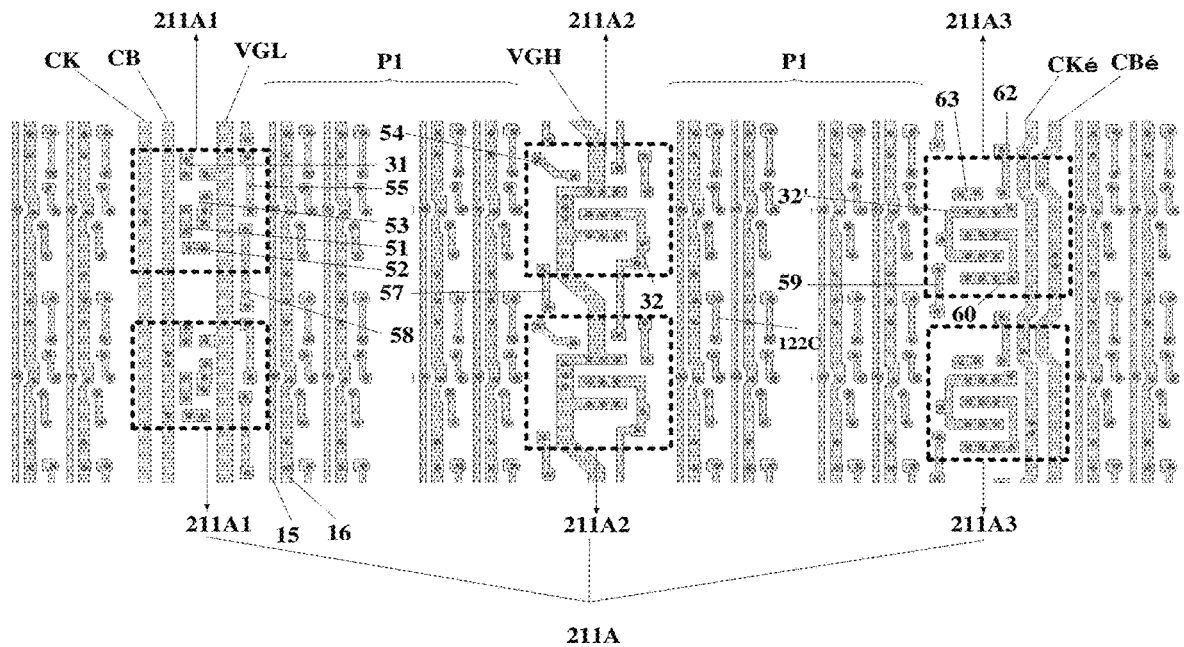
Figure 7D:
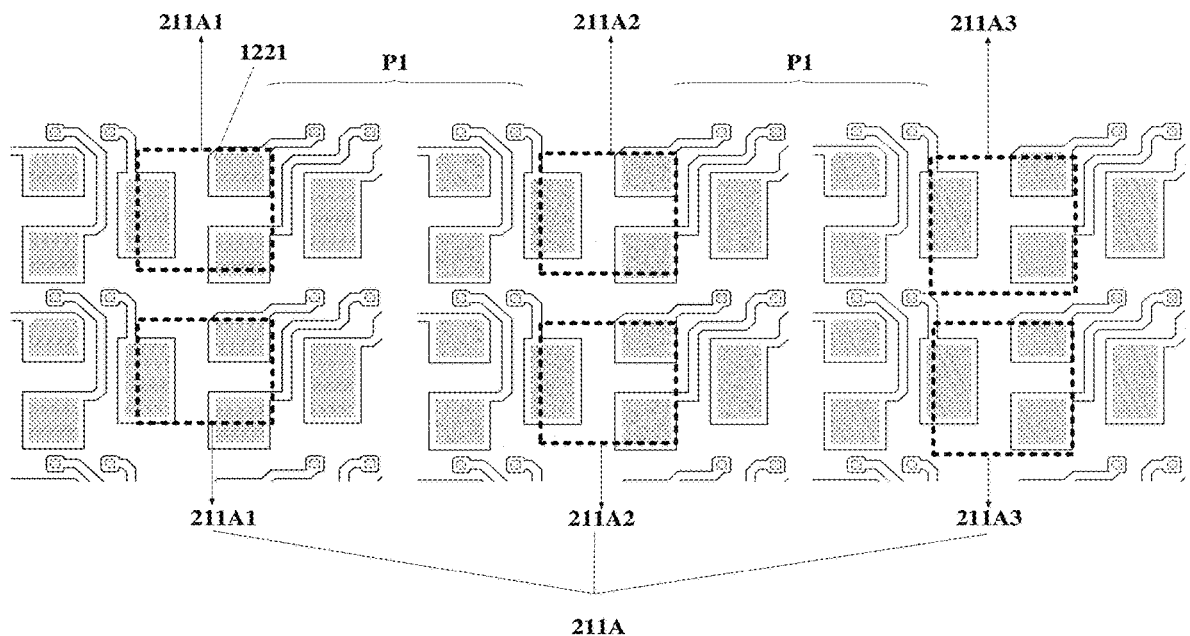
Figure 7E:
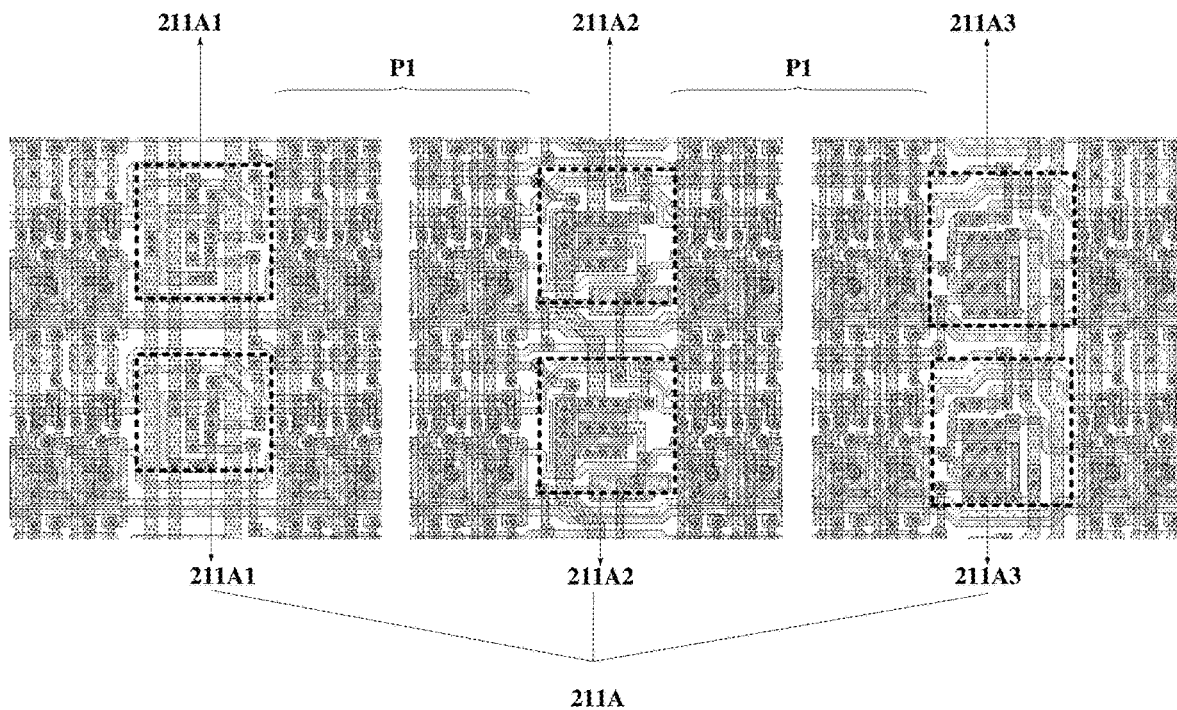
Figure 7F:
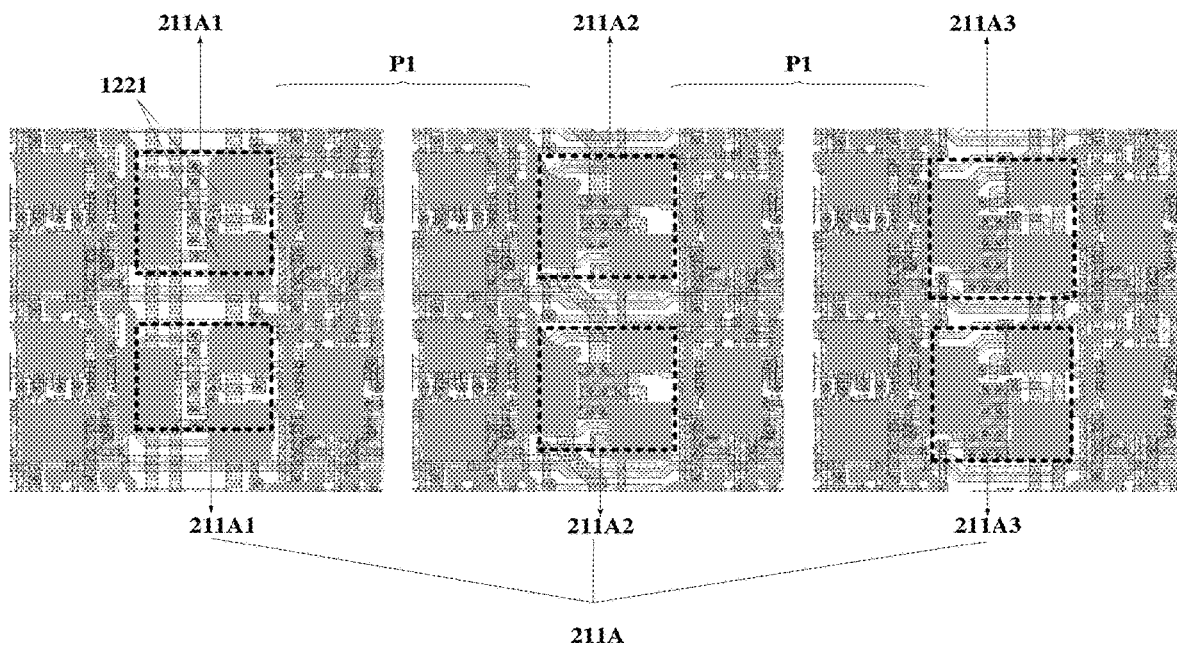

In the case where the gate driving unit 211 is split into a plurality of gate driving sub-circuits 211A according to the method shown in FIGS. 7A-7F, the gate driving sub-circuit connection line 23 may be the first circuit connection line N1 shown in FIG. 7A. In other words, the first circuit connection line N1 shown in FIG. 7A is located in a same layer as the first gate M30 shown in FIG. 16B, and the connector 122C shown in FIG. 7C is located in a same layer as the first electrode M3A and the second electrode M3B shown in FIG. 16B. In addition, in some embodiments, the second circuit connection line N2 and the third circuit connection line N3 shown in FIG. 7A are located in a same layer as the first gate M30 shown in FIG. 16B, and the connector 122C which overlaps with the second circuit connection line N2 and the connector 122C which overlaps with the third circuit connection line N3 are located in a same layer as the first electrode M3A and the second electrode M3B shown in FIG. 16B.

Figure 17A:
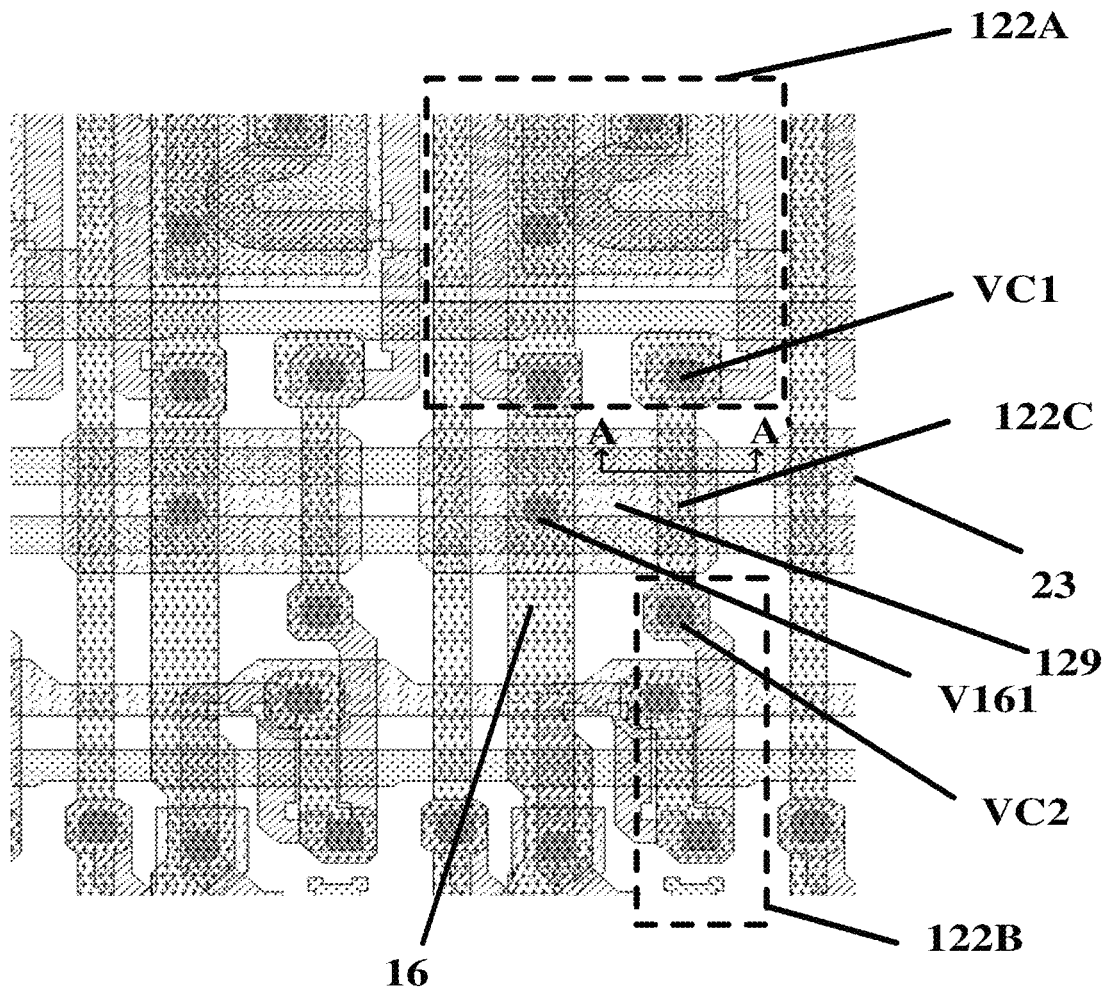
FIG. 17A is a schematic view showing the layout of the gate driving sub-circuit connection line and the connector that are overlapped according to an embodiment of the present disclosure.
Figure 17B:
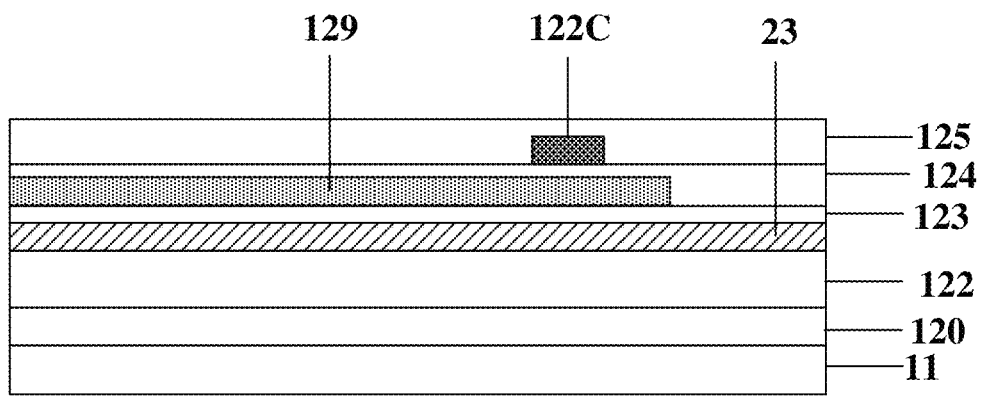
FIG. 17B is a schematic cross-sectional view taken along A-A' shown in FIG. 17A.

FIG. 17A is a schematic view showing the layout of the gate driving sub-circuit connection line and the connector that are overlapped according to an embodiment of the present disclosure. FIG. 17B is a schematic cross-sectional view taken along A-A' shown in FIG. 17A.

As shown in FIG. 17A, the first pixel driving sub-circuit 122A, the second pixel driving sub-circuit 122B, and the connector 122C constitute one sub-pixel 12 in the first group of sub-pixels P1. One end of the connector 122C is electrically connected to the first pixel driving sub-circuit 122A through a via hole VC1, and the other end of the connector 122C is electrically connected to the second pixel driving sub-circuit 122B through a via hole VC2.

As shown in FIG. 17B, the gate driving sub-circuit connection line 23 is located in a same layer as the first gate T10 shown in FIG. 16B, and the connector 122C is located in a same layer as the first electrode T1A and the second electrode T1B shown in FIG. 16B.

In some embodiments, referring to FIGS. 17A and 17B, at least one sub-pixel 12 further comprises a shielding layer 129. For example, as shown in FIG. 17A, the shielding layer 129 may be electrically connected to the power line 16 through a via hole V161. For example, as shown in FIG. 17B, the shielding layer 129 may be located in a same layer as the second electrode plate Cst2 shown in FIG. 16B. In addition, orthographic projections of the connector 122C and the gate driving sub-circuit connection line 23 on the base substrate 11 at least partially overlap with an orthographic projection of the shielding layer 129 on the base substrate 11. In this manner, the shielding layer 129 can reduce the mutual influence between the gate driving sub-circuit connection line 23 and the connector 122C.

In some embodiments, a portion of an orthographic projection of the connector 122C on the base substrate 11 overlapped with an orthographic projection of the gate driving sub-circuit connection line 23 on the base substrate 11 is located within the orthographic projection of the shielding layer 129 on the base substrate 11. In this manner, the shielding layer 129 can reduce the mutual influence between the gate driving sub-circuit connection line 23 and the connector 122C more effectively.

Figure 18:
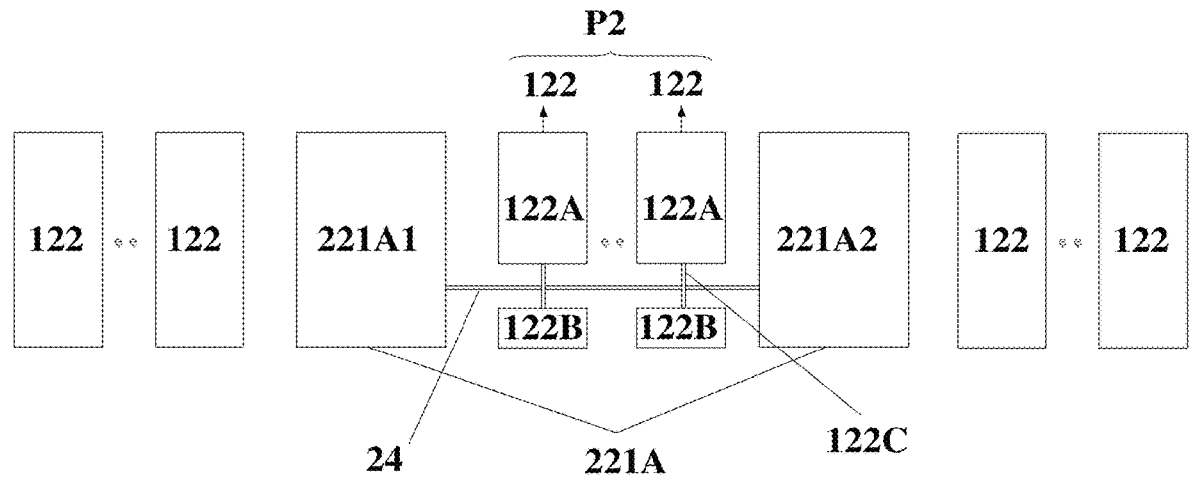
FIG. 18 is a schematic view showing the distribution of a plurality of light-emitting control driving sub-circuits according to another embodiment of the present disclosure.

FIG. 18 is a schematic view showing the distribution of a plurality of light-emitting control driving sub-circuits according to another embodiment of the present disclosure.

In some embodiments, referring to FIG. 2 and FIG. 18, the display panel further comprises a light-emitting control driving circuit 22 and a light-emitting control driving sub-circuit connection line 24 which are located at the display area 111.

The light-emitting control driving circuit 22 comprises cascaded multistage light-emitting control driving units 221 electrically connected to the plurality of light-emitting control lines 14. As shown in FIG. 18, one or more stages light-emitting control driving units 221 in the multistage light-emitting control driving units 221 comprise a plurality of light-emitting control driving sub-circuits 221A. The plurality of light-emitting control driving sub-circuits 221A comprises a first light-emitting control driving sub-circuit 221A1 and a second light-emitting control driving sub-circuit 221A2. The first light-emitting control driving sub-circuit 221A1 and the second light-emitting control driving sub-circuit 221A2 are spaced apart by the pixel driving circuits 122 of a second group of sub-pixels P2 of the plurality of sub-pixels 12. One end of the light-emitting control driving sub-circuit connection line 24 is electrically connected to the first light-emitting control driving sub-circuit 221A1, and the other end of the light-emitting control driving sub-circuit connection line 24 is electrically connected to the second light-emitting control driving sub-circuit 221A2.

The pixel driving circuit 122 of at least one sub-pixel 12 in the second group of sub-pixels P2 comprises a first pixel driving sub-circuit 122A and a second pixel driving sub-circuit 122B. The first pixel driving sub-circuit 122A is located on one side of the light-emitting control driving sub-circuit connection line 24, and the second pixel driving sub-circuit 122B is located on one side of the light-emitting control driving sub-circuit connection line 24 away from the first pixel driving sub-circuit 122A. One end of the connector 122C is electrically connected to the first pixel driving sub-circuit 122A, and the other end of the connector 122C is electrically connected to the second pixel driving sub-circuit 122B.

The orthographic projection of the connector 122C on the base substrate 11 overlaps with the orthographic projection of the light-emitting control driving sub-circuit connection line 24 on the base substrate 11, and the connector 122C and the first active layer M34 are located in different layers. For example, the light-emitting control driving sub-circuit connection line 24 is located in a same layer as the first gate M30 shown in FIG. 16B, and the connector 122C is located in a same layer as the first electrode M3A and the second electrode M3B shown in FIG. 16B.

In the above embodiments, the adverse effect of the light-emitting control driving sub-circuit connection line 24 on the sub-pixels 12 can be reduced and the display effect of the display panel is improved.

Similar to the above description, the above shielding layer 129 may be provided between the light-emitting control driving sub-circuit connection line 24 and the connector 122C to reduce the mutual influence between the light-emitting control driving sub-circuit connection line 24 and the connector 122C.

Figure 19:
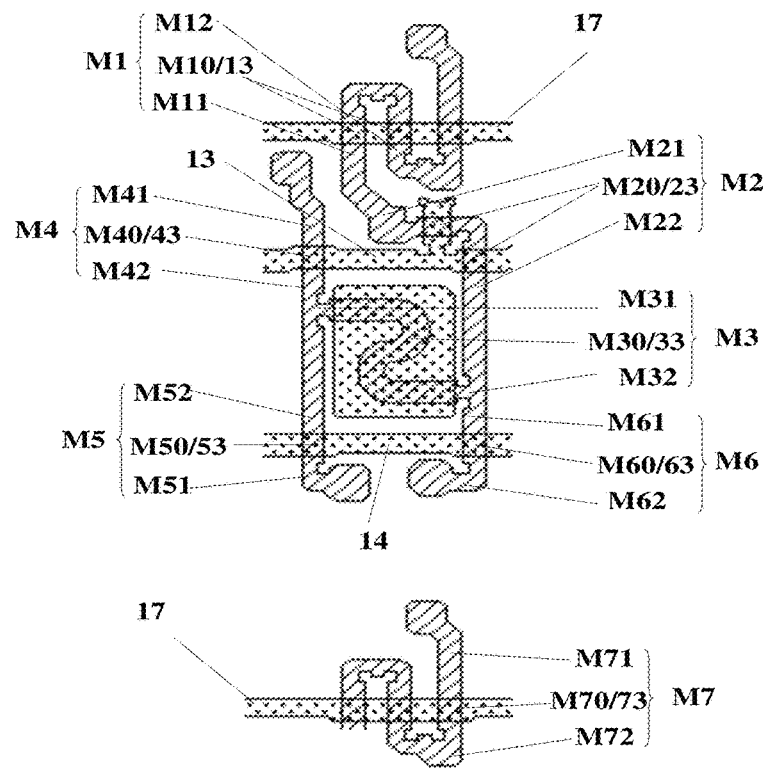
FIG. 19 is a schematic view showing the layout of some layers in a sub-pixel according to an embodiment of the present disclosure.

FIG. 19 is a schematic view showing the layout of some layers in a sub-pixel according to an embodiment of the present disclosure.

Some implementations of the first pixel driving sub-circuit 122A and the second pixel driving sub-circuit 122B will be introduced below in conjunction with FIG. 1B, FIG. 2 and FIG. 19.

Referring to FIG. 2, the display panel further comprises a plurality of light-emitting control lines 14, a plurality of power lines 16, a plurality of initialization lines 17, and a plurality of reset lines 18. The light-emitting control lines 14, the power lines 16, the initialization lines 17 and the plurality of reset lines 18 are located at the display area 111 and electrically connected to the plurality of sub-pixels 12.

Referring to FIG. 1B, the first pixel driving sub-circuit 122A is located on the right side of the line L, and the second pixel driving sub-circuit 122B is located on the left side of the line L.

The first pixel driving sub-circuit 122A comprises a driving transistor M3, a plurality of transistors MT which comprises a first light-emitting control transistor M6, and a storage capacitor Cst. The driving transistor M3 comprises a first gate M30 and a first active layer M34. The storage capacitor Cst comprises a first electrode plate Cst1 and a second electrode plate Cst2, and the first electrode plate Cst1 is electrically connected to one of the plurality of power lines 16.

The second pixel driving sub-circuit 122B comprises a first reset transistor M7. Each of the first reset transistor M7 and the plurality of transistors MT comprises a second gate and a second active layer. Each of the second active layer and the first active layer M34 comprises a first electrode area, a second electrode area, and a channel located between the first electrode area and the second electrode area. For example, the first active layer M34 of the driving transistor M3 comprises a first electrode area M31, a second electrode area M32, and a channel M33 between the first electrode area M31 and the second electrode area M32. For example, the second active layer M64 of the first light-emitting control transistor M6 comprises a first electrode area M61, a second electrode area M62, and a channel M63 between the first electrode area M61 and the second electrode area M62. For example, the second active layer M74 of the first reset transistor M7 comprises a first electrode area M71, a second electrode area M72, and a channel M73 between the first electrode area M71 and the second electrode area M72.

The first gate M30 of the driving transistor M3 is electrically connected to the second electrode plate Cst2 of the storage capacitor Cst, and the first electrode area M31 of the driving transistor M3 is electrically connected to one of the plurality of power lines 16. The second gate M60 of the first light-emitting control transistor M6 is electrically connected to one of the plurality of light-emitting control lines 14, the first electrode area M61 of the first light-emitting control transistor M6 is electrically connected to the second electrode area M32 of the driving transistor M3, and the second electrode area M62 of the light-emitting control transistor M6 is electrically connected to one end of the connector 122C. The second gate M70 of the first reset transistor M7 is electrically connected to one of the plurality of reset lines 18, the first electrode area M71 of the first reset transistor M7 is electrically connected to one of the plurality of initialization lines 17, and the second electrode area M72 of the first reset transistor M7 is electrically connected to the other end of the connector 122C.

In addition, the anode 1211 of the light-emitting element 121 of at least one sub-pixel 12 is electrically connected to one end of the connector 122C.

Some implementations of the plurality of transistors MT will be introduced below in conjunction with FIG. 1B, FIG. 2 and FIG. 19.

In some embodiments, referring to FIG. 2, the display panel further comprises a plurality of data lines 15. The plurality of data lines 15 is located at the display area 111 and electrically connected to the plurality of sub-pixels 12. Referring to FIG. 1B, the plurality of transistors MT further comprises a data writing transistor M4, a second reset transistor M1, a second light-emitting control transistor M5, and a threshold compensation transistor M2.

Referring to FIG. 19, the second gate M40 of the data writing transistor M4 is electrically connected to one of the plurality of gate lines 13, the first electrode area M41 of the data writing transistor M4 is electrically connected to one of the plurality of data lines 15, and the second electrode area M42 of the writing transistor M4 is electrically connected to the first electrode area M31 of the driving transistor M3.

The second gate M10 of the second reset transistor M1 is electrically connected to anther one of the plurality of reset lines 18, the first electrode area M10 of the second reset transistor M1 is electrically connected to the second electrode plate Cst2 of the storage capacitor Cst, and the second electrode area M20 of the second reset transistor M1 is electrically connected to another one of the initialization lines 17. In other words, the second gate M10 of the second reset transistor M1 and the second gate M70 of the first reset transistor M7 are electrically connected to different reset lines 18. The second electrode area M20 of the second reset transistor M1 and the first electrode area M71 of the first reset transistor M7 are electrically connected to different initialization lines 17.

The second gate M50 of the second light-emitting control transistor M5 is electrically connected to one of the plurality of light-emitting control lines 14, the first electrode area M51 of the second light-emitting control transistor M5 is electrically connected to one of the plurality of power lines 16, and the second electrode area M52 of the second light-emitting control transistor M5 is electrically connected to the first electrode area M31 of the driving transistor M3. For example, the second gate M50 of the second light-emitting control transistor M5 and the second gate M60 of the first light-emitting control transistor M6 are electrically connected to a same light-emitting control line 14.

The second gate M20 of the threshold compensation transistor M2 is electrically connected to one of the plurality of gate lines 13, the first electrode area M21 of the threshold compensation transistor M2 is electrically connected to the first electrode area M11 of the second reset transistor M1, and the second electrode area M22 of the threshold compensation transistor M2 is electrically connected to the second electrode area M32 of the driving transistor M3. For example, the second gate M20 of the threshold compensation transistor M2 and the second gate M40 of the data writing transistor M4 are electrically connected to a same gate line 13.

Figure 20:
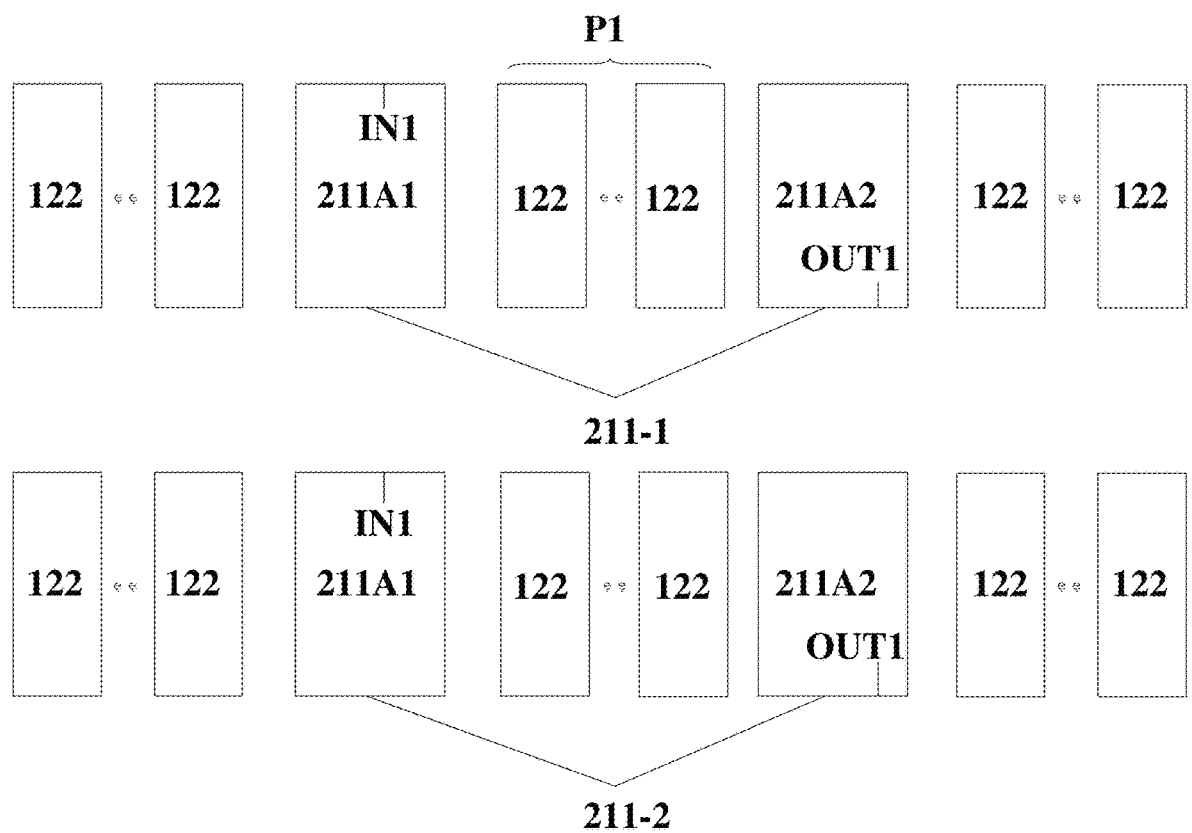
FIG. 20 is a schematic view showing cascaded two stages gate driving units according to an embodiment of the present disclosure.

FIG. 20 is a schematic view showing cascaded two stages gate driving units according to an embodiment of the present disclosure.

As shown in FIG. 20, one or more stages gate driving units 211 comprise a former stage gate driving unit 211-1 and a latter stage gate driving unit 211-2 that are cascaded. The first gate driving sub-circuit 211A1 of the former stage gate driving unit 211-1 comprises a first input terminal IN1 of the former stage gate driving unit 211-1, and the second gate driving sub-circuit 211A2 comprises a first output terminal OUT1 of the former stage gate driving unit 211-1. The first gate driving sub-circuit 211A1 of the latter stage gate driving unit 211-2 comprises a first input terminal IN1 of the latter stage gate driving unit 211-2, and the gate driving sub-circuit 211A2 of the latter stage gate driving unit 211-2 comprises a first output terminal OUT1 of the latter stage gate driving unit 211-2.

The method of connecting the cascaded former stage gate driving unit 211-1 and the latter stage gate driving unit 211-2 will be introduced below in conjunction with FIGS. 4A-4F.

As shown in FIG. 4A, the relatively upper gate driving unit is the former stage gate driving unit 211-1, and the relatively lower gate driving unit is the latter stage gate driving unit 211-2. The first output terminal OUT1 of the former stage gate driving unit 211-1 is electrically connected to a first gate line 131 of the plurality of gate lines 13. For example, the first output terminal OUT1 of the former stage gate driving unit 211-1 is electrically connected to the first gate line 131 through the output electrode 32.

As shown in FIG. 4C, the display panel further comprises a first cascade connection line CC1 located on one side of the pixel driving circuits 122 of the first group of sub-pixels P1 away from the second gate driving sub-circuit 211A2. One end of the first cascade connection line CC1 is electrically connected to the first gate line 131, and the other end of the first cascade connection line CC1 is electrically connected to the first input terminal IN1 of the latter stage gate driving unit 211-2. For example, one end of the first cascade connection line CC1 is electrically connected to the first gate line 131 through the first via hole VC1, and the other end of the first cascade connection line CC1 is electrically connected to the first input terminal IN1 of the latter stage gate driving unit 211-2 through the second via hole VC2.

In the above embodiments, the first gate line 131 transversely passes through the pixel driving circuits 122 of the first group of sub-pixels P1, and the first cascade connection line CC1 is electrically connected to the first gate line 131 and the first input terminal IN1 of the latter stage gate driving unit 211-2. In this way, the first output terminal OUT1 of the former stage gate driving unit 211-1 is electrically connected to the first input terminal IN1 of the latter stage gate driving unit 211-2 without through an additional transverse connection line, thereby reducing the space occupied by the gate driving circuit, and helping to improve the resolution of the display panel.

In some embodiments, referring to FIG. 2, the display panel further comprises a plurality of reset lines 18. The plurality of reset lines 18 is located at the display area 111 and electrically connected to the plurality of sub-pixels 12. Referring to FIG. 4B, the pixel driving circuits 122 of the first group of sub-pixels P1 between the first gate driving sub-circuit 211A1 and the second gate driving sub-circuit 211A2 of the latter stage gate driving unit 121-2 is electrically connected to a first reset line 181 of the plurality of reset lines 18, and the first reset line 181 is electrically connected to the first gate line 131 through the first cascade connection line CC1. For example, the first reset line 181 is electrically connected to the first cascade connection line CC1 through a third via hole VC3.

In some embodiments, referring to FIG. 4C, the display panel further comprises a second cascade connection line CC2 located on one side of the first group of sub-pixels P1 away from the first gate driving sub-circuit 211A1. One end of the second cascade connection line CC2 is electrically connected to the first gate line 131, and the other end of the second cascade connection line CC2 is electrically connected to the first reset line 181. For example, one end of the second cascade connection line CC2 is electrically connected to the first gate line 131 through a via hole VC4, and the other end of the second cascade connection line CC2 is electrically connected to the first reset line 181 through a via hole VC5. In some embodiments, the second cascade connection line CC2 and the first output electrode 32 are integrally provided. In this manner, it is ensured that the gate driving signal of the first gate line 131 is input as the first input signal to the first input terminal IN1 of the latter stage gate driving unit 211-2.

In some embodiments, at least one of the first electrode M3A or the second electrode M3B of the driving transistor M3 is located in a same layer as the first cascade connection line CC1. In some embodiments, at least one of the first electrode M3A or the second electrode M3B of the driving transistor M3 is located in a same layer as the second cascade connection line CC2.

The inventors have also noticed that, when the plurality of gate driving sub-circuits 211A is distributed into the plurality of sub-pixels 12, the space occupied by some sub-pixels 12 on both sides of the gate driving sub-circuit 211A is reduced. In this case, there is a problem of uneven display for some sub-pixels (for example, a plurality of red sub-pixels, a plurality of green sub-pixels, or a plurality of blue sub-pixels) that are reduced in space and emit light of a same color, thereby affecting the display effect of the display panel.

In view of this, the embodiments of the present disclosure also provide the following technical solutions.

Figure 21:
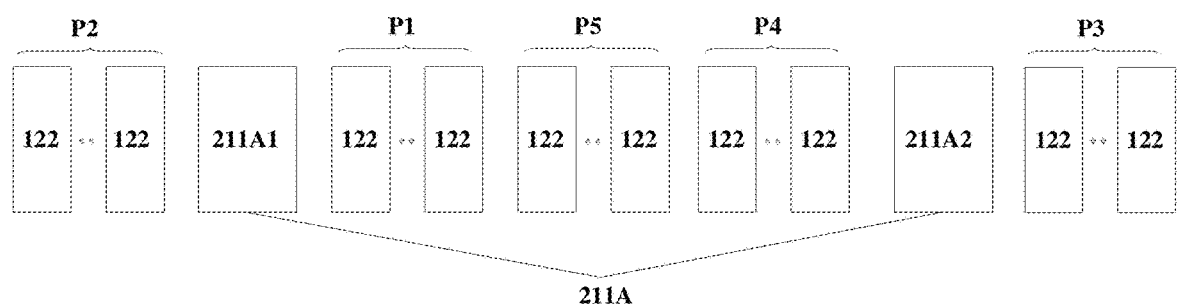
FIG. 21 is a schematic view showing the distribution of a plurality of gate driving sub-circuits according to still another embodiment of the present disclosure.

FIG. 21 is a schematic view showing the distribution of a plurality of gate driving sub-circuits according to still another embodiment of the present disclosure. FIGS. 22A-22E are schematic views showing different groups of anode connection lines according to some embodiments of the present disclosure.

The display panels according to some embodiments of the present disclosure will be introduced in conjunction with FIGS. 2, 21, and 22A-22E.

Referring to FIG. 2, the display panel comprises a base substrate 11, a plurality of sub-pixels 12, a plurality of gate lines 13 and a gate driving circuit 21.

The base substrate 11 comprises a display area 111 and a peripheral area 112 surrounding the display area 111. The plurality of sub-pixels 12 is located at the display area 111. The plurality of gate lines 13 is located at the display area 111 and electrically connected to the plurality of sub-pixels 12. The gate driving circuit 21 is located at the display area 111 and comprises cascaded multistage gate driving units 211. The multistage gate driving units 211 are electrically connected to the plurality of gate lines 13.

As shown in FIG. 21, one or more stages gate driving units 211 of the multistage gate driving circuits 211 comprise a plurality of gate driving sub-circuits 211A. The plurality of gate driving sub-circuits 211A comprises a first gate driving sub-circuit 211A1 and a second gate driving sub-circuit 211A2.

The plurality of sub-pixels 12 comprises a first group of sub-pixels P1 and a second group of sub-pixels P2. The pixel driving circuits 122 of one group of sub-pixels of the first group of sub-pixels P1 and the second group of sub-pixels P2 are located between the first gate driving sub-circuit 211A1 and the second gate driving sub-circuit 211A2, and the pixel driving circuits 122 of the other group of sub-pixels of the first group of sub-pixels P1 and the second group of sub-pixels P2 is located on one side of the first gate driving sub-circuit 211A1 away from the second gate driving sub-circuit 211A2. It should be noted that, FIG. 21 schematically shows a case where the pixel driving circuits 122 of the first group of sub-pixels P1 are located between the first gate driving sub-circuit 211A1 and the second gate driving sub-circuit 211A2, and the pixel driving circuits 122 of the second group of sub-pixels P2 are located on one side of the first gate driving sub-circuit 211A1 away from the second gate driving sub-circuit 211A2.

Figure 22A:
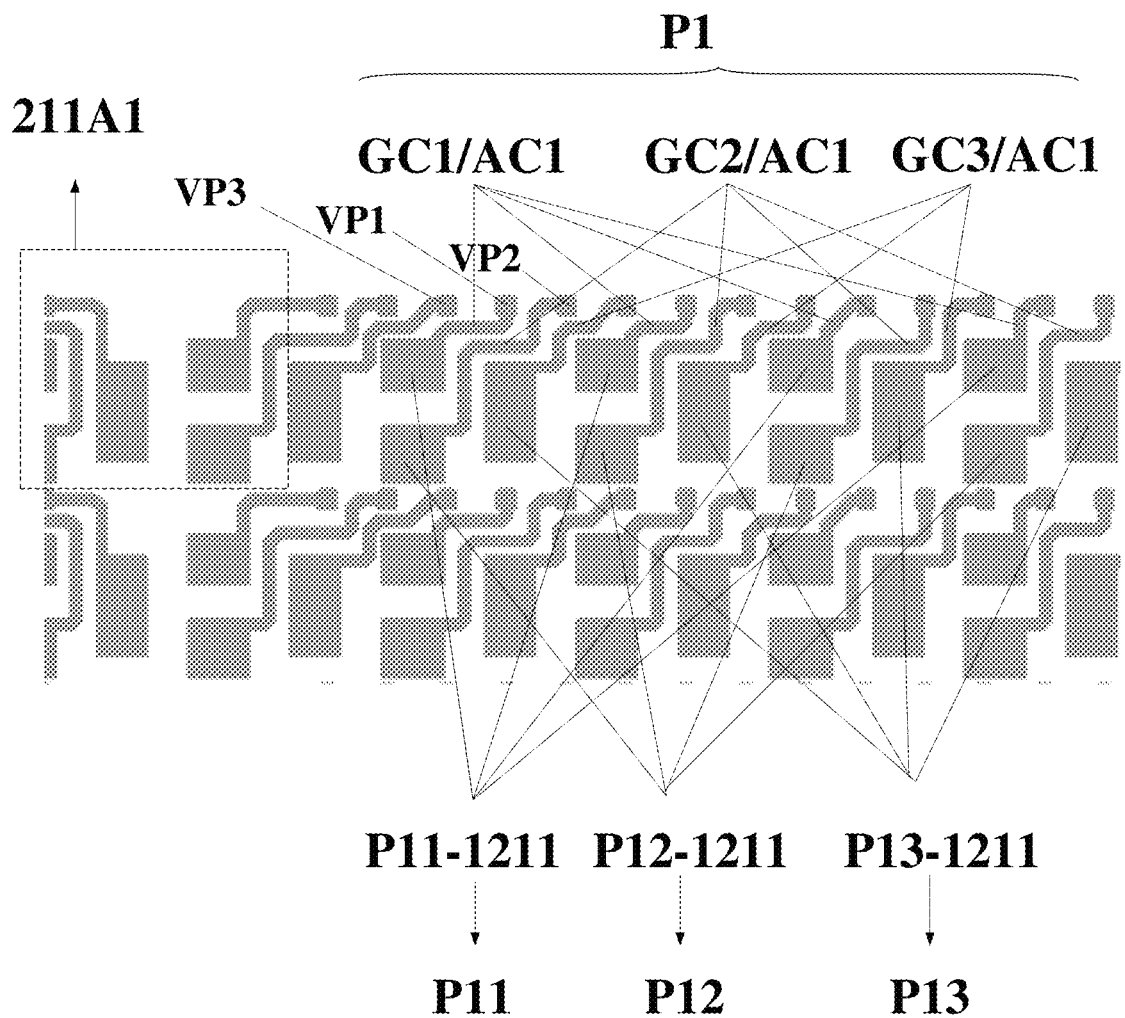
FIGS. 22A-22E are schematic views showing different groups of anode connection lines according to some embodiments of the present disclosure.

Referring to FIG. 22A, the first group of sub-pixels P1 comprises a first sub-group of sub-pixel P11 configured to emit light of a first color, a second sub-group sub-pixel P12 configured to emit light of a second color, and a third sub-group of sub-pixels P13 emitting light of a third color. In some embodiments, the first color, the second color, and the third color are different from each other. For example, the first color is red, the second color is green, and the third color is blue.

The pixel driving circuits 122 of the first sub-group of sub-pixels P11 are electrically connected to anodes P11-1211 of the light-emitting elements 121 of the first sub-group of sub-pixels P11 through a first group of anode connection lines GC1, and the pixel driving circuits 122 of the second sub-group of sub-pixels P12 are electrically connected to anodes P12-1211 of the light-emitting elements 121 of the second sub-pixel P12 through a second group of anode connection lines GC2, and the pixel driving circuits 122 of the third sub-group of sub-pixels P13 are electrically connected to anode electrodes P13-1211 of the light-emitting elements 121 of the third sub-group sub-pixels P13 through a third group of anode connection lines GC3.

At least one group of anode connection lines of the first group of anode connection lines GC1, the second group of anode connection lines GC2, or the third group of anode connection lines GC3 comprises a plurality of first anode connection lines AC1. For example, each group of anode connection lines of the first group of anode connection lines GC1, the second group of anode connection lines GC2, and the third group of anode connection lines GC3 comprises a plurality of first anode connection lines AC1. The plurality of first anode connection lines AC1 comprises two first anode connection lines AC1. The closer one of the two first anode connection lines AC1 is to the first gate driving sub-circuit 211A1, the greater the length of the one of the two first anode connection lines AC1 is.

For example, of the two first anode connection lines AC1 of the plurality of first anode connection lines AC1 in the first group of anode connection lines GC1, the first anode connection line AC1 closer to the first gate driving sub-circuit 211A1 has a larger length. For another example, of the two first anode connection lines AC1 of the plurality of first anode connection lines AC1 in the second group of anode connection lines GC2, the first anode connection line AC1 closer to the first gate driving sub-circuit 211A1 has a larger length. For still another example, of the two first anode connection lines AC1 of the plurality of first anode connection lines AC1 in the third group of anode connection lines GC1, the first anode connection line AC1 closer to the first gate driving sub-circuit 211A1 has a larger length.

In the above embodiments, of the two first anode connection lines AC1 in at least one group of anode connection lines of the first group of anode connection lines GC1, the second group of anode connection lines GC2, or the third group of anode connection lines GC3, the first anode connection line AC1 closer to the first gate driving sub-circuit 211A1 has a larger length. Such a structure is beneficial to improve the display uniformity of the first group of sub-pixels 12, thereby improving the display effect of the display panel.

In some embodiments, of the plurality of first anode connection lines AC1 in at least one group of anode connection lines of the first group of anode connection lines GC1, the second group of anode connection lines GC2, or the third group of anode connection lines GC3, the first anode connection lines AC1 closer to the first driving sub-circuit 211A1 has a larger length. In other words, of all of the first anode connection lines AC1 in at least one group of anode connection lines of the first group of anode connection lines GC1, the second group of anode connection lines GC2, or the third group of anode connection lines GC3, the first anode connection line AC1 closer to the first gate driving sub-circuit 211A1 has a larger length. Such a structure is beneficial to further improve the display uniformity of the first group of sub-pixels P1, thereby improving the display effect of the display panel.

In some embodiments, at least one group of anode connection lines of the first group of anode connection lines GC1, the second group of anode connection lines GC2, or the third group of anode connection lines GC3 is located in a same layer as the anode 1211 of the light-emitting element 121. Such a structure facilitates realization of the process and reduces complexity of the process. In some implementations, the first group of anode connection lines GC1 and the anodes P11-1211 of the light-emitting elements 121 of the first sub-group of sub-pixels P11 are integrally provided. In some implementations, the second group of anode connection lines GC2 and the anodes P12-1211 of the light-emitting elements 121 of the second sub-group of sub-pixels P12 are integrally provided. In some implementations, the third group of anode connection lines GC3 and the anodes P13-1211 of the light-emitting elements 121 of the third sub-group of sub-pixels P13 are integrally provided.

In some implementations, the first group of anode connection lines GC1 is electrically connected to the pixel driving circuits 122 of the first sub-group of sub-pixels P11 through a first group of via holes VP1, the second group of anode connection lines GC2 is electrically connected to the pixel driving circuits 122 of the second sub-group of sub-pixels P12 through a second group of via holes VP2, and the third group of anode connection lines GC3 is electrically connected to the pixel driving circuits 122 of the third sub-group of sub-pixels P13 through a third group of via holes VP3.

Figure 22B:
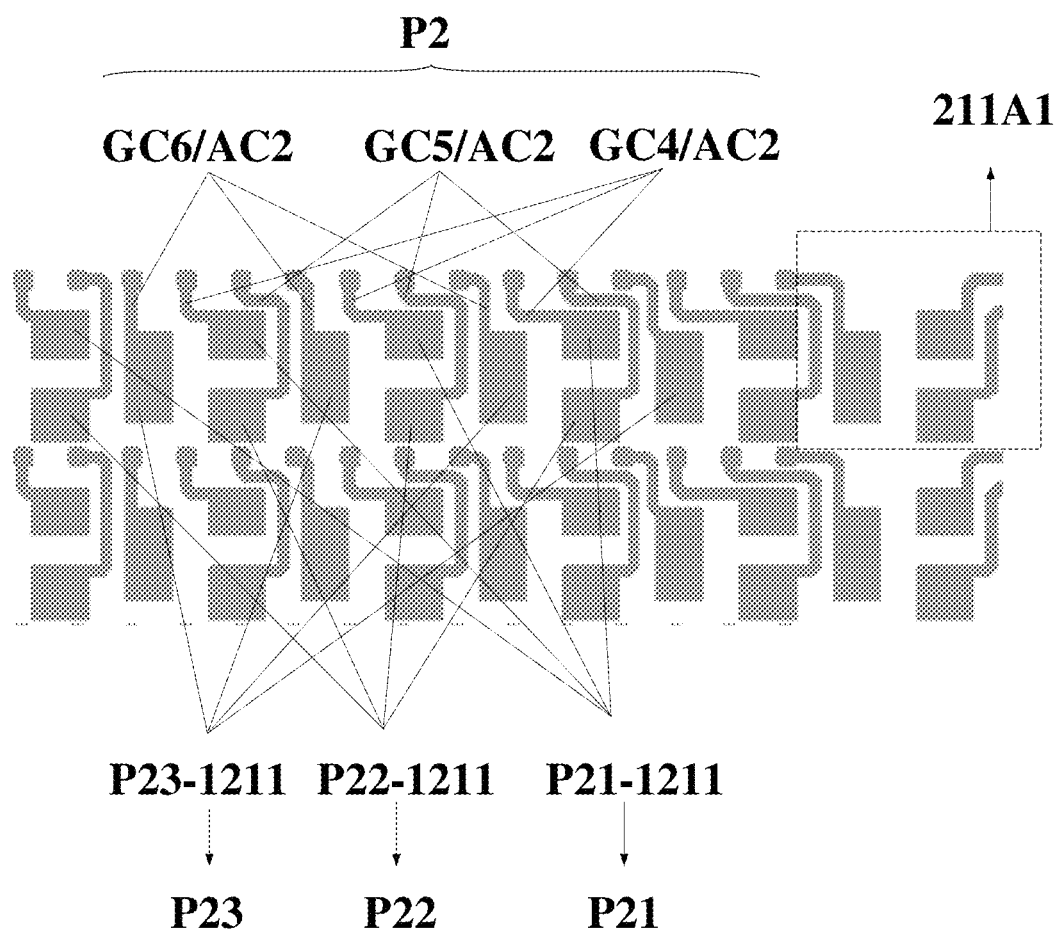

Next, some implementations of the second group of sub-pixels P2 will be introduced in conjunction with FIG. 22B.

Referring to FIG. 22B, the second group of sub-pixels P2 comprises a fourth sub-group of sub-pixels P21 configured to emit light of the first color, a fifth sub-group of sub-pixels P22 configured to emit light of the second color, and a sixth sub-group of sub-pixels P23 configured to emit light of the third color.

The pixel driving circuits 122 of the fourth sub-group sub-pixels P21 are electrically connected to anodes P21-1211 of the light-emitting elements 121 of the fourth sub-group sub-pixels P21 through a fourth-group of anode connection lines GC4, the pixel driving circuits 122 of the fifth sub-group sub-pixels P22 are electrically connected to anodes P22-1211 of the light-emitting elements 121 of the fifth sub-group sub-pixels P22 through a fifth group of anode connection lines GC5, and the pixel driving circuits 122 of the sixth sub-group of sub-pixels P23 are electrically connected to anode electrodes P23-1211 of the light-emitting elements 121 of the sixth sub-group sub-pixels P23 through a sixth group of anode connection lines GC6.

At least one group of anode connection lines of the fourth group of anode connection lines GC4, the fifth group of anode connection lines GC5, or the sixth group of anode connection lines GC6 comprises a plurality of second anode connection lines AC2. The closer one of the plurality of second anode connection lines AC2 is to the first gate driving sub-circuit 211A1, the greater the length of the one of the plurality of second anode connection lines AC2 is. For example, each group of anode connection lines of the fourth group of anode connection lines GC4, the fifth group of anode connection lines GC5, and the sixth group of anode connection lines GC6 comprises a plurality of second anode connection lines AC2, and of the plurality of second anode connection lines AC2, the second anode connection line closer to the first gate driving sub-circuit 211A1 has a larger length. Such a structure is beneficial to improve the display uniformity of the second group of sub-pixels P2, thereby further improving the display effect of the display panel.

In some embodiments, referring to FIG. 21, the plurality of sub-pixels 12 further comprises a third group of sub-pixels P3 and a fourth group of sub-pixels P4. The pixel driving circuits 122 of one group of sub-pixels of the third group of sub-pixels P3 and the fourth group of sub-pixels P4 are located on one side of the second gate driving sub-circuit 211A2 close to the first gate driving sub-circuit 211A1, the first group of sub-pixels P1 and the second group of sub-pixels P2, and the pixel driving circuits 122 of the other group of sub-pixels of the third group of sub-pixels P3 and the fourth group of sub-pixels P4 are located on one side of the second gate driving sub-circuit 211A2 away from the first gate driving sub-circuit 211A1. Here, FIG. 21 schematically shows a case where the pixel driving circuits 122 of the fourth group of sub-pixels P4 are located on one side of the second gate driving sub-circuit 211A2 close to the first gate driving sub-circuit 211A1, the first group of sub-pixels P1 and the second group of sub-pixels P2, and the pixel driving circuits 122 of the third group of sub-pixels P3 are located on one side of the second gate driving sub-circuit 211A2 away from the first gate driving sub-circuit 211A1.

Some implementations of the third group of sub-pixels P3 will be introduced below in conjunction with FIG. 22C.

Figure 22C:
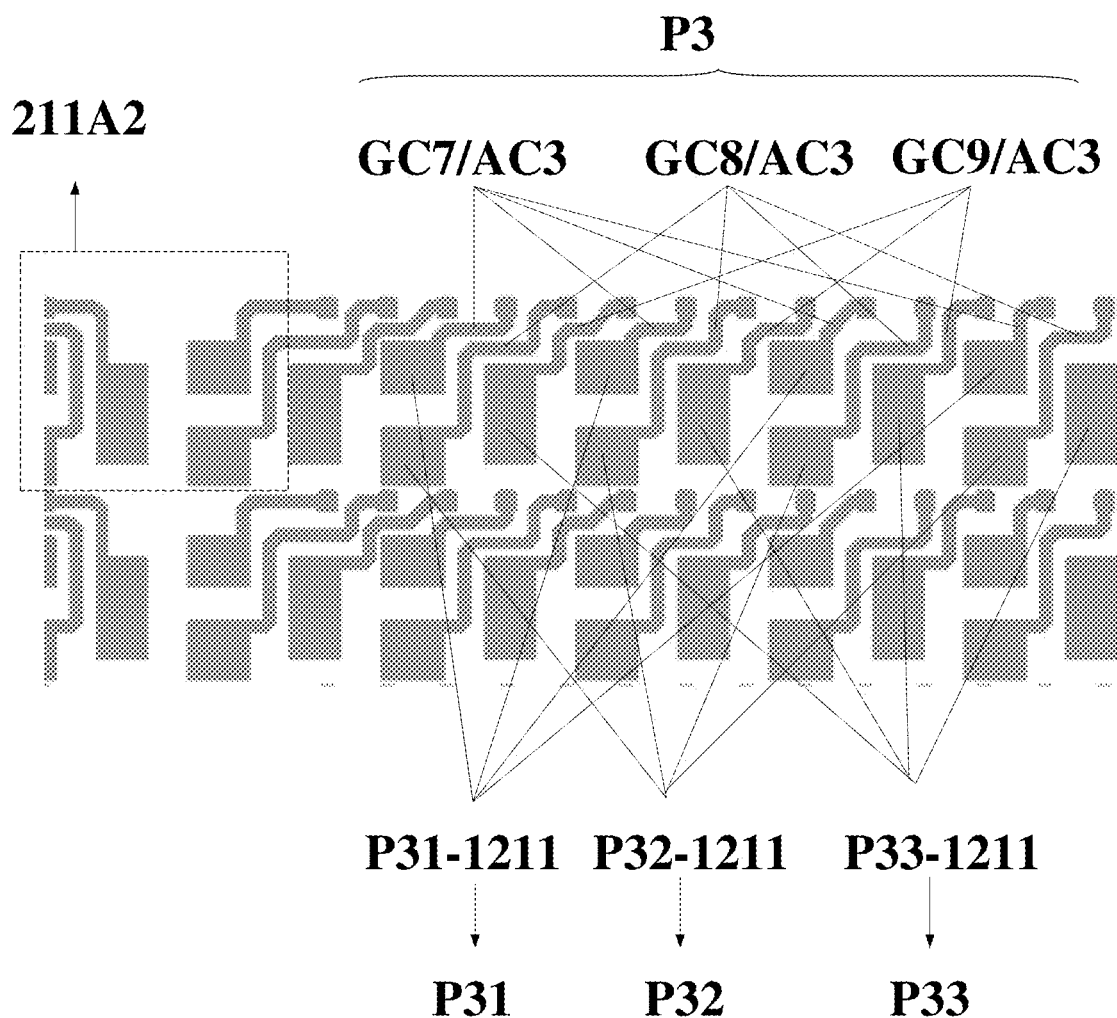

Referring to FIG. 22C, the third group of sub-pixels P3 comprises a seventh sub-group of sub-pixels P31 configured to emit light of the first color, an eighth sub-group of sub-pixels P32 configured to emit light of the second color, and a ninth sub-group of sub-pixels P33 configured to emit light of the third color.

The pixel driving circuits 122 of the seventh sub-group of sub-pixels P31 are electrically connected to anodes P31-1211 of the light-emitting elements 121 of the seventh sub-group of sub-pixels P31 through a seventh-group of anode connection lines GC7, the pixel driving circuits 122 of the eighth sub-group of sub-pixels P32 are electrically connected to anodes P32-1211 of the light-emitting elements 121 of the eighth group of sub-pixels P32 through an eighth group of anode connection lines GC8, and the pixel driving circuits 122 of the ninth sub-group of sub-pixels P33 are electrically connected to anodes P33-1211 of the light-emitting elements 121 of the ninth group of sub-group sub-pixels P33 through a ninth group of anode connection lines GC9.

At least one group of anode connection lines of the seventh group of anode connection lines GC7, the eighth group of anode connection lines GC8, or the ninth group of anode connection lines GC9 comprises a plurality of third anode connection lines AC3, and of the plurality of third anode connection lines AC3, the anode connection line closer to the second gate driving sub-circuit 211A2 has a larger length. For example, each group of anode connection lines of the seventh group of anode connection lines GC7, the eighth group of anode connection lines GC8, and the ninth group of anode connection lines GC9 comprises a plurality of third anode connection lines AC3, and of the plurality of third anode connection lines AC3, the anode connection line closer to the second gate driving sub-circuit 211A2 has a larger length. Such a structure is beneficial to improve the display uniformity of the third group of sub-pixels P3, thereby further improving the display effect of the display panel.

Some implementations of the fourth group of sub-pixels P4 will be introduced below in conjunction with FIG. 22D.

Figure 22D:
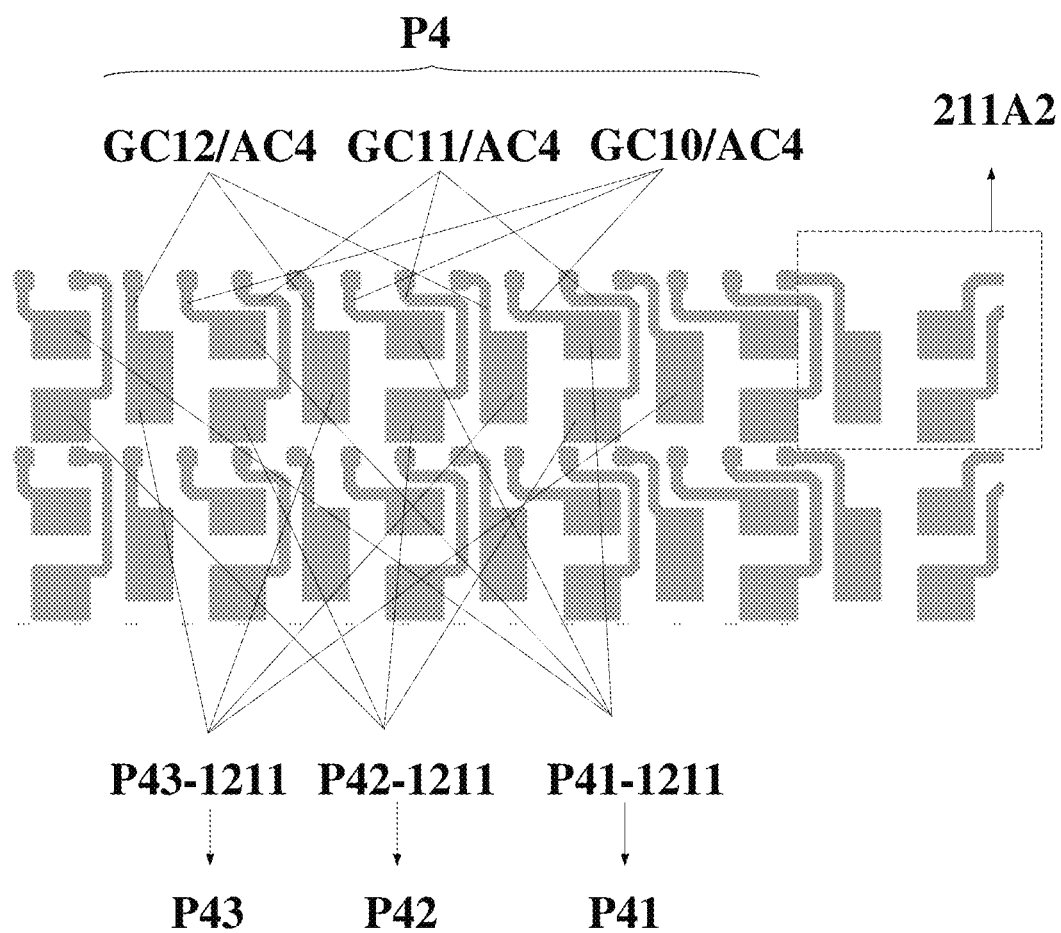
Figure 22E:
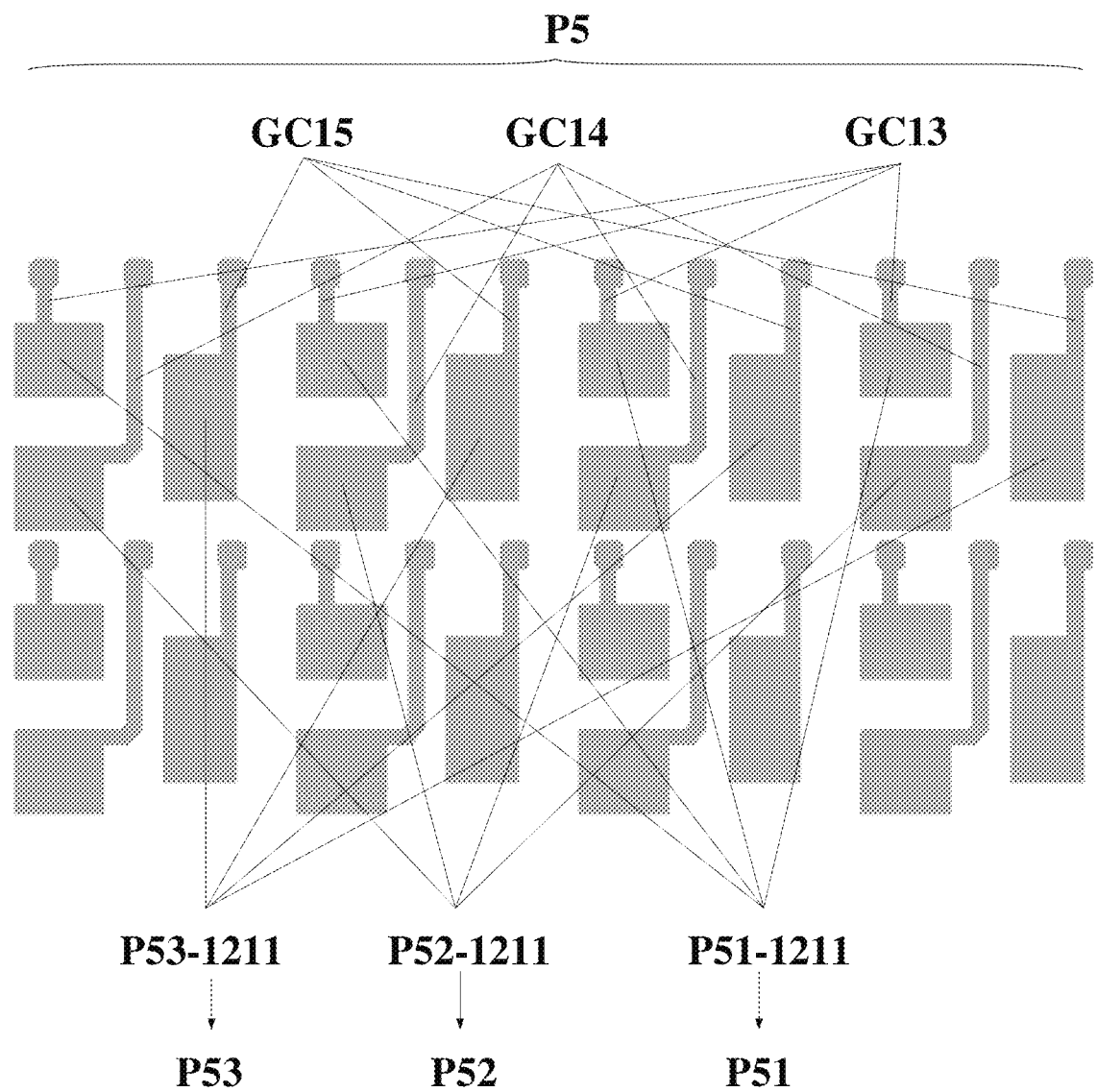

Referring to FIG. 22D, the fourth group of sub-pixels P4 comprises a tenth sub-group of sub-pixels P41 configured to emit light of the first color, an eleventh sub-group of sub-pixels P42 configured to emit light of the second color, and a twelfth sub-group of sub-pixels P43 configured to emit light of the third color.

The pixel driving circuits 122 of the tenth sub-pixel P41 are electrically connected to anodes P41-1211 of the light-emitting elements 121 of the tenth sub-group of sub-pixels P41 through a tenth group of anode connection lines GC10, the pixel driving circuits 122 of the eleventh sub-group of sub-pixels P42 are electrically connected to anodes P42-1211 of the light-emitting elements 121 of the eleventh group of sub-pixels P42 through an eleventh group of anode connection lines GC11, and the pixel driving circuits 122 of the twelfth group of sub-pixels P43 are electrically connected to anodes P43-1211 of the light-emitting elements 121 of the twelfth sub-group sub-pixels P43 through a twelfth sub-group of anode connection lines GC12.

At least one group of anode connection lines of the tenth group of anode connection lines GC10, the eleventh group of anode connection lines GC11, or the twelfth group of anode connection lines GC12 comprises a plurality of fourth anode connection lines AC4, and of the plurality of fourth anode connection lines AC4, the anode connection line closer to the second gate driving sub-circuit 211A2 has a larger length. For example, each group of anode connection lines of the tenth group of anode connection lines GC10, the eleventh group of anode connection lines GC11, and the twelfth group of anode connection lines GC12 comprises a plurality of fourth anode connection lines AC4, and of the plurality of fourth anode connection lines AC4, the anode connection line closer to the second gate driving sub-circuit 211A2 has a larger length. Such a structure is beneficial to improve the display uniformity of the fourth group of sub-pixels P4, thereby further improving the display effect of the display panel.

In some embodiments, referring to FIG. 21, the plurality of sub-pixels 12 of the display panel further comprises a fifth group of sub-pixels P5. The pixel driving circuits 122 of the fifth group of sub-pixels P5 are located between the pixel driving circuits 122 of the first group of sub-pixels P1 and the pixel driving circuits 122 of the fourth group of sub-pixels P4, the pixel driving circuits 122 of the first group of sub-pixels P1 are located between the first gate driving sub-circuit 211A1 and the pixel driving circuits 122 of the fifth group of sub-pixels P5, and the pixel driving circuits 122 of the fourth group of sub-pixels P4 are located between the pixel driving circuits 122 of the fifth group of sub-pixels P5 and the second gate driving sub-circuit 211A2.

Some implementations of the fifth group of sub-pixels P5 will be introduced below in conjunction with FIG. 22D.

Referring to FIG. 22D, the fifth group of sub-pixels P5 comprises a thirteenth sub-group of sub-pixels P51 configured to emit light of the first color, a fourteenth sub-group of sub-pixels P52 configured to emit light of the second color, and a fifteenth sub-group of sub-pixels P53 configured to emit light of the third color.

The pixel driving circuits 122 of the thirteenth sub-group of sub-pixels P51 are electrically connected to anodes P51-1211 of the light-emitting elements 121 of the thirteenth sub-group of sub-pixels P51 through a thirteenth group of anode connection lines GC13, the pixel driving circuits 122 of the fourteenth sub-group of sub-pixels P52 are electrically connected to anodes P52-1211 of the light-emitting elements 121 of the fourteenth sub-group of sub-pixels P52 through a fourteenth group of anode connection lines GC14, and the pixel driving circuits 122 of the fifteenth sub-group of sub-pixels P53 are electrically connected anodes P53-1211 of the light-emitting elements 121 of the fifteenth sub-group of sub-pixels P53 through a fifteenth group of anode connection lines GC15.

Here, the thirteenth group of anode connection lines GC13 has a same length, the fourteenth group of anode connection lines GC14 has a same length, and the fifteenth group of anode connection lines GC15 has a same length.

In a case where the display panel comprises the first group of sub-pixels P1, the second group of sub-pixels P2, the third group of sub-pixels P3, the fourth group of sub-pixels P4, and the fifth group of sub-pixels P5 described above, the sizes of the pixel driving circuits of the first group of sub-pixels P1, the second group of sub-pixels P2, the third group of sub-pixels P3, and the fourth group of sub-pixels P4 in a first direction are reduced. In other words, the sizes of the sub-pixels on both sides of the first gate driving sub-circuit 211A1 in the first direction are reduced, and the sizes of the sub-pixels on both sides of the second gate driving sub-circuit 211A2 in the first direction are reduced. Such a structure is beneficial to improve the display uniformity of the display panel, thereby improving the display effect of the display panel.

The inventors have also noticed that, in a case where the display panel has a multiplexing circuit, the display panel may have a problem of poor display uniformity. The inventors have found through research that, in the related art, the control signal line that provides a control signal to the multiplexing circuit is in a similar shape to the edge of the display area. For example, the display area is in a step-like edge, and the control signal line is also in a step-like edge. Such a control signal line has a relatively larger length, which results in a larger resistance of the control signal line and a larger voltage drop of the control signal line. Thus, the sub-pixels cannot be turned on or off normally, thereby affecting the display effect of the display panel.

In view of this, the embodiments of the present disclosure also provide the following technical solutions.

Figure 23A:
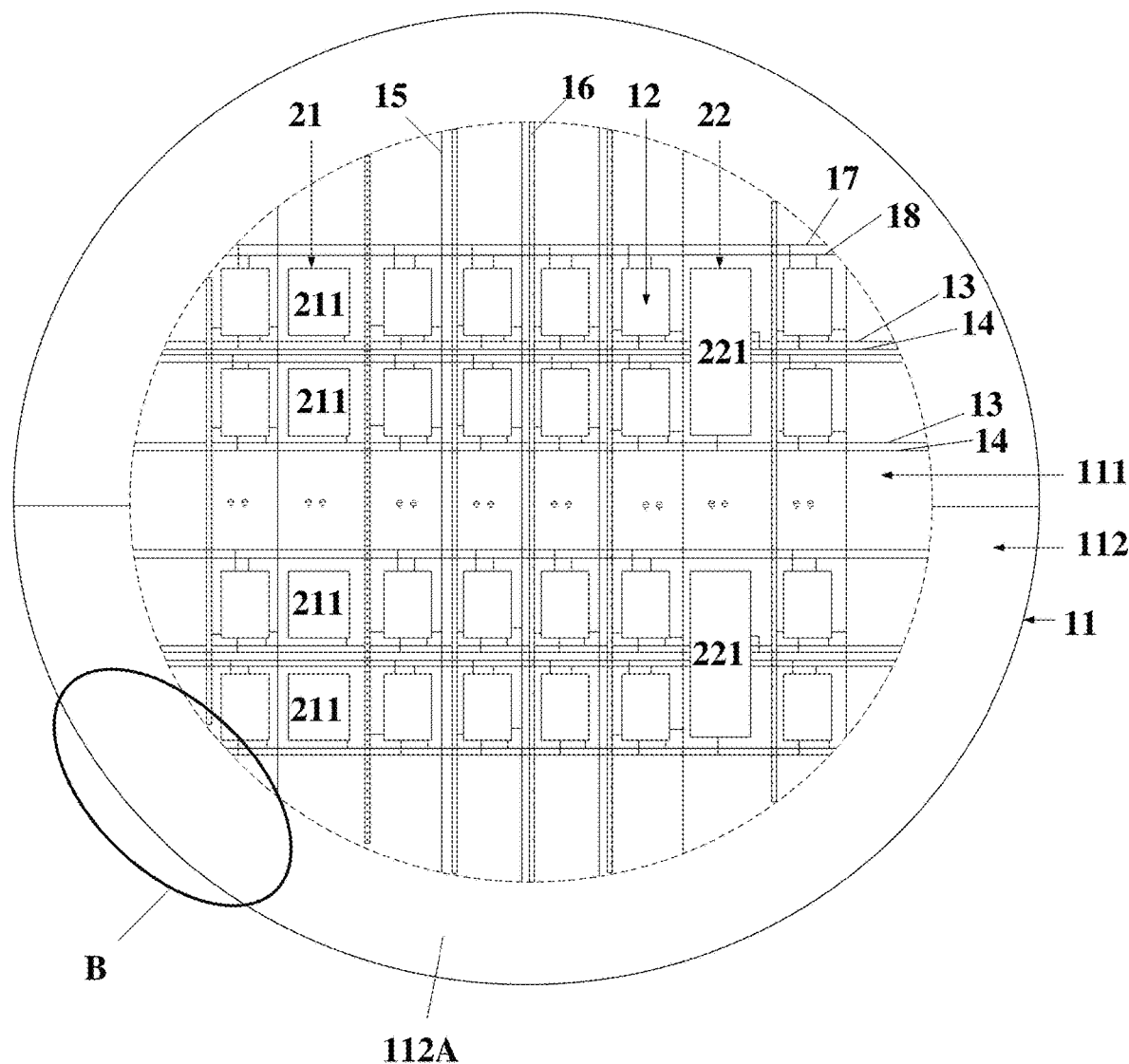
FIG. 23A is a schematic view showing the structure of a display panel according to still another embodiment of the present disclosure.
Figure 23B:
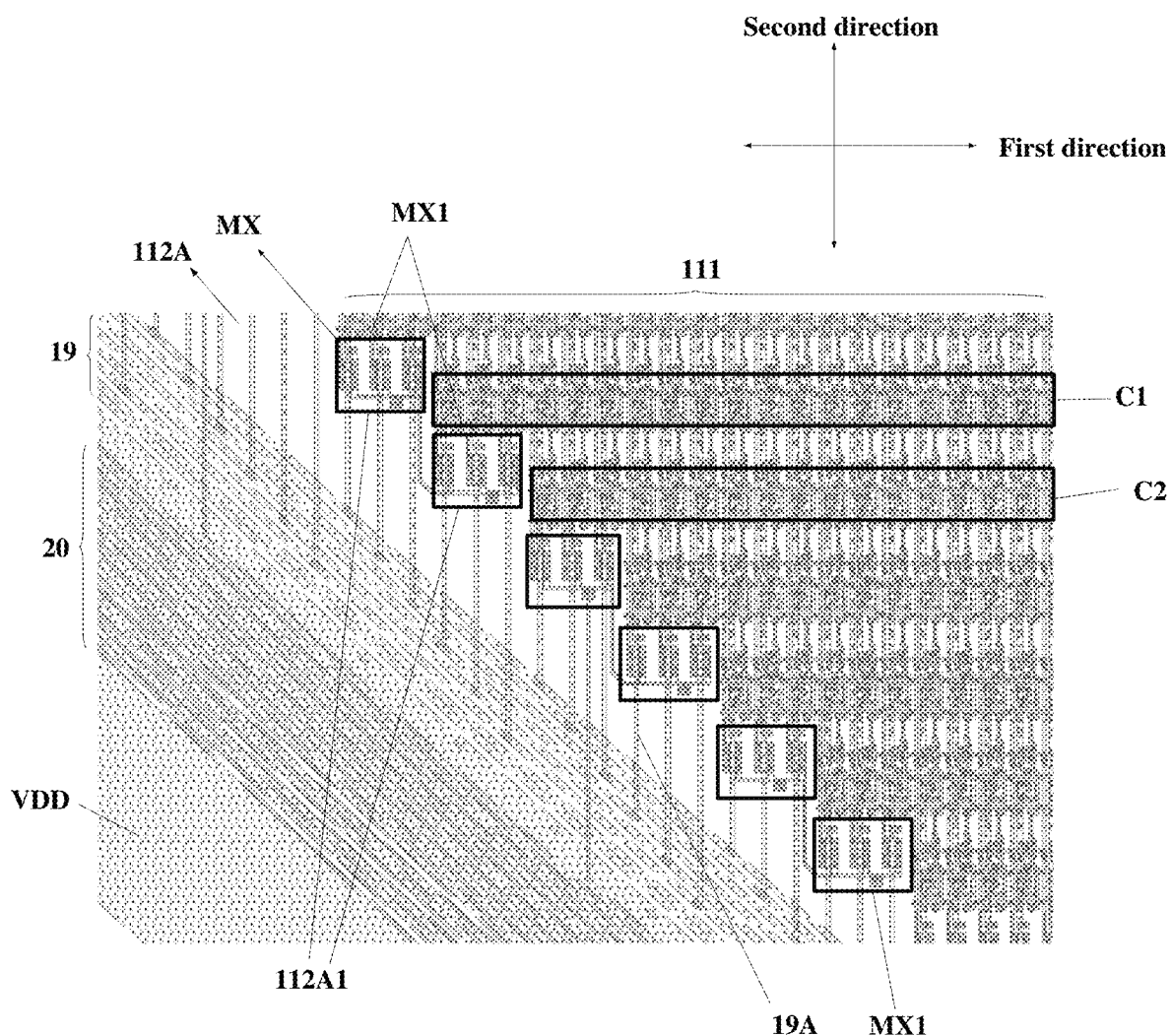
FIG. 23B is an enlarged schematic view showing circle B shown in FIG. 23A.

FIG. 23A is a schematic view showing the structure of a display panel according to still another embodiment of the present disclosure. FIG. 23B is an enlarged schematic view showing circle B shown in FIG. 23A.

The display panels according to some embodiments of the present disclosure will be introduced below in conjunction with FIGS. 23A, 23B, and 3A.

Referring to FIG. 23A, the display panel comprises a base substrate 11, a plurality of sub-pixels 12, a plurality of gate lines 13, a gate driving circuit 21, a plurality of control signal lines 19, a plurality of data signal input lines 20, and a multiplexing circuit MX.

The base substrate 11 comprises a display area 111 and a peripheral area 112 surrounding the display area 111. The peripheral area 112 comprises a first peripheral area 112A, and an edge of the first peripheral area 112A away from the display area 11 is of a first curvature greater than zero. For example, the edge of the first peripheral area 112A away from the display area 11 is of a radian, such as in a circular arc shape. Here, in a case where the entire edge of the peripheral area 112 away from the display area 11 is of a curvature greater than zero (for example, the peripheral area 112 is in a circular ring shape), the first peripheral area 112A may be any portion of the peripheral area 112; and in a case where only a portion (for example, a corner portion) of the edge of the peripheral area 112 away from the display area 11 is a curvature greater than zero, the first peripheral area 112A may be a corner portion of the peripheral area 112, for example, may be one of the four corner areas.

The plurality of sub-pixels 12 is located at the display area 111. The plurality of gate lines 13 is located at the display area 111 and electrically connected to the plurality of sub-pixels 12. The gate driving circuit 21 is located at the display area 111 and comprises cascaded multistage gate driving units 211. The multistage gate driving units 211 are electrically connected to the plurality of gate lines 13.

Referring to FIG. 3A, one or more stages gate driving units 211 of the multistage gate driving circuits 211 comprise a plurality of gate driving sub-circuits 211A. The plurality of gate driving sub-circuits 211A comprises a first gate driving sub-circuit 211A1 and a second gate driving sub-circuit 211A2. The first gate driving sub-circuit 211A1 and the second gate driving sub-circuit 211A2 are spaced apart by the pixel driving circuits 122 of the first group of sub-pixels P1 of the plurality of sub-pixels 12.

Referring to FIG. 23B, the plurality of control signal lines 19, the plurality of data signal input lines 20, and the multiplexing circuit MX are located at least at the first peripheral area 112A. At least a part of at least one of the plurality of control signal lines 19 is of a second curvature greater than zero. For example, each of the plurality of control signal lines 19 is of the second curvature greater than zero. In some embodiments, the second curvature is the same as the first curvature. As some implementations, each control signal line 19 is in a circular arc shape.

The multiplexing circuit MX is located between the plurality of control signal lines 19 and the display area 111. The multiplexing circuit MX comprises a plurality of multiplexing units MX1, and each of the plurality of multiplexing units MX1 is electrically connected to the plurality of control signal lines 19, one of the plurality of data signal input lines 20 and at least two of the plurality of data lines 15.

In the above embodiments, at least a part of at least one of the plurality of control signal lines 19 is of the second curvature greater than zero. Such a structure helps to reduce the length of the control signal line 19 and reduce the resistance of the control signal line 19, thereby improving the display uniformity of the display panel.

In some embodiments, referring to FIG. 23B, the display panel further comprises a power bus VDD configured to provide a power voltage to the power lines 16 located at the display area 111. For example, the power bus VDD is located on one side of the plurality of control signal lines 19 away from the display area 111.

In some embodiments, referring to FIG. 23B, the plurality of sub-pixels 12 comprises a first row of sub-pixels C1 and a second row of sub-pixels C2 that are arranged in a first direction and adjacent to each other. The number of the first row of sub-pixels C1 is greater than the number of the second row of sub-pixels C2. At least one of the plurality of multiplexing units MX is at least partially located at the first area 112A1 of the first peripheral area 112A. Here, the first area 112A1 is located on one side of the second row of sub-pixels C2 away from the display area 111 in the first direction, and the first area 112A1 is located on one side of the first row of sub-pixels C1 away from the display area 111 in a second direction perpendicular to the first direction. For example, the first area 112A1 is located on the left side of the second row of sub-pixels C2 in the first direction, and the first area 112A1 is located on the lower side of the first row of sub-pixels C1 in the second direction.

For example, the enclosed space defined by a first straight line where the left edge of the first row of sub-pixels C1 is located, a second straight line where the lower edge of the first row of sub-pixels C1 is located, a third straight line where the left edge of the second row of sub-pixels C2 is located, and a fourth straight line where the lower edge of the second row of sub-pixels C2 is located may be regarded as the first area 112A1. It should be understood that, the first peripheral area 112A may comprise more than one first area 112A1.

In some embodiments, referring to FIG. 23B, the display panel further comprises a plurality of control signal connection lines 19A. The plurality of control signal lines 19 is electrically connected to the plurality of multiplexing units MX through the plurality of control signal connection lines 19A. For example, the plurality of control signal lines 19 is electrically connected to the plurality of control signal connection lines 19A in a one-to-one correspondence, and the plurality of control signal connection lines 19A is electrically connected to the plurality of multiplexing units MX in a one-to-one correspondence.

In some embodiments, the plurality of control signal connection lines 19A and the plurality of data lines 15 extend in a same direction (see FIG. 23A), i.e., extend along the second direction. In this manner, it is helpful to reduce the length of the control signal connection line 19A and reduce the resistance of the control signal connection line 19A, thereby helping to improve the display uniformity of the display panel.

Figure 24:
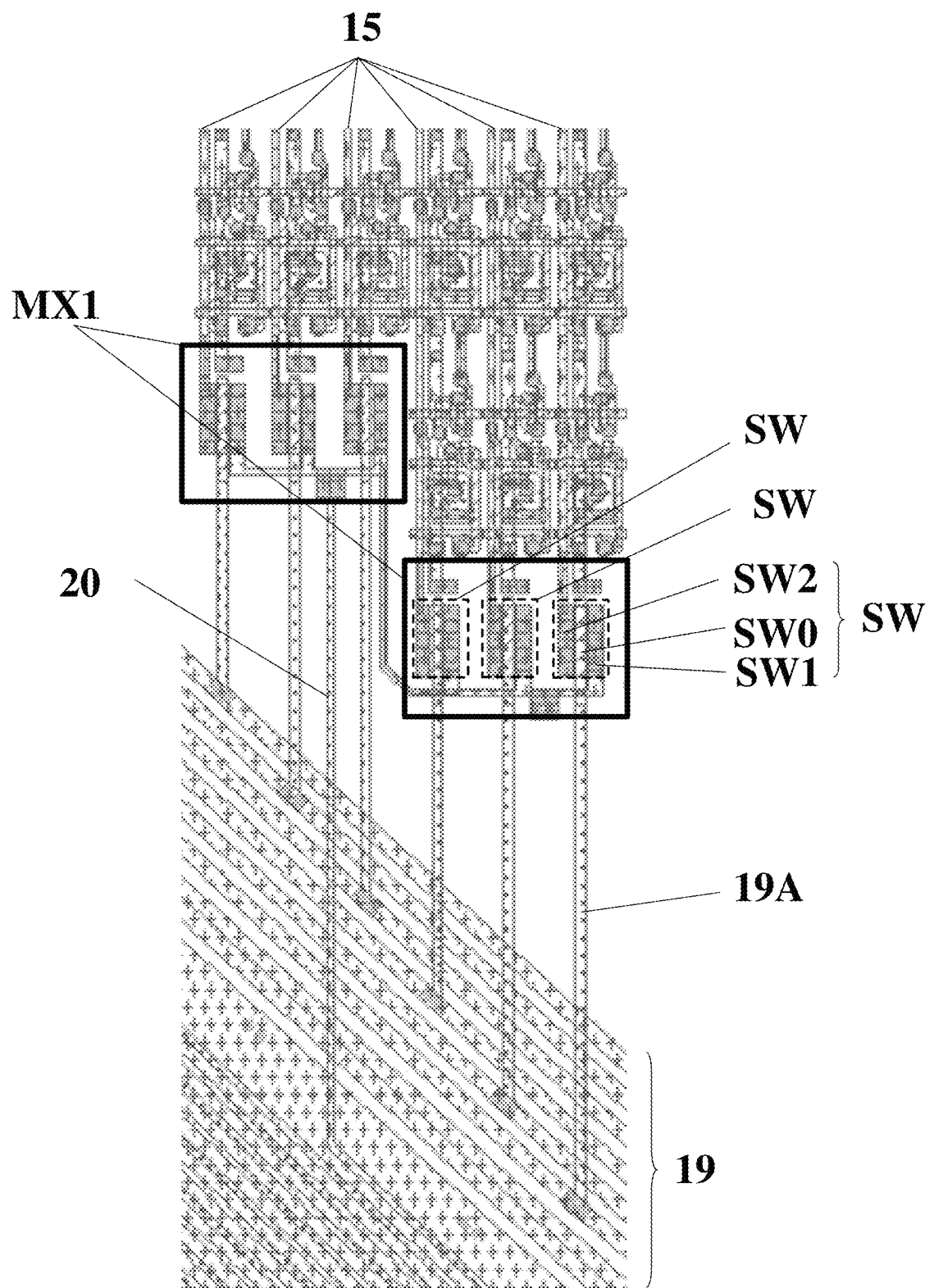
FIG. 24 is a schematic partial view showing FIG. 23B.

FIG. 24 is a partial schematic view showing FIG. 23B. The structure of the multiplexing unit MX will be described below in conjunction with FIG. 24.

Referring to FIG. 24, each of the plurality of multiplexing units MX comprises a plurality of switch transistors SW corresponding to the plurality of control signal lines 19 and at least two data lines 15 in a one-to-one correspondence. As examples, each of the plurality of multiplexing units MX comprises six switch transistors, the number of the plurality of control signal lines 19 is six, and the number of the at least two data lines 15 is six. For example, three switch transistors of the six switch transistors are located in one first area 112A1, and the other three switch transistors are located in another first area 112A1.

The gate SW0 of each of the plurality of switch transistors SW is electrically connected to a corresponding one of the plurality of control signal lines 19, and the first electrode SW1 of each of the plurality of switch transistors SW is electrically connected to a corresponding one of the plurality of data signal input lines 20, and the second electrode SW2 of each of the plurality of switch transistors SW is electrically connected to a corresponding one of the at least two data lines 15. For example, the gate SW0 of each switching transistor SW is electrically connected to a corresponding control signal line 19 through a corresponding control signal connection line 19.

It should be noted that, the technical solutions of the display panels provided in different embodiments of the present disclosure may be combined with each other to obtain display panels of a plurality of embodiments.

The embodiments of the present disclosure also provide a plurality of manufacturing methods of a display panel.

Figure 25:
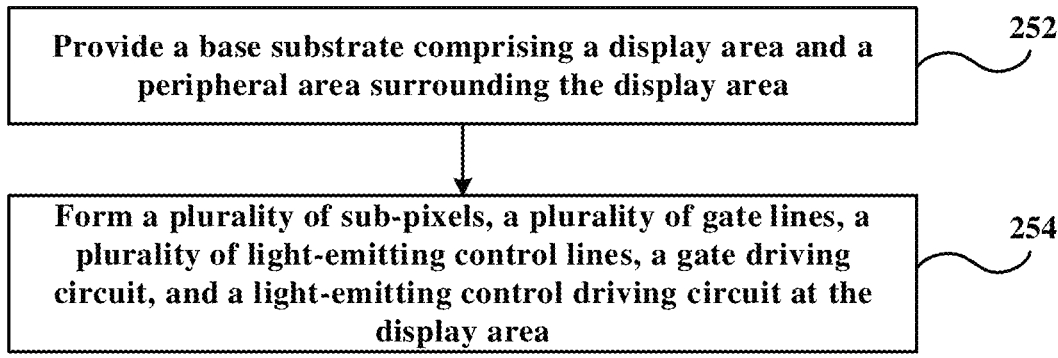
FIG. 25 is a schematic flowchart showing a manufacturing method of a display panel according to an embodiment of the present disclosure.

FIG. 25 is a schematic flowchart showing a manufacturing method of a display panel according to an embodiment of the present disclosure.

At step 252, a base substrate is provided. The base substrate comprises a display area and a peripheral area surrounding the display area.

At step 254, a plurality of sub-pixels, a plurality of gate lines, a plurality of light-emitting control lines, a gate driving circuit, and a light-emitting control driving circuit are formed at the display area.

Each sub-pixel comprises a light-emitting element and a pixel driving circuit configured to drive the light-emitting element. The plurality of gate lines is electrically connected to the plurality of sub-pixels, and the plurality of light-emitting control lines is electrically connected to the plurality of sub-pixels. The gate driving circuit comprises cascaded multistage gate driving units electrically connected to the plurality of gate lines. One or more stages gate driving units of the multistage gate driving units comprise a plurality of gate driving sub-circuits which comprises a first gate driving sub-circuit and a second gate driving sub-circuit. The first gate driving sub-circuit and the second gate driving sub-circuit are spaced apart by the pixel driving circuits of a first group of sub-pixels of the plurality of sub-pixels. The light-emitting control driving circuit comprises cascaded multistage light-emitting control driving units electrically connected to the plurality of light-emitting control lines. One or more stages light-emitting control driving units of the multistage light-emitting control driving units comprise a plurality of light-emitting control driving sub-circuits which comprises a first light-emitting control driving sub-circuit and a second light-emitting control driving sub-circuit. The first light-emitting control driving sub-circuit and the second light-emitting control driving sub-circuit are spaced apart by the pixel driving circuits of a second group of sub-pixels of the plurality of sub-pixels.

In the above embodiments, the gate driving circuit and the light-emitting control driving circuit are located at the display area. At least one stage gate driving unit of the gate driving circuit comprises a plurality of gate driving sub-circuits distributed in the pixel driving circuits of the plurality of sub-pixels, and at least one stage light-emitting control driving unit of the light-emitting control driving circuit comprises a plurality of light-emitting control driving sub-circuits distributed in the pixel driving circuits of the plurality of sub-pixels. Such a structure is beneficial to reduce the frame size of the display panel.

Figure 26:
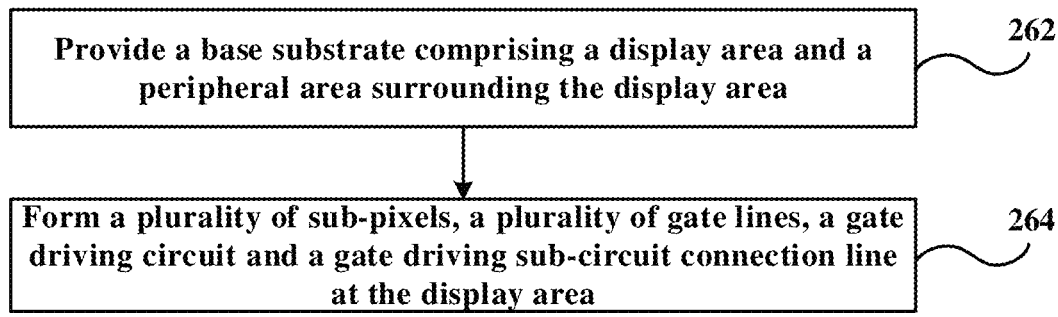
FIG. 26 is a schematic flowchart showing a manufacturing method of a display panel according to another embodiment of the present disclosure.

FIG. 26 is a schematic flowchart showing a manufacturing method of a display panel according to another embodiment of the present disclosure.

At step 262, a base substrate is provided. The base substrate comprises a display area and a peripheral area surrounding the display area.

At step 264, a plurality of sub-pixels, a plurality of gate lines, a gate driving circuit and a gate driving sub-circuit connection line are formed at the display area.

Each sub-pixel comprises a light-emitting element and a pixel driving circuit configured to drive the light-emitting element. The plurality of gate lines is electrically connected to the plurality of sub-pixels, and the gate driving circuit comprises cascaded multistage gate driving units connected to the plurality of gate lines. One or more stages gate driving units of the multistage gate driving units comprise a plurality of gate driving sub-circuits which comprises a first gate driving sub-circuit and a second gate driving sub-circuit. The first gate driving sub-circuit and the second gate driving sub-circuit are spaced apart by the pixel driving circuits of a first group of sub-pixels of the plurality of sub-pixels.

One end of the gate driving sub-circuit connection line is electrically connected to the first gate driving sub-circuit, and the other end of the gate driving sub-circuit connection line is electrically connected to the second gate driving sub-circuit.

The pixel driving circuit of at least one sub-pixel of the first group of sub-pixels comprises a first pixel driving sub-circuit, a second pixel driving sub-circuit and a connector. The first pixel driving sub-circuit is located on one side of the gate driving sub-circuit connection line and comprises a driving transistor comprising a first active layer located on one side of the base substrate. The second pixel driving sub-circuit is located on one side of the gate driving sub-circuit connection line away from the first pixel driving sub-circuit. One end of the connector is electrically connected to the first pixel driving sub-circuit, and the other end of the connector is electrically connected to the second pixel driving sub-circuit. The orthographic projection of the connector on the base substrate overlaps with the orthographic projection of the gate driving sub-circuit connection line on the base substrate. The connector and the first active layer are located in different layers.

In the above embodiments, the connector and the first active layer are located in different layers, and there is no transistor formed between the gate driving sub-circuit connection line and the connector. Therefore, at least the problem of a reduced display effect of the display panel resulting from a transistor formed between the gate driving sub-circuit connection line and the connector is alleviated.

Figure 27:
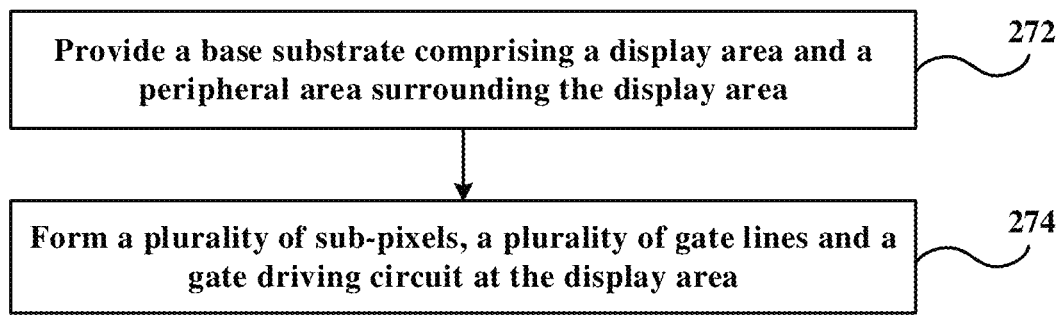
FIG. 27 is a schematic flowchart showing a manufacturing method of a display panel according to a further embodiment of the present disclosure.

FIG. 27 is a schematic flowchart showing a manufacturing method of a display panel according to a further embodiment of the present disclosure.

At step 272, a base substrate is provided. The base substrate comprises a display area and a peripheral area surrounding the display area.

At step 274, a plurality of sub-pixels, a plurality of gate lines, and a gate driving circuit are formed at the display area.

Each sub-pixel comprises a light-emitting element and a pixel driving circuit configured to drive the light-emitting element. The plurality of gate lines is electrically connected to the plurality of sub-pixels. The gate driving circuit comprises cascaded multistage gate driving units electrically connected to the plurality of gate lines. One or more stages gate driving units of the multistage gate driving units comprise a plurality of gate driving sub-circuits which comprises a first gate driving sub-circuit and a second gate driving sub-circuit.

The plurality of sub-pixels comprises a first group of sub-pixels and a second group of sub-pixels. The pixel driving circuits of one group of sub-pixels of the first group of sub-pixels and the second group of sub-pixels are located between the first gate driving sub-circuit and the second gate driving sub-circuit, and the pixel driving circuits of the other group of sub-pixels of the first group of sub-pixels and the second group of sub-pixels are located on one side of the first gate driving sub-circuit away from the second gate driving sub-circuit.

The first group of sub-pixels comprises: a first sub-group of sub-pixels configured to emit light of a first color, wherein pixel driving circuits of the first sub-group of sub-pixels are electrically connected to anodes of light-emitting elements of the first sub-group of sub-pixels through a first group of anode connection lines; a second sub-group of sub-pixels configured to emit light of a second color, wherein pixel driving circuits of the second sub-group of sub-pixels are electrically connected to anodes of light-emitting elements of the second sub-group of sub-pixels through a second group of anode connection lines; and a third sub-group of sub-pixels configured to emit light of a third color, wherein pixel driving circuits of the third sub-group of sub-pixels are electrically connected to anodes of light-emitting elements of the third sub-group of sub-pixels through a third group of anode connection lines.

At least one group of anode connection lines of the first group of anode connection lines, the second group of anode connection lines or the third group of anode connection lines comprises a plurality of first anode connection lines which comprises two first anode connection lines. The closer one of the two first anode connection lines is to the first gate driving sub-circuit, the greater the length of the one of the two first anode connection lines is.

In the above embodiments, in at least one group of anode connection lines of the first group of anode connection lines, the second group of anode connection lines or the third group of anode connection lines, a first anode connection line of the two first anode connection lines closer to the first gate driving sub-circuit has a larger length. Such a structure is beneficial to improve the display uniformity of the first group of sub-pixels, thereby improving the display effect of the display panel.

Figure 28:
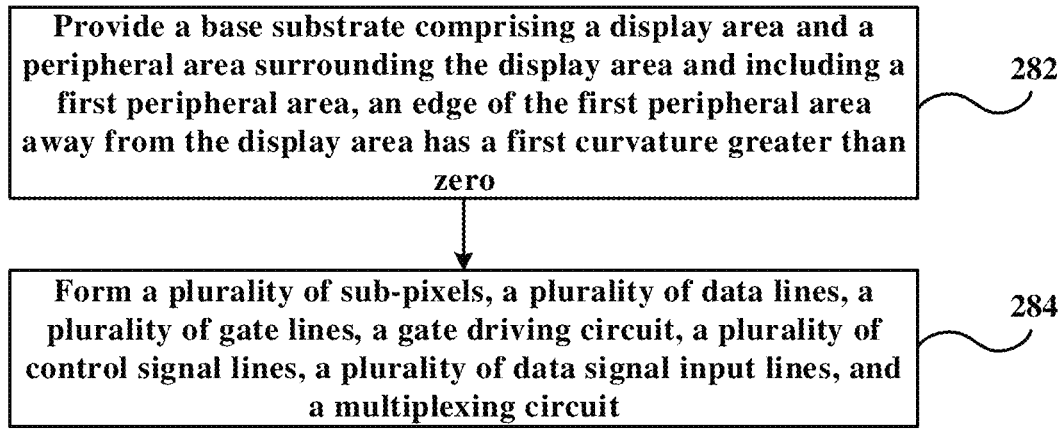
FIG. 28 is a schematic flowchart showing a manufacturing method of a display panel according to still another embodiment of the present disclosure.

FIG. 28 is a schematic flowchart showing a manufacturing method of a display panel according to still another embodiment of the present disclosure.

At step 282, a base substrate is provided. The base substrate comprises a display area and a peripheral area surrounding the display area. The peripheral area comprises a first peripheral area, and an edge of the first peripheral area away from the display area is of a first curvature greater than zero.

At step 284, a plurality of sub-pixels, a plurality of data lines, a plurality of gate lines, a gate driving circuit, a plurality of control signal lines, a plurality of data signal input lines, and a multiplexing circuit are formed.

Each sub-pixel comprises a light-emitting element and a pixel driving circuit configured to drive the light-emitting element. The plurality of data lines is located at the display area and electrically connected to the plurality of sub-pixels. The plurality of gate lines is located at the display area and electrically connected to the plurality of sub-pixels. The gate driving circuit is located at the display area and comprises cascaded multistage gate driving units electrically connected to the plurality of gate lines. One or more stages gate driving units of the multistage gate driving units comprise a plurality of gate driving sub-circuits which comprises a first gate driving sub-circuit and a second gate driving sub-circuit. The first gate driving sub-circuit and the second gate driving sub-circuit are spaced apart by the pixel driving circuits of a first group of sub-pixels of the plurality of sub-pixels.

The plurality of control signal lines is located at least at the first peripheral area, and at least a part of at least one of the plurality of control signal lines is of a second curvature greater than zero. The plurality of data signal input lines is located at least at the first peripheral area. The multiplexing circuit is located at least at the first peripheral area and located between the plurality of control signal lines and the display area. The multiplexing circuit comprises a plurality of multiplexing units, and each of the plurality of multiplexing units is electrically connected to the plurality of control signal lines, one of the plurality of data signal input lines, and at least two of the plurality of data lines.

In the above embodiments, at least a part of at least one of the plurality of control signal lines is of the second curvature greater than zero. Such a structure is beneficial to reduce the length of the control signal line and reduce the resistance of the control signal line, thereby improving the display uniformity of the display panel.

The present disclosure also provides a display device, which may comprise the display panel according to any one of the above embodiments. In some embodiments, the display device may be any product or member having a display function, such as a wearable device (for example, a watch), a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising:
   a base substrate comprising a display area and a peripheral area surrounding the display area;
   a plurality of sub-pixels located at the display area, wherein each of the plurality of sub-pixels comprises a light-emitting element and a pixel driving circuit configured to drive the light-emitting element;
   a plurality of gate lines located at the display area and electrically connected to the plurality of sub-pixels;
   a plurality of light-emitting control lines located at the display area and electrically connected to the plurality of sub-pixels;
   a gate driving circuit located at the display area and comprising cascaded multistage gate driving units electrically connected to the plurality of gate lines, wherein one or more stages gate driving units of the multistage gate driving units comprise a plurality of gate driving sub-circuits, the plurality of gate driving sub-circuits comprises a first gate driving sub-circuit and a second gate driving sub-circuit that are spaced apart by pixel driving circuits of a first group of sub-pixels of the plurality of sub-pixels;
   a light-emitting control driving circuit located at the display area and comprising cascaded multistage light-emitting control driving units electrically connected to the plurality of light-emitting control lines, wherein one or more stages light-emitting control driving units of the multistage light-emitting control driving units comprise a plurality of light-emitting control driving sub-circuits, the plurality of light-emitting control driving sub-circuits comprises a first light-emitting control driving sub-circuit and a second light-emitting control driving sub-circuit that are spaced apart by pixel driving circuits of a second group of sub-pixels of the plurality of sub-pixels; and
   a first group of circuit connection lines comprising a first circuit connection line and a second circuit connection line, wherein:
   the second gate driving sub-circuit is electrically connected to the first gate driving sub-circuit through the first circuit connection line and the second circuit connection line,
   an orthographic projection of one of the first circuit connection line and the second circuit connection line on the base substrate does not overlap with orthographic projections of the pixel driving circuits of the first group of sub-pixels on the base substrate, and
   an orthographic projection of the other of the first circuit connection line and the second circuit connection line on the base substrate overlaps with an orthographic projection of the pixel driving circuit of at least one sub-pixel of the first group of sub-pixels on the base substrate.

2. The display panel according to claim 1, wherein an orthographic projection of at least one of the plurality of gate driving sub-circuits on the base substrate overlaps with orthographic projections of anodes of light-emitting elements of a first portion of sub-pixels of the plurality of sub-pixels on the base substrate, and does not overlap with orthographic projections of anodes of light-emitting elements of remaining sub-pixels of the plurality of sub-pixels other than the first portion of sub-pixels on the base substrate.

3. The display panel according to claim 1, wherein an orthographic projection of at least one of the plurality of light-emitting control driving sub-circuits on the base substrate overlaps with orthographic projections of anodes of light-emitting elements of a second portion of sub-pixels of the plurality of sub-pixels on the base substrate, and does not overlap with orthographic projections of anodes of light-emitting elements of remaining sub-pixels of the plurality of sub-pixels on the base substrate other than the second portion of sub-pixels.

4. The display panel according to claim 1, further comprising:
   a plurality of initialization lines located at the display area and electrically connected to the plurality of sub-pixels; and
   a plurality of reset lines located at the display area and electrically connected to the plurality of sub-pixels,
   wherein the first group of sub-pixels is electrically connected to a first initialization line of the plurality of initialization lines, a first reset line of the plurality of reset lines, a first gate line of the plurality of gate lines and a first light-emitting control line of the plurality of light-emitting control lines, the first initialization line and the first reset line are located on one side of the plurality of gate driving sub-circuits, and the first gate line and the first light-emitting control line are located on one side of the plurality of gate driving sub-circuits away from the first initialization line and the first reset line.

5. The display panel according to claim 1, wherein:
   the first group of sub-pixels is electrically connected to a first gate line of the plurality of gate lines;
   the first gate driving sub-circuit of each stage gate driving unit of the one or more stages gate driving units comprises a first input terminal of each stage gate driving unit, and the first input terminal is configured to receive a first input signal; and
   the second gate driving sub-circuit of each stage gate driving unit comprises a first output terminal of each stage gate driving unit, and the first output terminal is configured to output a gate driving signal to the first gate line.

6. The display panel according to claim 5, wherein:
   any one stage gate driving unit of the multistage gate driving units comprises the plurality of gate driving sub-circuits, and the first gate driving sub-circuit and the second gate driving sub-circuit are spaced apart by the pixel driving circuits of the first group of sub-pixels in a first direction;
   the first gate driving sub-circuit of the any one stage gate driving unit is located between the first gate driving sub-circuit of a former stage gate driving unit of the any one stage gate driving unit and the first gate driving sub-circuit of a latter stage gate driving unit of the any one stage gate driving unit in a second direction different from the first direction; and
   the second gate driving sub-circuit of the any one stage gate driving unit is located between the second gate driving sub-circuit of the former stage gate driving unit of the any one stage gate driving unit and the second gate driving sub-circuit of the latter stage gate driving unit of the any one stage gate driving unit in the second direction.

7. The display panel according to claim 5, wherein:
the first gate driving sub-circuit comprises a first group of transistors and a second capacitor, and the second gate driving sub-circuit comprises a second group of transistors and a first capacitor; and
a number of the second group of transistors is smaller than a number of the first group of transistors, and a width-to-length ratio of a channel of at least one transistor of the second group of transistors is greater than a width-to-length ratio of a channel of each transistor of the first group of transistors.

8. The display panel according to claim 7, wherein:
the first gate driving sub-circuit further comprises: a first clock signal line configured to receive a first clock signal, a second clock signal line configured to receive a second clock signal, a first power line configured to receive a first power voltage and a second power line configured to receive a second power voltage; and
the second gate driving sub-circuit further comprises: a third clock signal line configured to receive the first clock signal, a fourth clock signal line configured to receive the second clock signal, and a fourth power line configured to receive the second power voltage.

9. The display panel according to claim 8, wherein:
the first power line is located on one side of the first group of transistors close to the second gate driving sub-circuit;
the second power line is located on one side of the first group of transistors away from the second gate driving sub-circuit;
the first clock signal line and the second clock signal line are located on one side of the second power line away from the second gate driving sub-circuit;
the fourth power line is located on one side of the second group of transistors and the second capacitor away from the first gate driving sub-circuit; and
the third clock signal line and the fourth clock signal line are located on one side of the second group of transistors and the second capacitor close to the first gate driving sub-circuit.

10. The display panel according to claim 8, wherein:
each of the first group of transistors and the second group of transistors comprises a gate and an active layer which comprises a first electrode area, a second electrode area, and the channel located between the first electrode area and the second electrode area; and
the first group of transistors comprises:
a first transistor, wherein the gate of the first transistor is electrically connected to the first clock signal line, and the first electrode area of the first transistor serves as the first input terminal,
a second transistor, wherein the gate of the second transistor is electrically connected to the second electrode area of the first transistor, and the first electrode area of the second transistor is electrically connected to the gate of the first transistor,
a third transistor, wherein the gate of the third transistor is electrically connected to the gate of the first transistor, the first electrode area of the third transistor is electrically connected to the first power line, and the second electrode area of the third transistor is electrically connected to the second electrode area of the second transistor,
a sixth transistor, wherein the gate of the sixth transistor is electrically connected to the second electrode area of the third transistor, and the first electrode area of the sixth transistor is electrically connected to the second power line, and
a seventh transistor, wherein the gate of the seventh transistor is electrically connected to the second clock signal line, the first electrode area of the seventh transistor is electrically connected to the second electrode area of the sixth transistor, and the second electrode area of the seventh transistor is electrically connected to the second electrode area of the first transistor;
the second group of transistors comprises:
a fourth transistor, wherein the gate of the fourth transistor is electrically connected to the gate of the sixth transistor through the second circuit connection line, the first electrode area of the fourth transistor is electrically connected to the third power line, and the second electrode area of the fourth transistor serves as the first output terminal and is electrically connected to the first gate line, and
a fifth transistor, wherein the gate of the fifth transistor is electrically connected to the second electrode area of the first transistor through the first circuit connection line, the first electrode area of the fifth transistor is electrically connected to the output electrode, and the second electrode area of the fifth transistor is electrically connected to the fourth clock signal line;
a first electrode plate of the first capacitor is electrically connected to the gate of the fifth transistor, and a second electrode plate of the first capacitor is electrically connected to the output electrode; and
a first electrode plate of the second capacitor is electrically connected to the gate of the sixth transistor, and a second electrode plate of the second capacitor is electrically connected to the second power line.

11. The display panel according to claim 5, wherein:
the first group of circuit connection lines further comprises a third circuit connection line, wherein orthographic projections of the third circuit connection line and the second circuit connection line on the base substrate do not overlap with orthographic projections of the pixel driving circuits of the first group of sub-pixels on the base substrate, and an orthographic projection of the first circuit connection line on the base substrate overlaps with the orthographic projections of the pixel driving circuits of the first group of sub-pixels on the base substrate; and
the plurality of gate driving sub-circuits further comprises a third gate driving sub-circuit located on one side of the second gate driving sub-circuit away from the first gate driving sub-circuit, electrically connected to the second gate driving sub-circuit through the third circuit connection line, and electrically connected to the first gate driving sub-circuit through the first circuit connection line.

12. The display panel according to claim 11, wherein:
the first gate driving sub-circuit comprises: a third group of transistors, a first clock signal line configured to receive a first clock signal, a second clock signal line configured to receive a second clock signal, and a first power line configured to receive a first power voltage;
the second gate driving sub-circuit comprises: at least one capacitor, a fourth group of transistors, and a second power line configured to receive a second power voltage, wherein a width-to-length ratio of a channel of one of the fourth group of transistors is greater than a width-to-length ratio of a channel of each of the third group of transistors; and the third gate driving sub-circuit comprises: a fifth group of transistors, a third clock signal line configured to receive the first clock signal and a fourth clock signal line configured to receive the second clock signal, wherein a width-to-length ratio of a channel of one of the fifth group of transistors is greater than the width-to-length ratio of the channel of each of the third group of transistors.

13. The display panel according to claim 12, wherein:

each of the third group of transistors, the fourth group of transistors and the fifth group of transistors comprises a gate and an active layer which comprises a first electrode area, a second electrode area, and the channel located between the first electrode area and the second electrode area;

the third group of transistors comprises:

a first transistor, wherein the gate of the first transistor is electrically connected to the first clock signal line, and the first electrode area of the first transistor serves as the first input terminal, a second transistor, wherein the gate of the second transistor is electrically connected to the second electrode area of the first transistor, and the first electrode area of the second transistor is electrically connected to the gate of the first transistor, and a third transistor, wherein the gate of the third transistor is electrically connected to the gate of the first transistor, the first electrode area of the third transistor is electrically connected to the first power line, and the second electrode area of the third transistor is electrically connected to the second electrode area of the second transistor;

the fourth group of transistors comprises:

a fourth transistor, wherein the gate of the fourth transistor is electrically connected to the second electrode area of the second transistor through the second circuit connection line, the first electrode area of the fourth transistor is electrically connected to the second power line, and the second electrode area of the fourth transistor is electrically connected to the first gate line through a first output electrode, and a sixth transistor, wherein the gate of the sixth transistor is electrically connected to the gate of the fourth transistor, and the first electrode area of the sixth transistor is electrically connected to the second power line; and the at least one capacitor comprises:

a first capacitor, wherein a first electrode plate of the first capacitor is electrically connected to the gate of the second transistor through the first circuit connection line, and a second electrode plate of the first capacitor is electrically connected to the first output electrode, and a second capacitor, wherein a first electrode plate of the second capacitor is electrically connected to the gate of the fourth transistor, and a second electrode plate of the second capacitor is electrically connected to the second power line;

the fifth group of transistors comprises:

a fifth transistor, wherein the gate of the fifth transistor is electrically connected to the gate of the second transistor through the first circuit connection line, the first electrode area of the fifth transistor is electrically connected to a second output electrode, and the second electrode area of the fifth transistor is electrically connected to the fourth clock signal line, and a seventh transistor, wherein the gate of the seventh transistor is electrically connected to the fourth clock signal line, the first electrode area of the seventh transistor is electrically connected to the second electrode area of the sixth transistor through the third circuit connection line, and the second electrode area of the seventh transistor is electrically connected to the gate of the fifth transistor, wherein one of the second electrode area of the fourth transistor and the first electrode area of the fifth transistor serves as the first output terminal.

14. The display panel according to claim 1, wherein:

the second group of sub-pixels comprises a plurality of first sub-pixels electrically connected to a first light-emitting control line of the plurality of light-emitting control lines, and a plurality of second sub-pixels electrically connected to a second light-emitting control line of the plurality of light-emitting control lines;

the first light-emitting control driving sub-circuit of each stage light-emitting control driving unit of the one or more multistage light-emitting control driving units comprises a second input terminal of each stage light-emitting control driving unit, and the second input terminal is configured to receive a second input signal; and the second light-emitting control driving sub-circuit of each stage light-emitting control driving unit comprises a second output terminal of each stage light-emitting control driving unit, and the second output terminal is configured to output a light-emitting control signal to the first light-emitting control line and the second light-emitting control line.

15. The display panel according to claim 14, wherein:

any one stage light-emitting control driving unit of the multistage light-emitting control driving units comprises the plurality of light-emitting control driving sub-circuits, and the first light-emitting control driving sub-circuit and the second light-emitting control driving sub-circuit are spaced apart by the pixel driving circuits of the first group of sub-pixels in a first direction;

the first light-emitting control driving sub-circuit of the any one stage light-emitting control driving unit is located between the first light-emitting control driving sub-circuit of a former stage light-emitting control driving unit of the any one stage light-emitting control driving unit and the first light-emitting control driving sub-circuit of a latter stage light-emitting control driving unit of the any one stage light-emitting control driving unit in a second direction different from the first direction; and the second light-emitting control driving sub-circuit of the any one stage light-emitting control driving unit is located between the second light-emitting control driving sub-circuit of the former stage light-emitting control driving unit of the any one stage light-emitting control driving unit and the second light-emitting control driving sub-circuit of the latter stage light-emitting control driving unit of the any one stage light-emitting control driving unit in the second direction.

16. The display panel according to claim 14, further comprising a second group of circuit connection lines comprising a fourth circuit connection line and a fifth circuit connection line, wherein:

the second light-emitting control driving sub-circuit is electrically connected to the first light-emitting control driving sub-circuit through the fourth circuit connection line and the fifth circuit connection line, and orthographic projections of the fourth circuit connection line and the fifth circuit connection line on the base substrate overlaps with orthographic projections of the pixel driving circuits of the second group of sub-pixels on the base substrate.

17. The display panel according to claim 16, wherein:
the first light-emitting control driving sub-circuit comprises a first group of transistors, a second capacitor, a first power line configured to receive a first power voltage, and a second power line configured to receive a second power voltage; and
the second light-emitting control driving sub-circuit comprises a second group of transistors, a first capacitor, a third capacitor, a first clock signal line configured to receive a first clock signal, and a second clock signal line configured to receive a second clock signal, wherein a number of the first group of transistors is smaller than a number of the second group of transistors, and a width-to-length ratio of channels of at least one of the first group of transistors is greater than a width-to-length ratio of a channel of each of the second group of transistors.

18. The display panel according to claim 1, wherein the pixel driving circuit of the at least one sub-pixel of the first group of sub-pixels comprises:
a first pixel driving sub-circuit located between the first circuit connection line and the second circuit connection line;
a second pixel driving sub-circuit located on one side of the second circuit connection line away from the first pixel driving sub-circuit; and
a connector electrically connected to the first pixel driving sub-circuit and the second pixel driving sub-circuit, wherein an orthographic projection of the connector on the base substrate overlaps with an orthographic projection of the second circuit connection line on the base substrate.

19. A display device, comprising the display panel according to claim 1.

20. A display panel, comprising:
a base substrate comprising a display area and a peripheral area surrounding the display area;
a plurality of sub-pixels located at the display area, wherein each of the plurality of sub-pixels comprises a light-emitting element and a pixel driving circuit configured to drive the light-emitting element;
a plurality of gate lines located at the display area and electrically connected to the plurality of sub-pixels;
a plurality of light-emitting control lines located at the display area and electrically connected to the plurality of sub-pixels;
a gate driving circuit located at the display area and comprising cascaded multistage gate driving units electrically connected to the plurality of gate lines, wherein one or more stages gate driving units of the multistage gate driving units comprise a plurality of gate driving sub-circuits, the plurality of gate driving sub-circuits comprises a first gate driving sub-circuit and a second gate driving sub-circuit that are spaced apart by pixel driving circuits of a first group of sub-pixels of the plurality of sub-pixels;
a light-emitting control driving circuit located at the display area and comprising cascaded multistage light-emitting control driving units electrically connected to the plurality of light-emitting control lines, wherein one or more stages light-emitting control driving units of the multistage light-emitting control driving units comprise a plurality of light-emitting control driving sub-circuits, the plurality of light-emitting control driving sub-circuits comprises a first light-emitting control driving sub-circuit and a second light-emitting control driving sub-circuit that are spaced apart by pixel driving circuits of a second group of sub-pixels of the plurality of sub-pixels; and
a second group of circuit connection lines comprising a fourth circuit connection line and a fifth circuit connection line, wherein:
the second light-emitting control driving sub-circuit is electrically connected to the first light-emitting control driving sub-circuit through the fourth circuit connection line and the fifth circuit connection line, and
orthographic projections of the fourth circuit connection line and the fifth circuit connection line on the base substrate overlaps with orthographic projections of the pixel driving circuits of the second group of sub-pixels on the base substrate.

* * * * *